US010196565B2

(12) United States Patent
Vick et al.

(10) Patent No.: US 10,196,565 B2
(45) Date of Patent: Feb. 5, 2019

(54) ENHANCED COLOR-PREFERENCE LIGHT SOURCES

(71) Applicant: GE Lighting Solutions, LLC, East Cleveland, OH (US)

(72) Inventors: Kevin James Vick, Cleveland Heights, OH (US); Gary Robert Allen, Chesterland, OH (US); William Winder Beers, Chesterland, OH (US); Olivia Rae Vick, Cleveland Heights, OH (US)

(73) Assignee: GE LIGHTING SOLUTIONS, LLC, East Cleveland, OH (US)

(*) Notice: Subject to any disclaimer, the term of this patent is extended or adjusted under 35 U.S.C. 154(b) by 357 days.

(21) Appl. No.: 14/917,870

(22) PCT Filed: Sep. 9, 2014

(86) PCT No.: PCT/US2014/054868
§ 371 (c)(1),
(2) Date: Mar. 9, 2016

(87) PCT Pub. No.: WO2015/035425
PCT Pub. Date: Mar. 12, 2015

(65) Prior Publication Data
US 2016/0223146 A1 Aug. 4, 2016

Related U.S. Application Data

(60) Provisional application No. 61/875,403, filed on Sep. 9, 2013, provisional application No. 61/937,864, filed on Feb. 10, 2014.

(51) Int. Cl.
H05B 33/08 (2006.01)
C09K 11/77 (2006.01)
(Continued)

(52) U.S. Cl.
CPC ...... *C09K 11/7774* (2013.01); *C09K 11/0883* (2013.01); *C09K 11/617* (2013.01);
(Continued)

(58) Field of Classification Search
CPC ............ H05B 33/0896; H05B 33/0857; H05B 39/042; H05B 39/081; H05B 41/325;
(Continued)

(56) References Cited

U.S. PATENT DOCUMENTS 7,453,195 B2 11/2008 Radkov
2008/0259589 A1 10/2008 Van De Ven
(Continued)

FOREIGN PATENT DOCUMENTS

CN 101657671 A 2/2010
EP 2426186 A1 3/2012
(Continued)

OTHER PUBLICATIONS

U.S. Appl. No. 15/032,998, filed Apr. 28, 2016, Allen et al.
(Continued)

Primary Examiner — Joseph L Williams
Assistant Examiner — Jose M Diaz
(74) Attorney, Agent, or Firm — Peter T. DiMauro; GE Global Patent Operation

(57) ABSTRACT

Light sources that emit light having enhanced color spectrum characteristics are described. A color metric called the Lighting Preference Index (LPI) is disclosed that enables quantitative optimization of color preference by tailoring the spectral power distribution of the light source. In an embodiment, a lamp includes at least one blue light source having peak wavelength in the range of about 400 nanometer (nm) to about 460 nm, at least one green or yellow-green light source having peak wavelength in the range of about 500 nm to about 580 nm, and at least one red light source having
(Continued)

peak wavelength in the range of about 600 nm to about 680 nm, wherein the lamp has an LPI of at least 120.

30 Claims, 62 Drawing Sheets

(51) Int. Cl.
|  |  |
|---|---|
| *F21V 9/30* | (2018.01) |
| *F21K 9/00* | (2016.01) |
| *F21K 9/60* | (2016.01) |
| *F21K 9/64* | (2016.01) |
| *C09K 11/08* | (2006.01) |
| *C09K 11/61* | (2006.01) |
| *C09K 11/64* | (2006.01) |
| *H01L 33/50* | (2010.01) |
| *F21Y 113/13* | (2016.01) |
| *F21Y 105/12* | (2016.01) |
| *F21Y 115/10* | (2016.01) |
| *F21V 9/08* | (2018.01) |
| *F21V 9/00* | (2018.01) |

(52) U.S. Cl.
CPC .......... *C09K 11/64* (2013.01); *C09K 11/7721* (2013.01); *F21K 9/00* (2013.01); *F21K 9/60* (2016.08); *F21K 9/64* (2016.08); *F21V 9/30* (2018.02); *H01L 33/502* (2013.01); *H01L 33/507* (2013.01); *H05B 33/0857* (2013.01); *H05B 33/0896* (2013.01); *F21V 9/00* (2013.01); *F21V 9/08* (2013.01); *F21Y 2105/12* (2016.08); *F21Y 2113/13* (2016.08); *F21Y 2115/10* (2016.08); *Y02B 20/181* (2013.01)

(58) Field of Classification Search
CPC ..... F21V 9/30; F21V 9/08; F21K 9/60; F21K 9/00; F21K 9/64; F21K 2099/005; F21K 9/16; F21Y 2115/10; F21Y 2105/12; F21Y 2113/13; H01L 33/50; C09K 11/02; C09K 11/06; C09K 11/08

See application file for complete search history.

(56) References Cited

U.S. PATENT DOCUMENTS

| | | |
|---|---|---|
| 2008/0265207 A1 | 10/2008 | Konrad et al. |
| 2009/0129053 A1 | 5/2009 | Tsai |
| 2009/0152572 A1 | 6/2009 | Su et al. |
| 2010/0096998 A1* | 4/2010 | Beers ................ C09K 11/7734 315/182 |
| 2010/0133565 A1 | 6/2010 | Cho et al. |
| 2011/0062468 A1 | 3/2011 | Butterworth |
| 2011/0220929 A1 | 9/2011 | Collins et al. |
| 2011/0255265 A1 | 10/2011 | Nammalwar et al. |
| 2012/0098411 A1* | 4/2012 | Toth ................... C09K 11/7734 313/487 |
| 2012/0319617 A1 | 12/2012 | Yen |
| 2013/0114242 A1 | 5/2013 | Pickard et al. |
| 2013/0313516 A1 | 11/2013 | David et al. |
| 2014/0183578 A1 | 7/2014 | Horie |
| 2014/0307417 A1 | 10/2014 | Yamakawa et al. |
| 2016/0097496 A1 | 4/2016 | Allen et al. |

FOREIGN PATENT DOCUMENTS

| | | |
|---|---|---|
| JP | H09120797 A | 5/1997 |
| JP | 1173923 A | 3/1999 |
| JP | 2007214603 A | 8/2007 |
| JP | 2007258202 A | 10/2007 |
| JP | 2009060069 A | 3/2009 |
| JP | 2010135277 A | 6/2010 |
| WO | 2013031942 A1 | 3/2013 |
| WO | 2013048865 A1 | 4/2013 |
| WO | 2013069435 A1 | 5/2013 |
| WO | 2013101280 A | 7/2013 |
| WO | 2013118206 A1 | 8/2013 |

OTHER PUBLICATIONS

U.S. Appl. No. 61/937,864, filed Feb. 10, 2014, Beers et al.
International Search Report and Written Opinion dated Dec. 16, 2014 which was issued in connection with PCT Patent Application No. PCT/US2014/054868 which was filed in Sep. 9, 2014.
Unofficial English Translation of Chinese Office Action issued in connection with Related CN Application No. 201480059436.6 dated Mar. 27, 2017.
Unofficial English translation of Office Action issued in connection with corresponding CN Application No. 201480061293.2 dated Jan. 4, 2017.
European Search Report and Opinion issued in connection with corresponding European Application No. 14842487.2 dated Feb. 10, 2017.
Vick et al., "Quantifying Consumer Lighting Preference", New Technology Introduction, pp. 1-6, 1975.
Mahy et al., "Evaluation of Uniform Color Spaces Developed after the Adoption of CIELAB and CIELUV", Color Research and Application, vol. No. 19, Issue No. 2, pp. 105-121, Apr. 1994.
Zukauskas et al., "Statistical Approach to Color Quality of Solid-State Lamps", IEEE Journal of Selected Topics in Quantum Electronics, vol. No. 15, Issue No. 6, pp. 1753-1762, Nov./Dec. 2009.
Ohno, "Color Quality Design for Solid State Lighting", LEDs, pp. 1-25, Oct. 11-12, 2012.
Derhak et al., "Analysis and Correction of the Joensuu Munsell Glossy Spectral Database", 20th Color and Imaging Conference Final Program and Proceedings, Society for Imaging Science and Technology, NY, USA, pp. 191-194, 2012.
Rea et al., "White Lighting", COLOR research and application, vol. No. 38, Issue No. 2, pp. 82-92, Apr. 2013.
Freyssinier et al., "Class A Color Designation for Light Sources Used in General Illumination", Journal of Light & Visual Environment, vol. No. 37, Issue No. 2 & 3, pp. 46-50, 2013.
Houser et al., "Review of measures for light-source color rendition and considerations for a two-measure system for characterizing color rendition", Optics Express, vol. No. 21, Issue No. 8, pp. 10393-10411, 2013.
"LUXEON CoB with CrispWhite Technology", Philips Lumileds Lighting Company, Jul. 3, 2014.
International Invitation to Pay Additional Fees issued in connection with related PCT Application No. PCT/US2014/062758 dated Feb. 9, 2015.
International Search Report and Written Opinion issued in connection with related PCT Application No. PCT/US2014/062758 dated May 18, 2015.
Machine translation and Japanese Office Action issued in connection with corresponding JP Application No. 2016540937 dated May 29, 2018.

\* cited by examiner

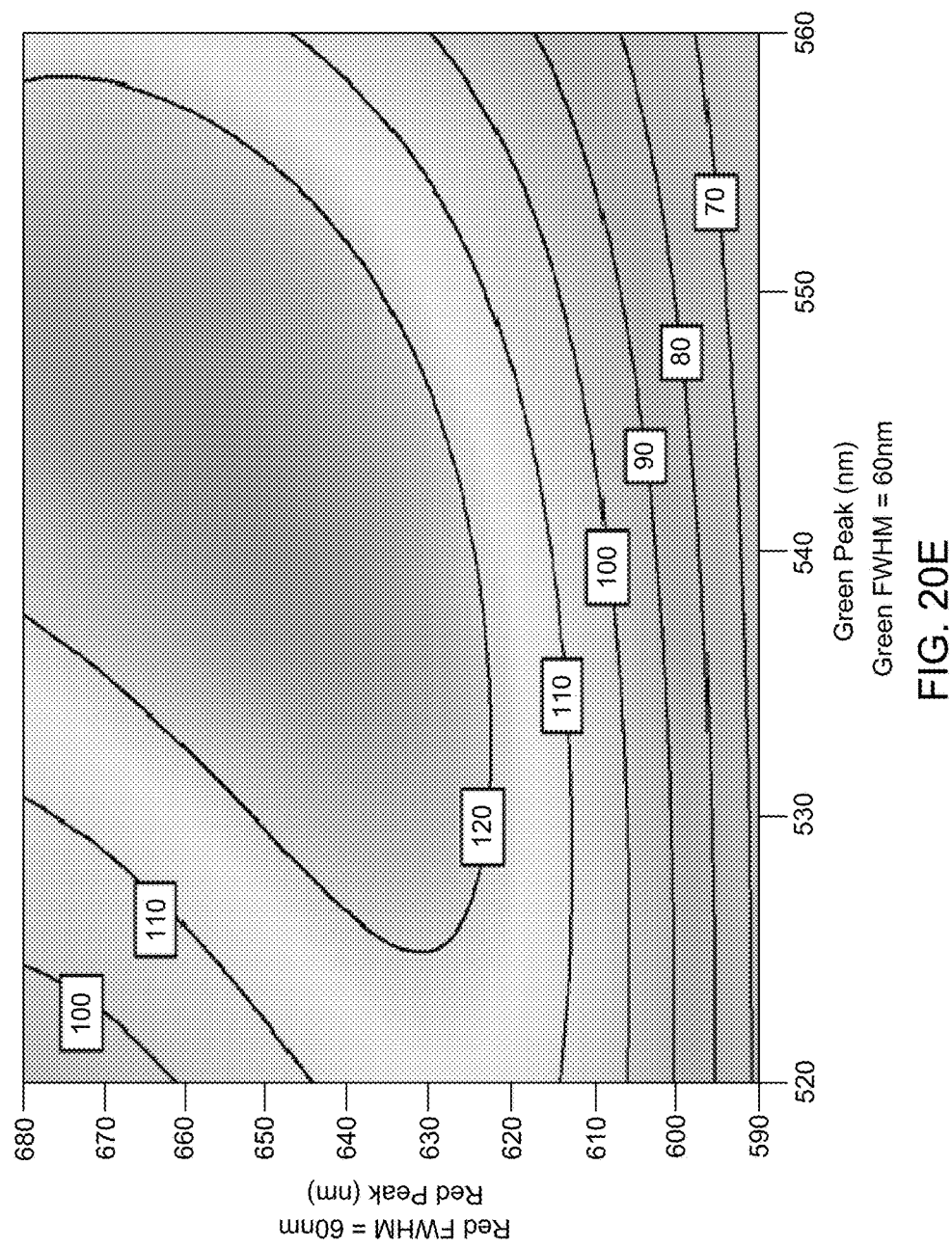

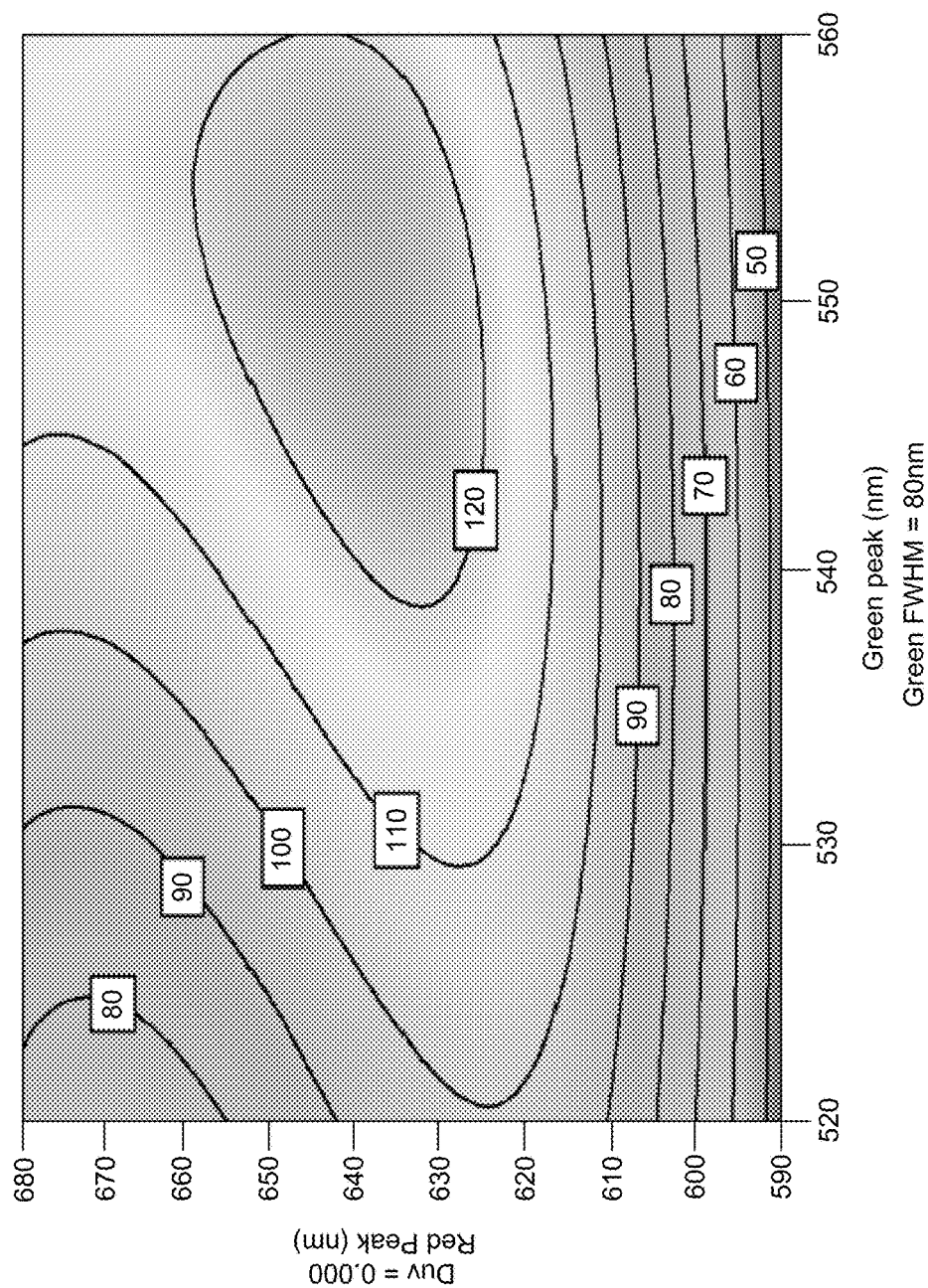

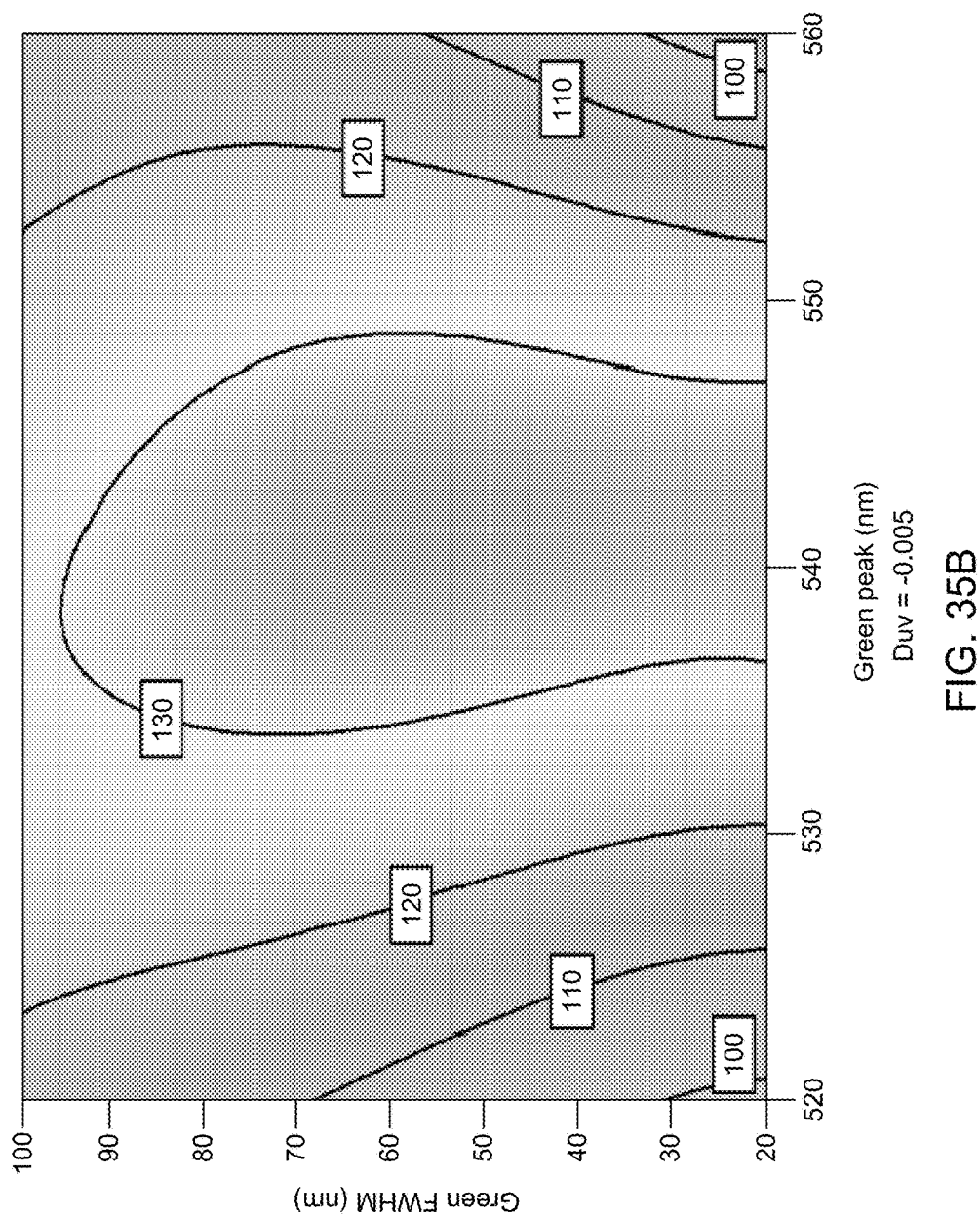

ENHANCED COLOR-PREFERENCE LIGHT SOURCES

CROSS-REFERENCE TO RELATED APPLICATIONS

This application is a national stage application under 35 U.S.C. § 371(c) of prior filed, co-pending PCT application serial number PCT/US2014/054868, filed on Sep. 9, 2014, which claims priority to U.S. Provisional Patent Application No. 61/875,403, filed on Sep. 9, 2013, and of U.S. Provisional Patent Application No. 61/937,864 filed on Feb. 10, 2014. The above-listed applications are herein incorporated by reference.

FIELD OF THE INVENTION

The present disclosure generally relates to providing light sources that emit light having enhanced color spectrum characteristics such that human observers perceive enhanced color preference. The enhanced color preference is due to a combination of enhanced color contrast and enhanced whiteness, and a color metric is disclosed that enables quantitative optimization of color preference by tailoring the spectral power distribution of the light source.

BACKGROUND OF THE INVENTION

Reveal® is a trademarked term used by the General Electric Company to refer to light sources, such as a light bulb, having enhanced red-green color contrast lighting characteristics and enhanced whiteness relative to an unmodified incandescent or halogen light source. Reveal® incandescent and halogen bulbs filter light by placing a particular type of glass (namely, glass impregnated with neodymium (Nd) oxide) in front of the light emitted by the filament which absorbs some of the yellow light. The glass impregnated with Nd oxide causes a "depression" in the yellow region of the color spectrum, so that objects viewed under this light have an enhanced color contrast, especially red and green objects which are contrasted readily by an observer, such as a person in a room of a house. The removal of some yellow light also shifts the location of the chromaticity on the CIE color diagram to a point slightly below the blackbody locus, which generally creates the impression of whiter light to most observers.

The significance of yellow light and how it impacts the perception of color is illustrated in FIGS. 1A, 1B and 1C. FIG. 1A graphs the three color matching functions, or the chromatic response of a standard observer, for XYZ chromaticity. The perceived color of an object is determined by the product of the illumination source spectrum, the reflectance spectrum of the object, and the three color matching functions. These functions are related to the response of the photoreceptors in the human eye, and can be thought of as the perception of blue (102), green (104), and red (106) light. FIG. 1b plots the product of a standard incandescent spectrum with the color matching functions for blue (132), green (134), and red (136) responses. As can be seen, the green (134) and red (136) components overlap significantly and the peaks are only separated by 34 nm. FIG. 1c plots the product of a Reveal® incandescent spectrum with the color matching functions for blue (162), green (164), and red (166) responses. As can be seen, the green (164) and red (166) components are more distinct with a peak separation of 53 nm. This allows observers to more easily distinguish reds and greens with greater contrast and results in a more saturated appearance when yellow light is suppressed.

Spectrally enhanced lighting products have enjoyed decades of commercial success. Traditional color quality metrics or conventional measurements may not reward such enhanced lighting products, yet consumers often prefer them to their unaltered counterparts. With the advent of solid-state lighting (SSL), particularly the customizability of light-emitting diode (LED) spectra, it has become apparent that current metrics are inadequate to evaluate and reflect the quality of LED products. SSL light sources, for example LEDs or OLEDs may produce light directly from the semiconductor, e.g. a blue or red or other colored LED. Or the light may be produced by conversion of the high-energy light from the SSL, e.g. a blue or violet LED, by a down-converter such as a phosphor or quantum dot or other energy converting material. The range of peak emission wavelengths for semiconductors, and the range of the peaks and widths of the emission of down-converters have been extended by recent technological development to cover a nearly continuous range throughout the visible wavelengths (about 380 nm to about 750 nm), enabling broad flexibility in tailoring the visible spectrum in order to enhance color preference for an observer. For purpose of spectral tailoring, therefore, the term light source may mean any source of visible light, e.g. the semiconductor, or LED, or OLED, or the down-converter such as a phosphor or quantum dot, or a composite of several such light sources, or a system such as a lamp or luminaire or fixture comprising such light sources.

For nearly a half-century, the color rendering index (CRI) has been the primary method of communicating the color quality of a light source. However, its effectiveness is inherently limited due to its method of calculation, particularly when dealing with spectral power distributions (SPDs) containing steep slopes versus wavelength, as often seen with LEDs. The shortcomings of CRI are well documented, and a wide variety of alternative metrics have been proposed. However, alternative color quality metrics struggle to accurately quantify consumer preference of lighting products. Houser and colleagues provide a detailed overview and comparison of a large fraction of the various color quality metrics developed in "Review of measures for light-source color rendition and considerations for a two-measure system for characterizing color rendition", *Optics Express*, volume 21, #8, 10393-10411 (2013), authors K. W. Houser, M. Wei, A. David, M. R. Krames, and X. S. Shen. In general, the variety of metrics can be broken down into three broad categories pertaining to their intent and method of calculation: fidelity, discrimination, and preference. Fidelity metrics, which include CRI, quantify an absolute difference from a reference illuminant, regardless of whether the test illuminant is perceived as being better or worse, and without consideration to whether the reference illuminant is actually preferred by most observers. Discrimination metrics quantify the total area of color space that is renderable under the test illuminant, and are maximized at extreme levels of saturation and hue distortion. The many conventional color preference metrics have been developed to provide a quantitative measure of user color preference, but none provides a sufficient correlation to observer data, along with a target value to enable optimization of a light source, so that the metric can be used as a target parameter in a design optimization.

In general, it has been found that observers prefer an enhanced level of saturation, rendering colors more appealing. However, high levels of saturation, or shifts in hue, can result in unnatural rendering of colors and objects. For example, the Gamut Area Index (GAI) and the Gamut Area Scale ($Q_g$), both of which are discrimination metrics, provide a very good correlation with observer preference up to some limit of color saturation, beyond which GAI and $Q_g$ continue to increase, while observer preference sharply declines. It therefore appears that some adjustment may be necessary to a color saturation metric such as GAI or $Q_g$ to better align it with observer preference. Furthermore, observers also tend to prefer light sources that appear whiter, driven by the color point of the illuminant relative to the Planckian (blackbody) locus, somewhat independent of the color saturation. As is generally recognized in the lighting industry, color preference cannot be adequately quantified by any single existing color metric. Several attempts have been published recently to combine two or more color metrics to better describe color preference. However, it does not appear that anyone has proposed a color preference metric that defines color preference with sufficient quantitative rigor to enable the optimization of the color preference of a light source by numerical tailoring of the spectrum. Even though the existing color preference metrics are quantitative, each is limited in some way to disqualify their use as an optimization parameter when designing a light source or a spectrum to achieve optimum color preference for a typical observer.

Some of the more well-known metrics in the color preference category include Flattery Index ($R_f$), Color Preference Index (CPI), and Memory Color Rendering Index (MCRI). All three of these metrics have "ideal" configurations for the chromaticity coordinates of eight to ten test color samples, and each quantifies the deviation from these target values. The flattery index was the first metric to target preference and used ten color samples with unequal weighting. However, in order to maintain similarity with CRI, the target chromaticity shifts were reduced to one-fifth of their experimental values, greatly reducing its impact. CPI maintained the experimental values for preferred chromaticity shifts, resulting in a better representation of color preference. However, it is somewhat limited in its selection of test color samples, using the same eight, unsaturated test colors as CRI. Unsaturated (pastel) test colors are incapable of evaluating the impact of a highly saturated light source. MCRI uses observers' memory to define the ideal chromaticity configuration of ten colors of familiar objects. Furthermore, none of the metrics above factor in the "whiteness", or color point, of the test source. To this point, authors J. P. Freyssinier and M. S. Rea, in "Class A color designation for light sources used in general illumination," *Journal of Light and Visual Environment*, volume 37, #2&3, pp. 46-50 (2013), recommended a series of criteria for "Class A Lighting", which places constraints on CRI (>80), GAI (80-100), and color point (near "white" line). While these conditions define a recommended design space, they cannot be optimized to prescribe a spectrum or light source that maximizes color preference, as there is no optimal value identified, and no weighting of the three characteristics recommended.

Solid-state lighting technologies such as LEDs and LED-based devices often have superior performance when compared to incandescent lamps. This performance can be quantified by the useful lifetime of the lamp, lamp efficacy (lumens per watt), color temperature and color fidelity, and other parameters. It may be desirable to make and use an LED lighting apparatus also providing enhanced color preference qualities.

Commercial lamp types (including incandescent, halogen, and LED) employing Nd-doped glass to absorb some of the yellow light from the spectrum emitted by the light source exist, which enhance the color preference relative to their counterpart lamps without the absorption by the Nd-doped glass. GE Lighting, and some other manufacturers, has products of each of these three types. The GE Lighting products have the Reveal® brand name.

Some special formulations of phosphor for compact fluorescent (CFL), linear fluorescent (LFL), and LED lamps are known to enhance the color preference relative to their counterpart lamps that employ standard phosphors. GE Lighting has products of each of the first two types, also under the Reveal® brand name. LED light sources of the third type are known, for example in grocery applications to enhance the colors of meats, vegetables, and produce (e.g. fruit).

Each of these existing light sources has employed either Nd-doped glass, or customized phosphors that reduce the amount of yellow light emitted by the light source in order to enhance color preference. However, none of these products achieves a level of color preference exceeding that of the decades-old GE Lighting Reveal® incandescent, and the other existing products. The Nd filter in these existing light sources is typically comprised of $Nd_2O_3$-doped glass, but in other embodiments the yellow filter may be comprised of one of several other compounds of Nd or of Didymium or other compounds that preferentially absorb yellow light, embedded in various matrix host materials, for example glass, crystal, polymer, or other materials; or by some other dopant or coating on the glass that absorbs preferentially in the yellow; or by the addition of any yellow absorber to any of the optically active components of the lamp or lighting system, such as a reflector or diffuser or lens, which may be a glass or polymer or metal or any other material that accommodates the yellow absorber. The exact peak wavelength and width of the yellow absorption will vary depending on the particular Nd or rare-earth compound and host material, but many combinations of Nd, Didymium and other rare-earth compounds and host materials are suitable substitutions for the combination of $Nd_2O_3$-doped glass, as are some other yellow filters. The Nd or other yellow filter may be in the shape of a dome enclosing the light source, or may be any other geometric form enclosing the light source, such that most or all of the light in the yellow range of wavelengths passes through the filter.

SUMMARY OF THE INVENTION

Presented are light sources and methods for making light sources that emit light having enhanced color spectrum characteristics such that human observers perceive enhanced color preference. Also presented is a color metric, called the Lighting Preference Index (LPI) that enables quantitative optimization of color preference by tailoring the spectral power distribution of a light source. In an embodiment, a composite light source includes at least one blue light source having peak wavelength in the range of about 400 nanometer (nm) to about 460 nm, at least one green or yellow-green light source having peak wavelength in the range of about 500 nm to about 580 nm, and at least one red light source having peak wavelength in the range of about 600 nm to about 680 nm, wherein the composite light source has an LPI of at least 120.

In another embodiment, a composite light source includes a blue light source having peak wavelength in the range of about 400 nm to about 460 nm, a green or yellow-green solid state light source having peak wavelength in the range of about 500 nm to about 580 nm, and a red solid state light source having peak wavelength in the range of about 600 nm to about 680 nm, wherein this composite light source has an LPI of at least 120.

In a beneficial embodiment, a composite light source includes a blue light source having peak wavelength in the range of about 400 nm to about 460 nm, a green or yellow-green solid state light source having peak wavelength in the range of about 500 nm to about 580 nm and having full-width-at-half-maximum (FWHM) less than 55 nm, and a red solid state light source having peak wavelength in the range of about 600 nm to about 680 nm and having FWHM less than 35 nm, wherein this composite light source has an LPI of at least 120.

In yet another embodiment, a composite light source includes a blue light source having peak wavelength in the range of about 400 nm to about 460 nm, a green or yellow-green solid state light source having peak wavelength in the range of about 500 nm to about 580 nm, and a red down-converter having peak wavelength in the range of about 600 nm to about 680 nm. This composite light source has an LPI of at least 120.

In yet another embodiment, a composite light source includes a blue light source having peak wavelength in the range of about 400 nm to about 460 nm, a green or yellow-green solid state light source having peak wavelength in the range of about 500 nm to about 580 nm, and a red down-converter having peak wavelength in the range of about 600 nm to about 680 nm and having FWHM less than 35 nm, wherein this composite light source has an LPI of at least 120.

In yet another embodiment, a composite light source includes a blue light source having peak wavelength in the range of about 400 nm to about 460 nm, a green or yellow-green down-converter having peak wavelength in the range of about 500 nm to about 580 nm, and a red solid state light source having peak wavelength in the range of about 600 nm to about 680 nm, wherein this composite light source has an LPI of at least 120.

In yet another embodiment, a composite light source includes a blue light source having peak wavelength in the range of about 400 nm to about 460 nm, a green or yellow-green down-converter having peak wavelength in the range of about 500 nm to about 580 nm, and a red solid state light source having peak wavelength in the range of about 600 nm to about 680 nm and having FWHM less than 35 nm. This composite light source has an LPI of at least 120.

In yet another beneficial embodiment, a composite light source includes a blue light source having peak wavelength in the range of about 400 nm to about 460 nm, a green or yellow-green down-converter having peak wavelength in the range of about 500 nm to about 580 nm, a red solid state light source having peak wavelength in the range of about 600 nm to about 680 nm and having FWHM less than 35 nm, and a deep red solid state light source having peak wavelength in the range of about 630 nm to about 680 nm. This composite light source has an LPI of at least 120.

In yet another embodiment, a composite light source includes a blue light source having peak wavelength in the range of about 400 nm to about 460 nm, a green or yellow-green down-converter having peak wavelength in the range of about 500 nm to about 580 nm, and a red down-converter having peak wavelength in the range of about 600 nm to about 680 nm, wherein this composite light source has an LPI of at least 120.

In yet another embodiment, a composite light source includes a blue light source having peak wavelength in the range of about 400 nm to about 460 nm, a green or yellow-green down-converter having peak wavelength in the range of about 500 nm to about 580 nm, and a red down-converter having peak wavelength in the range of about 600 nm to about 680 nm and having FWHM less than 35 nm. This composite light source has an LPI of at least 120.

In yet another beneficial embodiment, a composite light source includes a blue light source having peak wavelength in the range of about 400 nm to about 460 nm, a green or yellow-green down-converter having peak wavelength in the range of about 500 nm to about 580 nm, a red down-converter having peak wavelength in the range of about 600 nm to about 680 nm and having FWHM less than 35 nm, and a deep red solid state light source having peak wavelength in the range of about 630 nm to about 680 nm. This composite light source has an LPI of at least 120.

BRIEF DESCRIPTION OF THE DRAWINGS

Features and advantages of some embodiments, and the manner in which the same are accomplished, will become more readily apparent with reference to the following detailed description taken in conjunction with the accompanying drawings, which illustrate exemplary embodiments (not necessarily drawn to scale), wherein.

DETAILED DESCRIPTION

Presented is a new quantitative, validated color preference metric, called the Lighting Preference Index (LPI). LPI may be used as a quantitative metric to provide design rules to maximize color preference characteristics of light sources, and/or to design multiple-response optimizations of a spectrum that include color preference, along with other photometric, colorimetric, and other design responses. The resulting spectra, light sources, and lamps demonstrate high LPI values that exhibit significantly unexpectedly higher color preference than existing Reveal® type light sources and/or similar conventional products.

Figure 2:
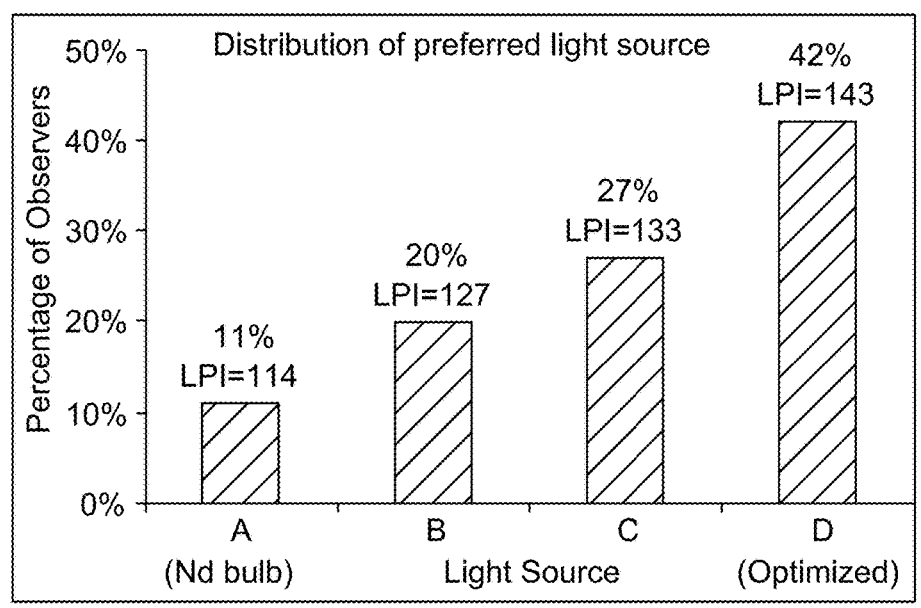
FIG. 2 displays the percentage of observers that chose a selected LED system, designed to enhanced levels of a lighting preference index (LPI), as the observers' preferred lighting environment.

LPI as disclosed herein accounts for both preferred color appearance (saturation and hue distortion) as well as preferred shifts in color point away from the Planckian locus. LPI may be employed as a predictive metric, as well as a metric that quantifies consumer preference. Thus, LPI can be used as a design tool for optimizing spectra for color preference. In fact, a strong correlation for LPI has been found with preliminary observer testing, and the optimization capability of LPI as an accurate predictive preference metric is proven through additional studies. In an observer study with 86 participants, four discrete LED systems were designed to different enhanced levels of LPI, ranging from 114 to 143. All observers in this study were within the age range of 17 to 28 years, with a gender distribution of 40% male and 60% female, a race distribution of 57% Caucasian, 30% Asian, 8% Hispanic, and 5% African American, and a geographical distribution of 94% North America, 5% Asia, and 1% Europe. Each LED system illuminated a separate booth containing household items, such as colorful fabrics, fruit, wood flooring, and a mirror. Observers were asked to select which lighting environment they preferred overall. Results indicate that the LED system with the highest LPI value was preferred the most by observers, while the second, third, and fourth highest LPI values were preferred the second, third, and fourth most, respectively. FIG. 2 displays the percentage of observers that selected each LED system as their preferred environment. As shown, the highest percentage of observers (42%) preferred light source D having an LPI of 143, while the smallest percentage of observers (11%) preferred light source A having an LPI of 114. Trends between LPI, spectral design components, and other color metrics are described herein through a computational study using parameterized three-component LED spectra.

Conventional colorimetric and photometric quantities or metrics are derived from the responses of relatively small groups of observers, and thus are not representative of the entire human population, nor of every demographic and cultural group. However, such metrics are being used decades after they were created to design, evaluate, and optimize lighting products. In fact, light sources are still being designed based on these metrics, e.g. lumens and color rendering index (CRI or Ra).

It is possible for future iterations of the LPI formula to take into account additional observer preference data; this could slightly change the formula for the LPI metric described herein, especially if the new data originates from a different demographic or cultural group, since color preferences are known to vary among populations. The formula for LPI as described herein is based on an observer set within the age range of 21 to 27 years, with a gender distribution of 58% male and 42% female, a race distribution of 92% Caucasian and 8% Asian, and a geographical distribution within North America. However, this does not diminish the effectiveness of LPI, as presently defined herein, to quantify and optimize the level of color preference for an arbitrary light source spectrum such that if that test light source is built and the test illuminant is observed by a population having color preferences similar to those of a particular test population, then the test light source will be preferred relative to other light sources that score lower on the LPI scale by that test population. Furthermore, spectra or light sources optimized for high LPI, and having LPI greater than conventional light sources, exhibit higher color preference among observers (having similar color preference bias to those in our dataset) than any of the conventional light sources. As an analogy, if a variation of the lumen, for example the scotopic lumen, is defined that differs from the traditional photopic lumen, and the definition of the scotopic lumen enables the discovery and development of light sources having increased or optimized scotopic lumen efficiency, that would not invalidate the effectiveness of the discoveries and developments of light sources that had provided, and continue to provide, increased or optimized photopic lumens, since the photopic lumen had been rigorously defined, even though it was not universally appropriate in all lighting applications.

While existing color quality metrics struggle to accurately quantify consumer preference of lighting products, LPI objectively defines a quantitative color preference metric that most closely correlates with a limited population of observers for which color preference data was available. The LPI metric is a function of two parameters: the Whiteness of the illumination source and the Color Appearance of objects illuminated by the source. The specific LPI function is defined below, after explanation of Whiteness and Color Appearance.

As used herein, Whiteness refers to the proximity of the color point to the "White Line" on the chromaticity diagram, where the "White Line" is defined in the following publication: "White Lighting", *Color Research & Application*, volume 38, #2, pp. 82-92 (2013), authors M. S. Rea & J. P. Freyssinier (henceforth, the "Rea reference"). The Rea reference is hereby incorporated by reference. Specific exemplary values of color points on the "White Line" are given by the color points in Table 1 below, as reported in CCX and CCY color coordinates for selected color temperatures from 2700 K to 6500 K.

TABLE 1

| Color Temp. (CCT) | CCX | CCY |
|---|---|---|
| 2700 K | 0.4431 | 0.3806 |
| 3000 K | 0.4212 | 0.3716 |
| 3500 K | 0.3980 | 0.3710 |
| 4100 K | 0.3773 | 0.3788 |
| 5000 K | 0.3458 | 0.3628 |
| 6500 K | 0.3114 | 0.3389 |

Figure 3:
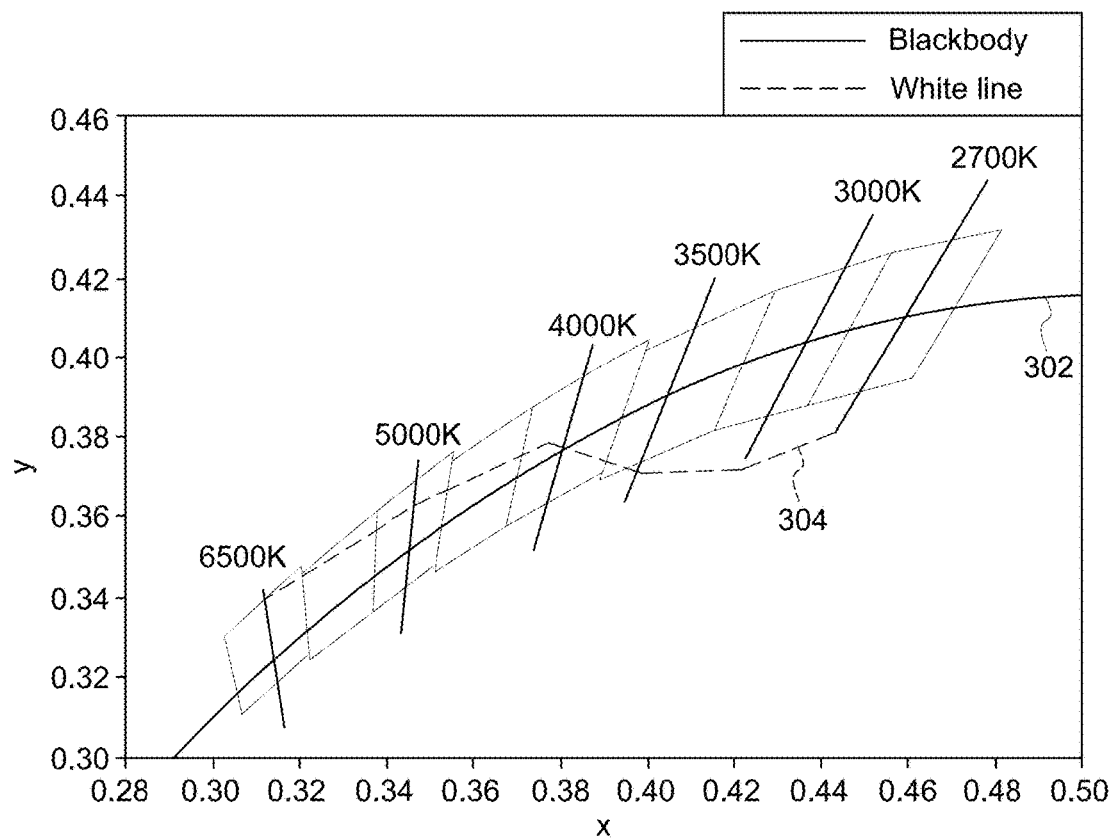
FIG. 3 includes a graph of the "White Line" (sometimes also called the "white-body curve" or "white body locus") and a graph of the blackbody curve, along with loci of the Correlated Color Temperatures (CCTs) from 2700 K to 6500 K corresponding to ANSI color bins for LEDs.

As seen in FIG. 3, and defined in Table 1, the "White Line" 304 (sometimes also called the "white-body line", "white-body curve", or "white-body locus") is slightly above the blackbody curve 302 at high color temperatures (e.g., above 4000 K) and well below it at lower color temperatures. Studies indicate that illumination on the "White Line" may correspond to human perception of what is "white" light. The "White Line" is proposed for a wide range of color temperatures, but for color temperatures between about 2700 K and about 3000 K (these are CCT values that consumers often prefer), the "White Line" is about 0.010 Duv below the blackbody locus, wherein Duv represents the distance from the blackbody locus in u-v chromaticity space.

The following equation is scaled to provide a Whiteness metric for any color point having CCT between about 2700 K and about 3000 K. This Whiteness metric will be zero, or substantially 0, for any point on the Planckian locus, and will be unity (substantially 1) for any point on the "White Line":

$$\text{Whiteness} = 1 - 100\sqrt{(\text{Duv} + 0.010)^2}, \quad \text{Equation (1)}$$

where Duv, for purposes of Equation (1), is the distance of the color point from the Planckian locus in u-v space (note: values below the blackbody line are negative in Equation (1)). For example, for a point at 0.010 below the blackbody, one would insert −0.010 into Equation (1). (For color points having a CCT outside the range of about 2700 K and about 3000 K, the Whiteness can be approximated by inspection of the position of the color point in FIG. 3, without undue experimentation; e.g., if the illumination source has a color point on the "White Line", it will similarly have a Whiteness value of unity). As will be explained in further detail below, LPI increases as the color point of the illumination source approaches the "White Line", and decreases as it moves away in either direction.

As used herein, Color Appearance is a composite measure of color rendering, which is a function of the Net Saturation Value (NSV) of the illumination source (e.g., relatively higher LPI values are obtained for NSV that show an enhanced saturation, but are not overly saturated), and the Hue Distortion Value (HDV); (e.g., relatively higher LPI values are obtained for HDV that show a minimal or zero hue distortion). Both NSV and HDV will be explained in more detail below.

The lighting preference index (LPI) metric was developed using an unbiased selection of test color samples, by selecting an array of colors using the complete database of 1600 corrected Munsell glossy spectral reflectances. These 1600 colors would be understood by the person of ordinary skill in the art, especially in view of M. W. Derhak & R. S. Berns, "Analysis and Correction of the Joensuu Munsell Glossy Spectral Database," *Color and Imaging Conference,* 2012 (1), 191-194 (2012). Using this array of colors allows for coverage of a significant fraction of color space utilizing the Munsell classification system of hue, value, and chroma.

Figure 4:
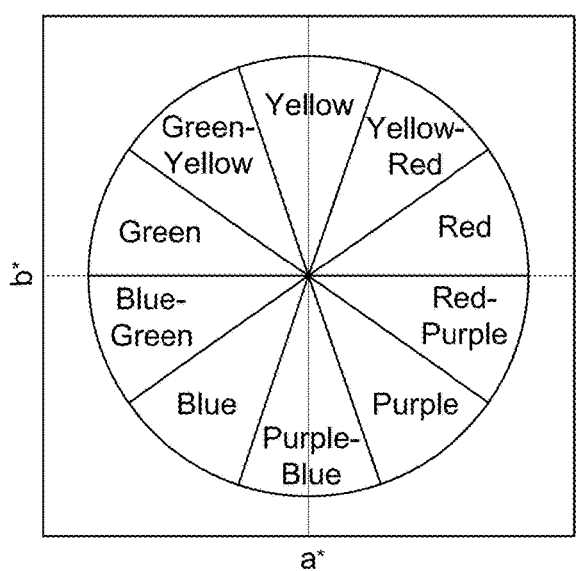
FIG. 4 illustrates the 10 main categories of hue in the a*-b* chromaticity plane, as prescribed in the Munsell classification system for color.

As also would be understood by those skilled in the field, each color in this array is defined by the Munsell system in terms of its hue (which has 10 categories with 4 subcategories in each, for 40 total items), chroma (ranging from 0 to 16), and value (ranging from 0 to 10). The 10 categories of hue are depicted and labeled in FIG. 4. All levels of saturation, or chroma, and hue are weighted equally and treated in a statistical count approach, following a similar method as discussed in "Statistical approach to color quality of solid-state lamps," *IEEE J. Sel. Top. Quantum Electron.,* 15(6), 1753 (2009), authors A. Zukauskas, R. Vaicekauskas, F. Ivanauskas, H. Vaitkevicius, P. Vitta, and M. S. Shur.

The color points of all 1600 color samples are calculated, as rendered by both the illumination source (i.e., the test illuminant) and by a CIE reference illuminant, or Planckian radiator, at the same color temperature. The CIE reference illuminant has a spectrum which is determined from the CCT of the illumination source, using Planck's law for blackbody radiation. Planck's law defines radiance of the light source B (in W/sr·m³) as a function of wavelength λ (in meters) and absolute temperature T (in K) as:

$$B_\lambda = \frac{2hc^2}{\lambda^5} \frac{1}{e^{\frac{hc}{\lambda k_B T}} - 1}$$

where h is the Planck constant and $k_B$ is the Boltzmann constant.

Figure 5A:
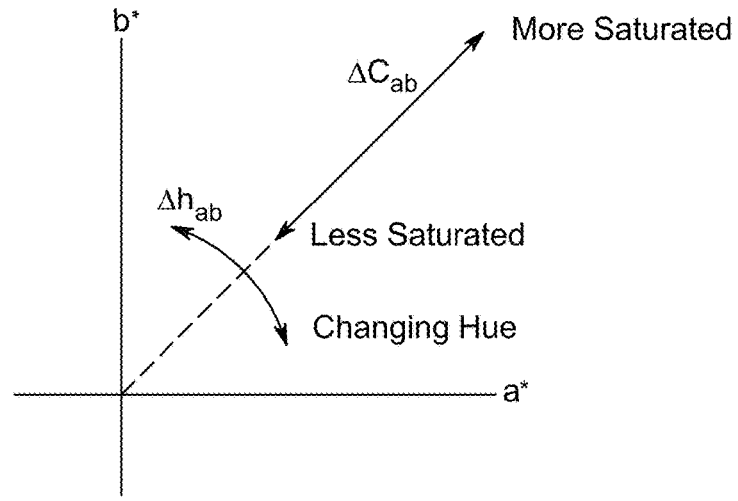
FIG. 5A illustrates the radial and azimuthal components in the a*-b* chromaticity plane that comprise each CRV.
Figure 5B:
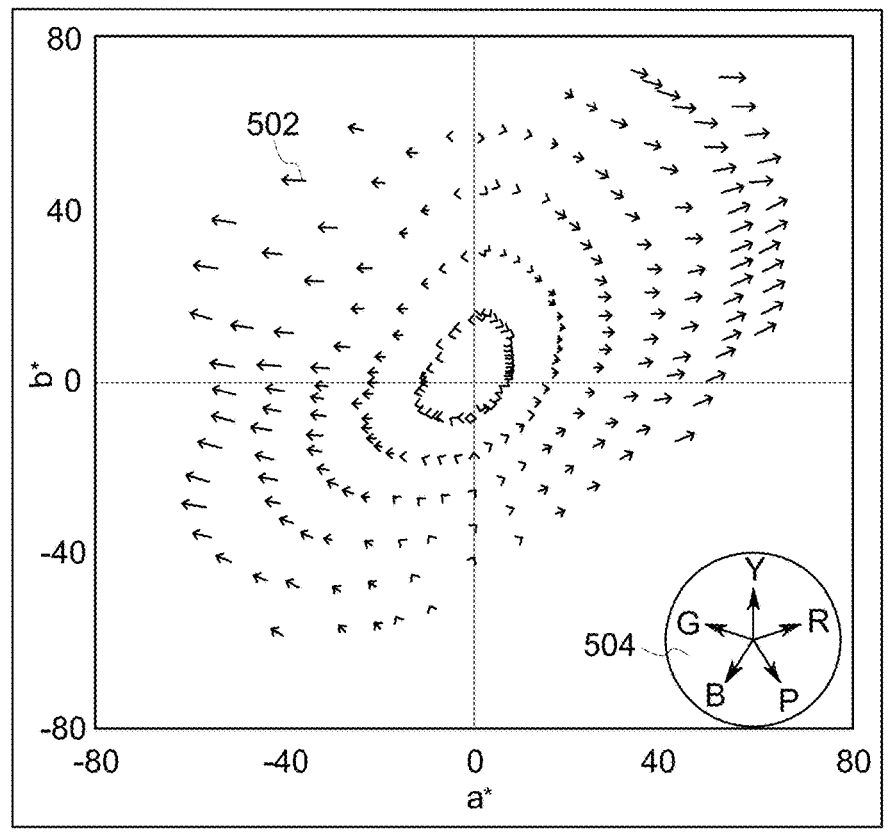
FIG. 5B represents the Color Rendering Vectors (CRVs) at Munsell value 5 for a neodymium incandescent lamp.

All of these color points (also referred to as color coordinates) are then converted to CIELAB color space and color rendition vectors (CRVs) are generated. A CRV is a representation of the magnitude and direction of a color appearance shift with respect to the reference illuminant. FIG. 5a illustrates the components contained in each CRV. The radial component, or $\Delta C_{ab}$, quantifies the shift in chroma, or saturation, where shifts away from the origin signify increases in saturation and shifts toward the origin signify decreases in saturation. The azimuthal component, or $\Delta h_{ab}$, quantifies the change in hue and can be represented by an angular change, in radians. A vector plot of the CRVs at a particular Munsell value can be produced as a visual representation of the color shifts on the a*-b* chromaticity plane. FIG. 5b.represents the CRVs 502 at Munsell value 5 for a neodymium incandescent lamp, a product commonly preferred by consumers. As seen in the vector plot, the neodymium lamp produces enhanced saturation, particularly in the red and green components (at the right and left sides, respectively, of the vector plot). The approximate vector directions corresponding to the colors yellow Y, red R, purple P, blue B, and green G, are indicated in the insert 504.

The radial and azimuthal components of each CRV for all 1600 Munsell colors are then determined to quantify the shift in chroma and hue, respectively. With such a large sample size, the magnitude and direction of the CRVs can be represented by statistical counts.

The Net Saturation Value (NSV) represents the percentage of test samples with improved saturation, reduced by the percentage of samples with decreased saturation. Improved levels of saturation are indicated by increases in chroma ($\Delta C_{ab}$>0) beyond a threshold of average perceptual difference, but below an over-saturation limit. Decreased saturation levels ($\Delta C_{ab}$<0) are only counted if chroma is reduced beyond the same threshold of average perceptual difference. The average perceptual difference value is based on the following publication: "Evaluation of Uniform Color Spaces Developed after the Adoption of CIELAB and CIELUV", *Color Research and Application,* volume 19, #2, pp. 105-121 (1994), authors M. Mahy, L. Van Eycken, & A. Oosterlinck, which found the average perceptibility radius to be 2.3 in CIELAB space. For the over-saturation limit, a value of $\Delta C_{ab}$=15 is chosen based on the following publication: "Color Quality Design for Solid State Lighting", Presentation at LEDs 2012, Oct. 11-12, San Diego, Calif. (2012), author Y. Ohno. In this work, an increase in preference was found for saturated colors, to a limit, and preference response declined for high levels of saturation. Around a value of approximately $\Delta C_{ab}$=15, the preference response was comparable to no saturation, or $\Delta C_{ab}$=0, with increased preference response in between these two values.

Individual NSV values ($NSV_i$) are calculated for the 10 main hue categories in the Munsell system, and a total NSV is taken as the average over the 10 hues. As used in this disclosure, NSV is defined by Equation (2) and Equation (3):

$$NSV_i=\text{(percent of CRVs in hue } i \text{ with } 2.3<\Delta C_{ab}<15)-\text{(percent of CRVs in hue } i \text{ with } \Delta C_{ab}<-2.3), \quad \text{Equation (2)}$$

$$NSV=\Sigma_{i=1}^{10} NSV_i/10, \quad \text{Equation (3)}$$

where $\Delta C_{ab}$ is the radial component of the CRV and represents the shift in perceived chroma, or saturation, and i represents the hue category for the 10 main hue categories of the Munsell system. For the region $-2.3<\Delta C_{ab}<2.3$, the change in saturation may not be perceived by a typical observer and is therefore not counted as either improved or worsened.

The Hue Distortion Value (HDV) represents a weighted percentage of test samples that are changing hue. While increased chroma (up to a limit) generally does contribute to attaining relatively higher LPI values, changes in hue are generally undesirable (although changes in hue are a relatively weaker contributory factor to the final LPI value than are chroma changes).

As would be understood by those skilled in the field, the Munsell color system is typically divided into 40 hue subcategories (4 subcategories in each of the 10 main hue categories). To calculate HDV, the percentage of test colors that change to the next hue subcategory, where $\Delta h_{ab} > \pi/20$ radians (or $1/40^{th}$ of a circle), is weighted by the average $\Delta h_{ab}$ value, scaled by the separation between hue sublevels ($\pi/20$ radians). This additional weighting is used to account for very large amounts of hue distortion, where the percentage alone approaches a limit at very high percentage, as nearly all test colors experience hue distortion of surpassing the threshold to be counted. For these calculations, the direction of hue distortion is unimportant, so $\Delta h_{ab} > 0$ for distortion in both the clockwise and counterclockwise directions. As with NSV, individual HDV values ($HDV_i$) are calculated for the 10 main hue categories in the Munsell system, and a total HDV is taken as the average over the 10 hues. As used in this disclosure, HDV is defined by Equation (4) and Equation (5):

$$HDV_i = (\text{percent of CRVs in hue } i \text{ with } \Delta h_{ab} > \frac{\pi}{20}) \times \frac{\Delta h_{ab,avg,i}}{\pi/20}, \quad \text{Equation (4)}$$

$$HDV = \sum_{i=1}^{10} HDV_i / 10, \quad \text{Equation (5)}$$

where $\Delta h_{ab}$ is the azimuthal component of the CRV and represents the shift in perceived hue, i represents the hue category for the 10 main hue categories of the Munsell system, and $\Delta h_{ab,avg,i}$ is the average $\Delta h_{ab}$ value for all colors within hue i.

Next, the NSV and HDV are merged into a Color Appearance value as per Equation (6):

$$\text{Color Appearance} = (NSV - HDV/2.5)/50 \quad \text{Equation (6)}$$

Note that in Equation (6), the HDV is weighted (i.e., divided by a factor) relative to NSV to provide the best match to observer preference responses. Realistically, the highest value of Color Appearance that is usually attained is about 1, although theoretically it can reach a value of 2, at a NSV=100 and a HDV=0.

Finally, the LPI equation is defined by Equation 7:

$$LPI = 100 + 50 \times [0.38 \times \text{Whiteness} + 0.62 \times \text{Color Appearance}], \quad \text{Equation (7)}$$

where Whiteness is defined in Equation (1) and Color Appearance is defined in Equation (6). The parameter of "100" is chosen so that a reference blackbody illuminant scores a baseline value of 100 as with other lighting metrics. The parameter of "50" is chosen in order to scale LPI changes to a similar magnitude as CRI. For example, a typical neodymium incandescent lamp may be penalized by about 20 points in the CRI system, having CRI of about 80 (relative to CRI=100 for the reference), while the same neodymium incandescent lamp may be rewarded by about 20 points in the LPI system, having LPI of about 120, relative to LPI=100 for the reference. The weighting factors of 38% Whiteness and 62% Color Appearance have been chosen to provide the best fit to observer preference data. These weighting factors are dependent on the observer set and may be modified in future developments with additional observer preference data, particularly from different demographic or cultural groups. However, in this disclosure, LPI is defined by Equation (7) and its associated description.

An alternative "master" equation for LPI, which is merely a combination of equations (1), (6) and (7), is shown as Equation (8):

$$LPI = 100 + 19 \times [1 - \frac{100}{\sqrt{(Duv + 0.010)^2}}] + 0.62 \times [NSV - HDV/2.5] \quad \text{Equation (8)}$$

The purpose of restating LPI in terms of the master equation illustrated above is to show that this novel index provides a value that the person of ordinary skill in the art can derive from parameters in color science, using the guidance of the present disclosure, without any undue experimentation. The LPI increases with NSV, but decreases as HDV grows. Separately, the LPI increases as Duv approaches that of the "White Line". Realistically, the highest value for LPI that is usually attainable is approximately 150, corresponding to Whiteness=1 and Color Appearance=1, however there is a theoretical maximum of 181, where Whiteness=1 and Color Appearance=2.

In summary, the LPI value for a given lamp or given test illuminant or given illumination apparatus may be determined by the following steps (not necessarily in this order):

(a) Provide the spectrum of the light emitted by the test illuminant as its Spectral Power Distribution (SPD) having 1-2 nm, (or finer), precision;

(b) Determine the color point (color temperature and Duv) from the SPD of the test illuminant;

(c) Calculate the Whiteness component from Duv using Equation (1);

(c') Determine the reference spectrum from the color temperature of the test illuminant;

(d') Calculate the color points of all 1600 Munsell colors in the CIELAB color space for both the reference and test illuminants;

(e') Calculate the color rendition vectors for the test illuminant, relative to the reference spectrum;

(f') Calculate the Net Saturation Value and the Hue Distortion Value using Equation (3) and Equation (5), respectively;

(g') Calculate the Color Appearance component using Equation (6); and (d) Merge the Whiteness component from step (c) and the Color Appearance component from step (g') into the LPI using Equation (7).

Figure 6:
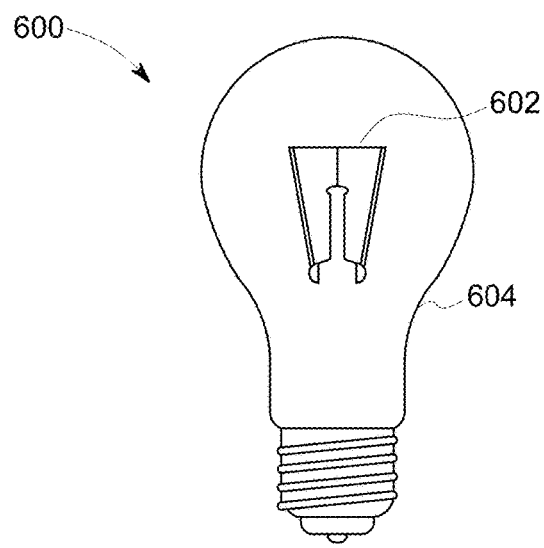
FIG. 6 illustrates a Reveal® type incandescent or halogen light source that includes one or more incandescent or halogen coils within a glass dome that is doped with neodymium oxide (Nd2O3).

Conventional lamp types include incandescent, halogen, and LED lamps employing Nd-doped glass to absorb some of the yellow light from the spectrum emitted by the light source to enhance the color preference relative to their counterpart lamps without the Nd absorption. FIG. 6 illustrates a Reveal® type incandescent or halogen light source 600 that includes one or more incandescent or halogen coils 602 within a glass dome 604 that is doped with neodymium oxide (Nd2O3). The light emitted from the coil or coils is similar to that of a blackbody spectrum, typically with a correlated color temperature (CCT) between about 2700 K and about 3200 K. This CCT range may be referred to as warm white. The Nd-doped glass dome 604 functions to filter out light in the yellow portion of the color spectrum, such that the light emitting through the glass dome 604 of the light source 600 has an enhanced color preference, or color saturation, or color contrast capability that is typically preferred by a human observer relative to light emitted from the same light source without the Nd glass filter.

Figure 7A:
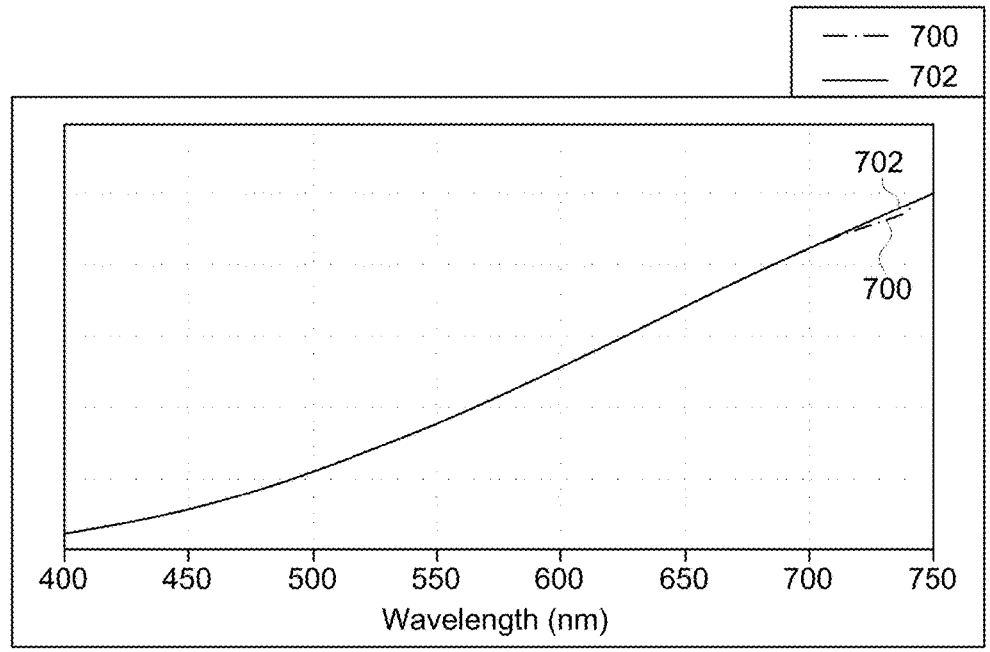
FIG. 7A includes a graph of the relative light output versus wavelength (or the spectral power distribution (SPD)) of an incandescent light source of FIG. 6 having a CCT=2695 Kelvin (K), and a graph of the SPD of a blackbody light source having the same CCT=2695 K.

FIG. 7a includes a graph 700 of the relative light output versus wavelength (or the spectral power distribution (SPD)) of an incandescent light source 600 of FIG. 6 having a CCT=2695 Kelvin (K), and a graph 702 of the SPD of a blackbody light source having the same CCT=2695 K. A blackbody emitter is typically considered to be the reference light source against which any test illuminant is compared in calculations of colorimetric values of the test light source, for test sources having CCT<5000 K (for CCT>5000 K, the Daylight spectrum is typically used as the reference). As the reference illuminant, the blackbody emitter is assigned the value of CRI=100. For consistency, the blackbody is likewise assigned the reference value of 100 for the LPI metric. Due to the close similarity of the incandescent SPD to that of the blackbody, the values for incandescent light source at 2695 K are CRI=99.8 and LPI=99.8. In the case of CRI, a value of 99.8 is nearly equal to the maximum possible value of CRI=100, so the incandescent light source has nearly ideal color rendering (or color "fidelity") per the CRI metric. In the case of LPI, a value of 99.8 is considered to be a neutral value, not a maximum value. Values of LPI much lower than 100 are possible, whereby a typical observer would be expected to prefer such a light source much less than the incandescent source, but there are also much higher possible values, up to about LPI=150, whereby a typical observer would be expected to prefer such a light source much more than the incandescent source. The CRI metric quantifies the degree to which a light source renders eight pastel test colors exactly the same as the blackbody reference, and so it is a color "fidelity" metric of limited scope in color space.

Figure 7B:
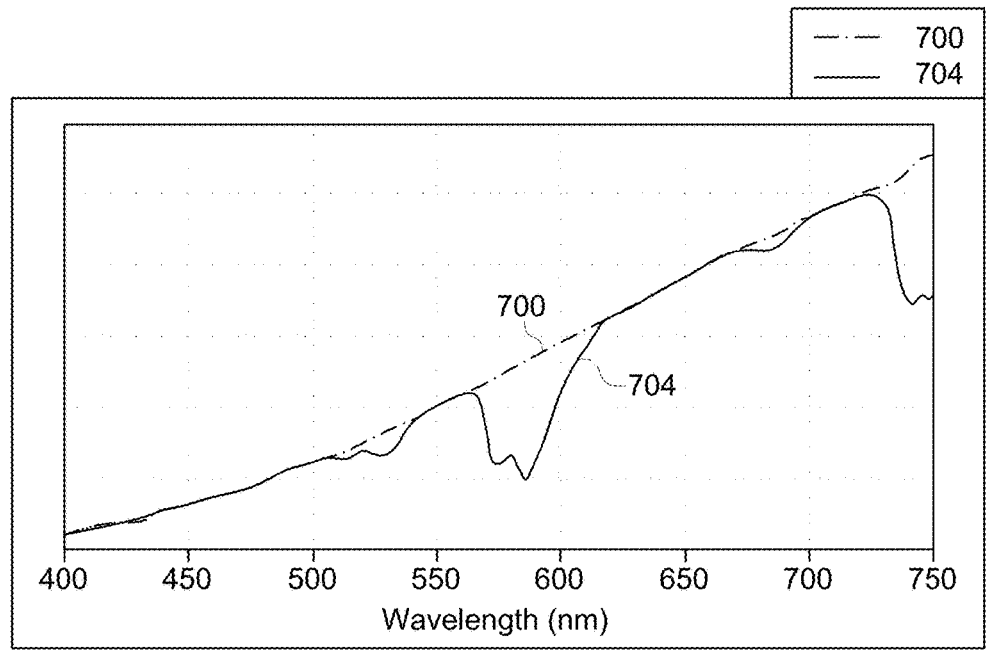
FIG. 7B includes a graph of the SPD of an incandescent light source having a CCT=2695 K, and a graph of the SPD of a Reveal® type incandescent light source having a CCT=2755 K, obtained by filtering the light of the incandescent light source with Nd-doped glass.

FIG. 7b includes a graph 700 of the SPD of an incandescent light source having a CCT=2695 K, and a graph 704 of the SPD of a Reveal® type incandescent light source having a CCT=2755 K, CRI of about 80 and LPI of about 120, obtained by filtering the light of the incandescent light source 700 with Nd-doped glass. The differences between the two SPDs is due entirely to the absorption of light by the Nd-doped glass, most of which occurs in the yellow range from about 570 nm to about 610 nm, and a weaker absorption in the green range from about 510 nm to about 540 nm. The color preference benefits accrued from the Nd absorption are primarily due to the yellow absorption.

An SPD may be plotted with an absolute scale of light intensity, e.g. with dimensions of Watts/nm or Watts/nm/cm$^2$ or other radiometric quantity, or it may be plotted in relative units, sometimes normalized to the peak intensity, as is provided here. A normalized SPD is sufficient for calculation of all colorimetric characteristics of the light source, assuming that the illuminance of the lighted object or space is in the range of normal photopic vision (i.e., greater than about 10-100 lux, up to about 1,000-10,000 lux (lux=lumens/m$^2$). The tabulated information in an SPD curve enables precise calculations of all colorimetric and photometric responses of that light source.

The SPD 700 of the incandescent lamp shown in FIG. 7a shows it to be an exceptionally balanced light source because there are no significant spikes or holes at any wavelengths. Such a smooth curve that matches closely to the blackbody curve having the same CCT indicates outstanding color fidelity abilities. A blackbody spectrum is defined to have perfect color rendering by the CRI scale, i.e., CRI=100. The incandescent lamp typically has a CRI of about 99. The Nd-incandescent lamp typically has a CRI of about 80. In spite of the lower CRI, most observers prefer the color rendering of the Nd-incandescent lamp over the incandescent lamp, especially for applications where organic objects are being illuminated, e.g. people, food, wood, and the like.

When compared to artificial light sources, sunlight exhibits large amounts of energy in the blue and green portions of the spectrum, making it a cool (i.e., high CCT) light source with a high color temperature (of about 5500 K). Thus, SPD diagrams are useful in understanding how various lamps differ in the color composition of their light output.

Figure 8A:
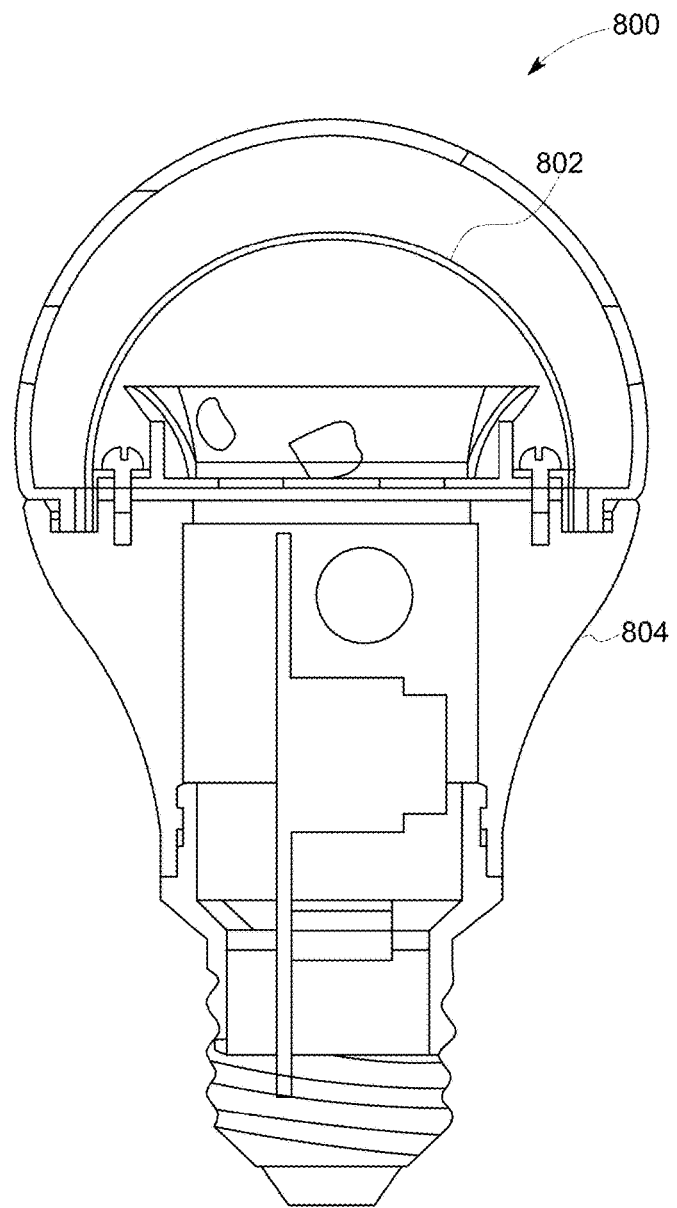
FIG. 8A illustrates a Reveal® type LED light source that includes one or more LEDs.
Figure 8B:
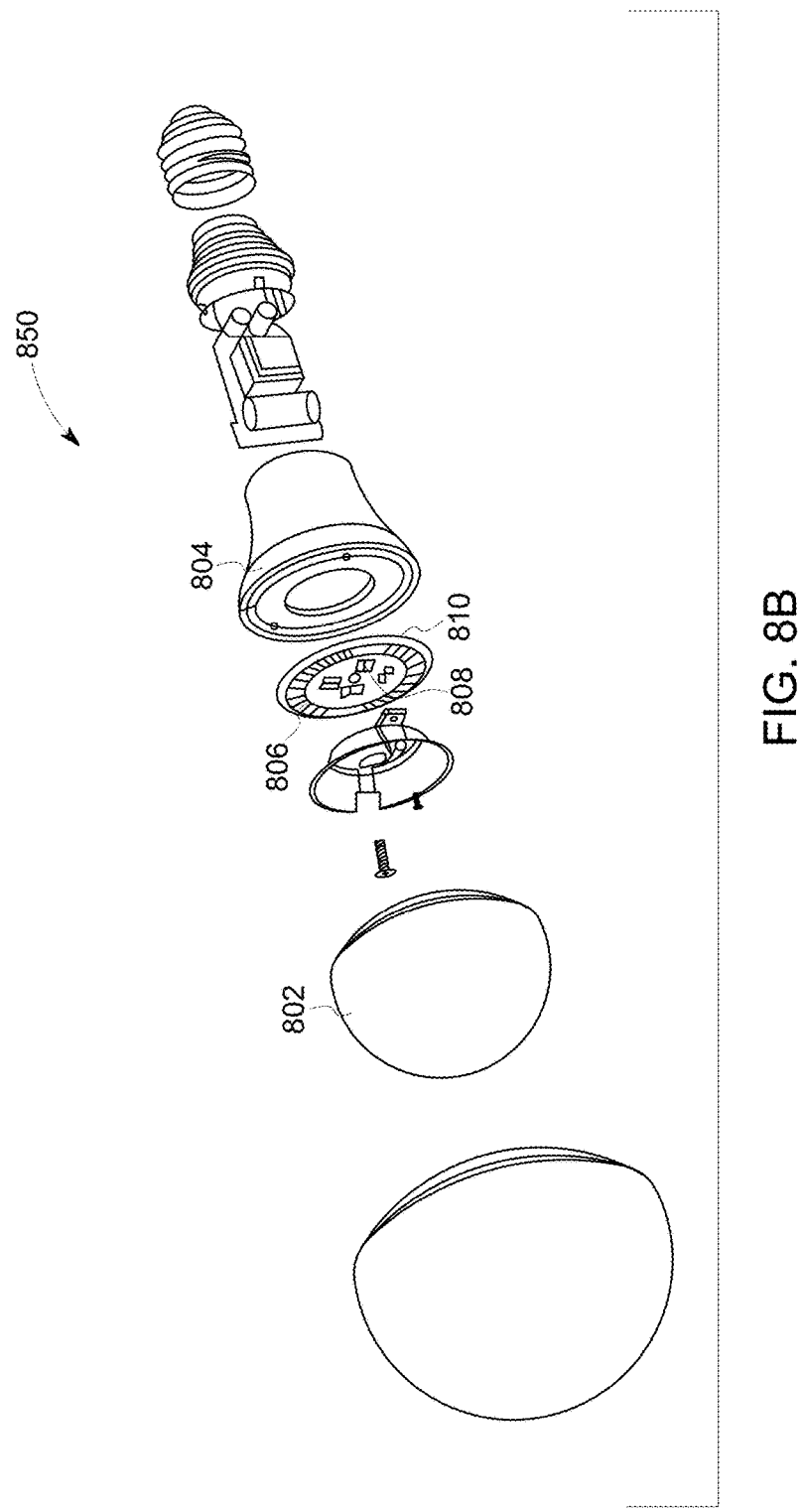
FIG. 8B is an exploded view of the light source of FIG. 8A.

Some conventional lamp types include one or more LEDs employing Nd-doped glass to absorb some of the yellow light from the spectrum emitted by the light source to enhance the color preference relative to their counterpart lamps that lack the Nd absorption. FIG. 8a illustrates a Reveal® type LED light source 800 that includes one or more LEDs, and FIG. 8b is an exploded view 850 of the light source of FIG. 8a. An LED (light-emitting diode) is an example of a solid state lighting (SSL) component, which may include semiconductor light-emitting diodes (LEDs), organic LEDs, or polymer LEDs as sources of illumination instead of light sources such as incandescent bulbs that use electric filaments, or fluorescent tubes that use plasma and/or gas.

Referring to FIG. 8b, LEDs 806 and 808 are shown mounted to a printed circuit board 810 which is attachable to a housing 804, so that, when assembled, the LEDs 806 and 808 are positioned within a glass dome 802 that is impregnated with neodymium oxide (Nd2O3), such that most or all of the light emitted by the light source passes through the dome. It should be understood that FIGS. 8a and 8b depict just one example of an LED lamp which utilizes one or more solid state lighting components to provide illumination when powered. Accordingly, the specific components depicted in FIGS. 8a and 8b are for illustrative purposes only, and one skilled in the art recognizes that other shapes and/or sizes of various components may be utilized which may depend upon intended use and/or other considerations. For example, the housing 804 may be of different size and/or shape, and the solid state lighting components 806 and 808 may be connected directly and/or indirectly thereto during assembly.

Figure 9:
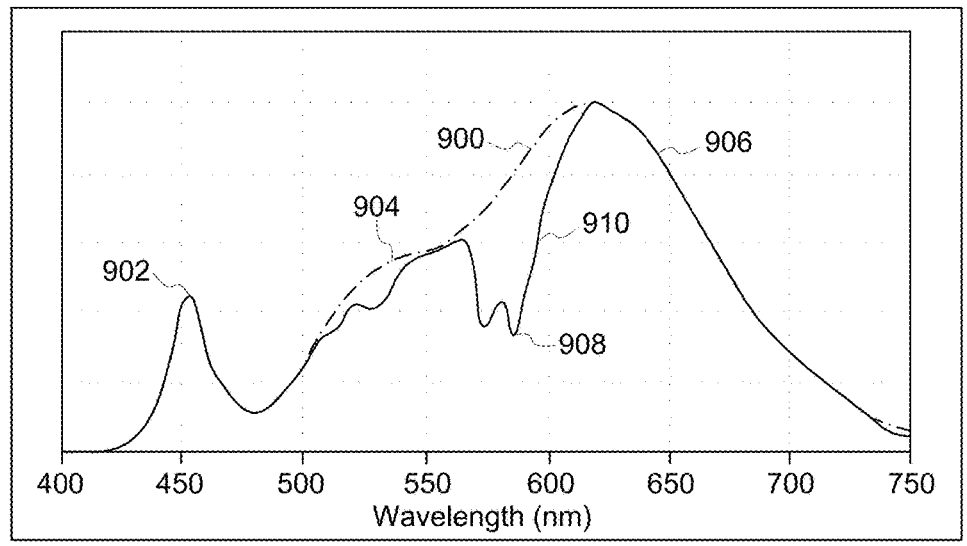
FIG. 9 includes a graph of the SPD of a warm-white LED lamp comprising multiple blue LEDs each exciting a YAG phosphor and a red phosphor, the mixed light having a CCT=2766 K, and a graph of the SPD of a Reveal® type LED light source having a CCT=2777 K.

FIG. 9 includes a graph 900 of the spectral power distribution (SPD) of a conventional warm-white LED lamp comprising multiple blue LEDs each exciting a YAG phosphor and a red phosphor, the mixed light having a CCT=2766 K, CRI=91, and LPI=97, and a graph 910 of the SPD of a conventional Reveal® type LED light source 800 of FIG. 8a having a CCT=2777 K, CRI=91, and LPI=111. The light emitted from the LEDs may be comprised of a mixture of light 902 from a blue LED, having peak wavelength in the range of about 400 to about 460 nm (e.g., royal blue InGaN), and yellow-green light 904 having peak emission in the range of about 500 to about 600 nm created by the excitation of a phosphor material (such as a YAG:Ce phosphor) by the blue emission from the LED, and also red light 906 having peak emission in the range of about 600 to about 670 nm created by the excitation of another phosphor (such as nitride or sulfide phosphor) by the blue emission from the LED. The portion of the blue light generated by the blue LED that is not absorbed by the phosphor materials, combined with the light emitted by the phosphor materials, provides light which appears to the human eye as being nearly white in color. The mixed-light spectrum is also similar to that of a blackbody spectrum, but may include a depression in the wavelength range between the blue LED emission and the yellow-green phosphor emission. The Nd glass functions to filter out light in the yellow portion 908 of the color spectrum which may have been produced by the yellow-green and red phosphors, such that the light 910 emitting from the glass dome of the light source 800 has an enhanced color preference, or color saturation or color contrast capability that is typically preferred by a human observer relative to light 900 emitted from the same light source without the Nd glass filter.

Figure 10:
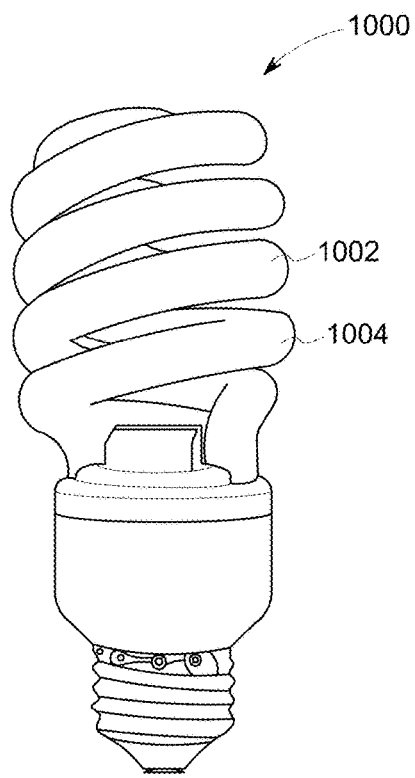
FIG. 10 illustrates a Reveal® type CFL light source that includes a low-pressure Hg discharge tube coated with a customized mix of phosphors having relatively low emission in the yellow.

Some conventional lamp types which include one or more low-pressure mercury (Hg) discharge lamps and special formulations of visible-light emitting phosphors (i.e., fluorescent (FL) or compact fluorescent (CFL) light sources) selected to reduce the amount of yellow light emitted by the light source are also known to enhance the color preference relative to their typical counterpart FL or CFL light source lamps without the special phosphor formulations. FIG. 10 illustrates a Reveal® type CFL light source 1000 that includes a low-pressure Hg discharge tube 1002 coated with a customized mix of phosphors 1004 having relatively low emission in the yellow.

Figure 11:
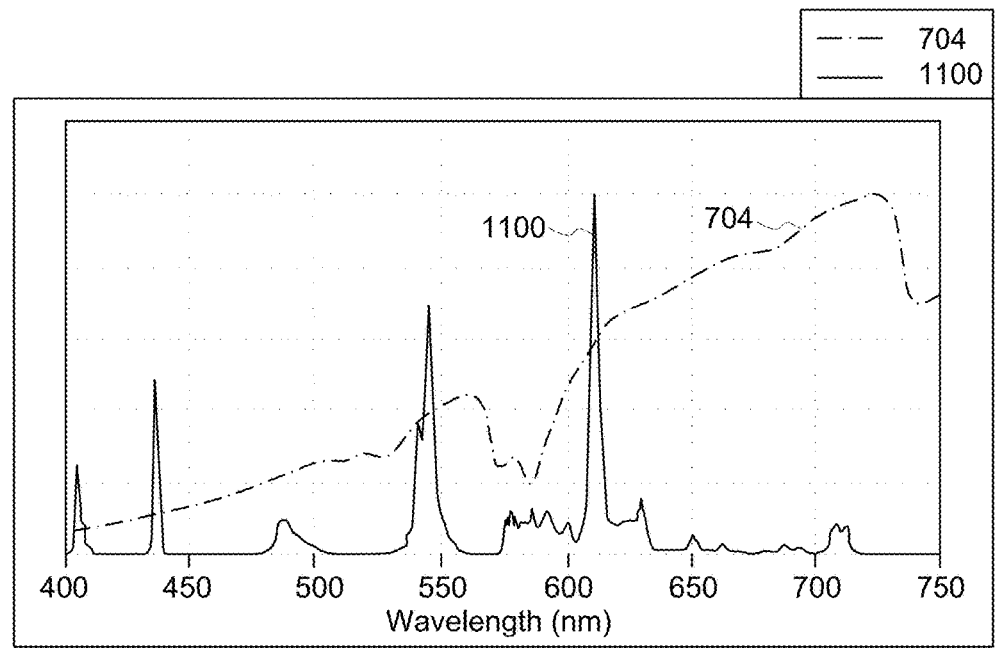
FIG. 11 includes a graph of the spectral power distribution (SPD) of a Reveal® type CFL light source of FIG. 10, having a CCT=2582 K, and a graph of the SPD of a Reveal® type incandescent light source of FIG. 6 having a CCT=2755 K.

FIG. 11 includes a graph 1100 of the spectral power distribution (SPD) of a Reveal® type CFL light source of FIG. 10, having a CCT=2582 K, CRI=69, and LPI=116, and a graph 704 of the SPD of a Reveal® type incandescent light source of FIG. 6 having a CCT=2755 K. The mixed-light spectrum 1100 consists of many narrow, and some broad, emission bands that tend to mimic the shape of a blackbody spectrum having a CCT=2582 K. Compared with the Nd-incandescent SPD 704, the enhancement in red and green, and the suppression in yellow, are similar, given the limitations of the red and green phosphors available for the CFL product. The mixed light spectrum 1100 of the light source 1000 having a relatively low emission in the yellow portion of the spectrum has an enhanced color preference, or color saturation or color contrast capability that is typically preferred by a human observer relative to light emitted from the same light source having a traditional phosphor mix.

Some additional conventional lamp types include one or more LEDs having green and red phosphors having peak wavelengths separated sufficiently to produce a depression in the yellow wavelength range and are used, for example, in grocery applications to enhance the colors of meats, vegetables, and produce (e.g. fruit). As mentioned above, FIG. 8b illustrates an LED light source 350 that includes one or more LEDs 368 and 372 which can, in some implementations, include one or more LEDs having green and red phosphors to produce light which enhances the colors of meats, vegetables and the like.

Figure 12:
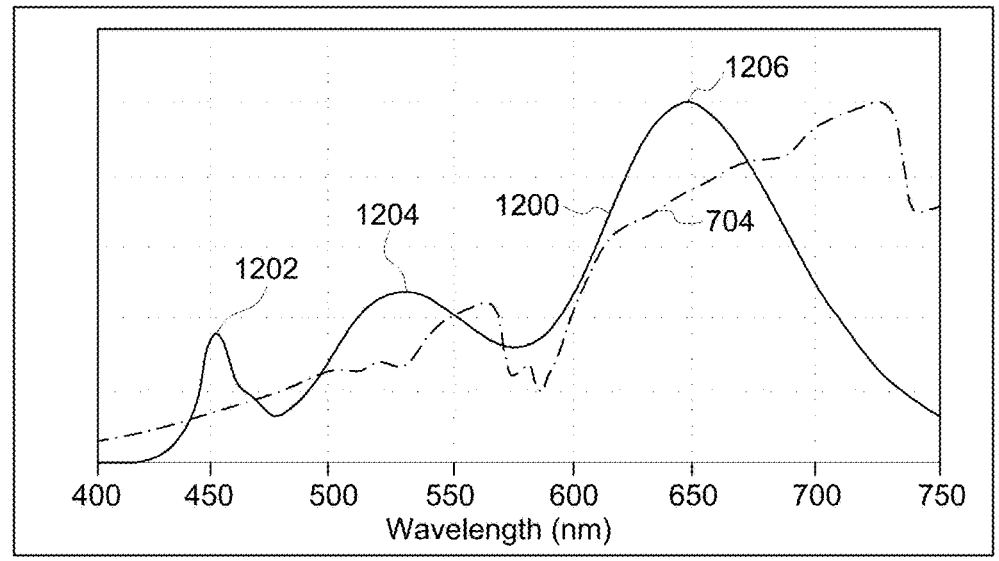
FIG. 12 includes a graph of the SPD of the light source of FIG. 8b having green and red phosphors having peak wavelengths separated sufficiently to produce a depression in the yellow wavelength range, and having a CCT=2753 K, plotted along with a graph of the SPD of a Reveal® type incandescent light source of FIG. 6 having a CCT=2755 K.

FIG. 12 includes a graph 1200 of the SPD of the light source having green and red phosphors having peak wavelengths separated sufficiently to produce a depression in the yellow wavelength range, and having a CCT=2837 K, CRI=74, and LPI=124, plotted along with a graph 704 of the SPD of a Reveal® type incandescent light source of FIG. 6 having a CCT=2755 K. The light emitted from the LEDs may be comprised of a mixture of light from a blue LED, having peak wavelength in the range of about 400 nanometers (nm) to about 460 nm, and green light having peak emission in the range of about 500 nm to about 580 nm created by the excitation of a green phosphor by the blue emission from the LED, and red light having peak emission in the range of about 600 nm to about 670 nm created by the excitation of a red phosphor by the blue emission from the LED. The portion of the blue light generated by the blue LED that is not absorbed by the phosphor materials, combined with the light emitted by the green and red phosphor materials, provides light which appears to the human eye as being nearly white in color. The mixed-light spectrum may have a depression in the wavelength range between the blue LED emission 1202 and the green phosphor emission 1204, and may include a second depression in the yellow wavelength range between the green phosphor emission 1204 and the red phosphor emission 1206. The light source may also have a CCT between about 2700 K and about 6000 K, or it may have a higher CCT, e.g., as high as about 10,000 K or higher, or a lower CCT, e.g., as low as about 1800 K or lower. The reduced emission in the yellow portion of the color spectrum resulting from the separation of the peaks of the green and red phosphors emission 1204 and emission 1206 relative to the usual peak wavelength of yellow-green and red phosphors (e.g. the yellow-green phosphor 904 and the red phosphor 906 in FIG. 9), provides a light source spectrum 1200 having an enhanced color preference, or color saturation or color contrast capability that is typically preferred by a human observer relative to light emitted from the same light source employing typical yellow-green and red phosphors.

Conventional blue-shifted yellow (BSY) plus red (R) LED light sources (BSY+R) may generate a white light consisting of a blue LED having peak wavelength in the range of about 400 nm to about 460 nm, and blue-shifted yellow (i.e., yellow-green) light having peak emission in the range of about 500 nm to about 560 nm created by the excitation of a green phosphor by the blue emission from the LED, and red light having peak emission in the range of about 600 nm to about 630 nm emitted by a red LED. In some embodiments, the LED light source 850 shown in FIG. 8b may include one or more groups of LEDs 806 and 808 that may each consist of a mixture of blue LEDs coated with BSY phosphor and red LEDs.

Figure 13:
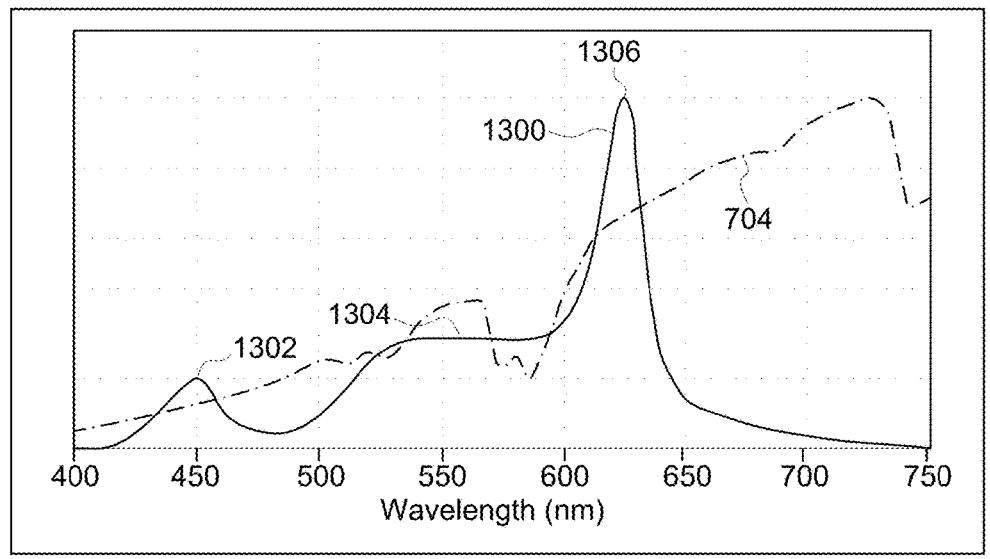
FIG. 13 includes a graph of the SPD of a BSY+R type of LED light source having blue LEDs coated with BSY phosphor, and red LEDs, and having a CCT=3000 K, and a graph of the SPD of a Reveal® type incandescent light source having a CCT=2755 K.

FIG. 13 includes a graph 1300 of the SPD of a conventional BSY+R type of LED light source having blue LEDs coated with BSY phosphor, and red LEDs, and having a CCT=2658 K, CRI=93, and LPI=110, and a graph 704 of the SPD of a Reveal® type incandescent light source having a CCT=2755 K. The portion of the blue light generated by the blue LED that is not absorbed by the phosphor materials, combined with the light emitted by the phosphor material and the red light emitted by the red LED, provides light which appears to the human eye as being nearly white in color. The mixed-light spectrum 1300 is also similar to that of a blackbody spectrum, but with a depression in the wavelength range between the blue LED emission 1302 and the BSY phosphor emission 1304, and a second depression in the yellow wavelength range between the BSY phosphor emission 1304 and the red LED emission 1306. The reduced emission in the yellow portion of the color spectrum resulting from the separation of the peaks of the green phosphor and red LED 1304 and 1306 relative to the usual peak wavelength of yellow-green and red phosphors (e.g. the yellow-green phosphor 904 and the red phosphor 906 in FIG. 9), provides a light source spectrum 1300 having an enhanced color preference, or color saturation or color contrast capability that is typically preferred by a human observer relative to light emitted from the same light source employing typical yellow-green and red phosphors.

In order to better understand and communicate the impact of spectral component selection on the lighting preference index (LPI) metric, a detailed design of experiments (DOE) has been performed using a spectral model. The experiments allowed for identification of optimal spectral features in order to maximize LPI and the color preference response of a typical observer, and guide the design of future lighting products. This DOE provides general guidelines for selection of light emitting components for improving LPI of a light source.

Figure 1A:
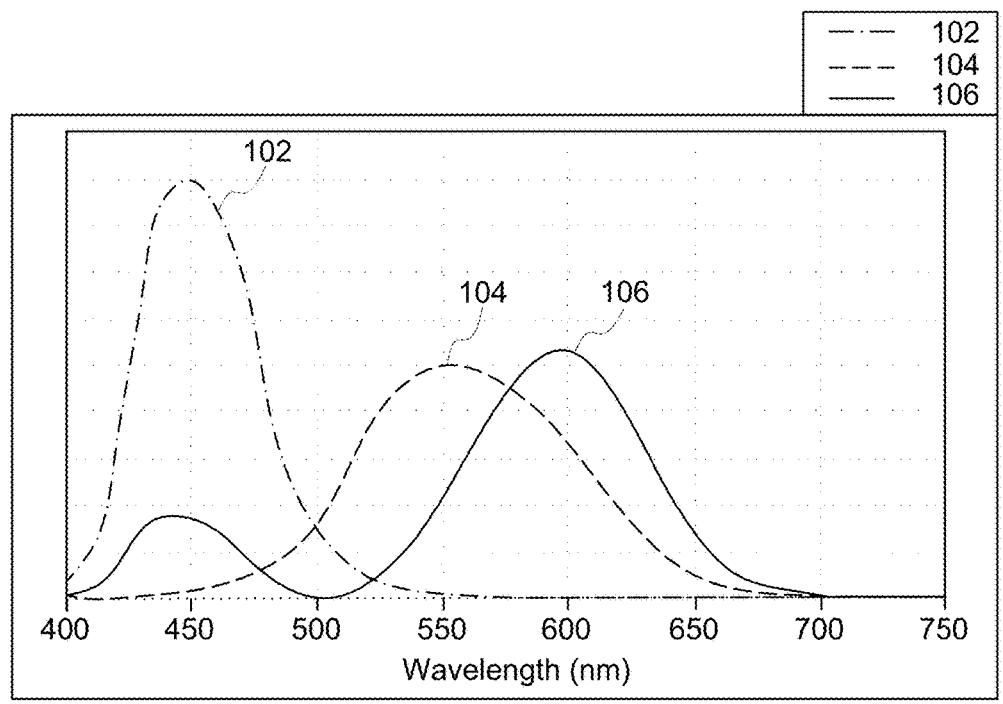
FIG. 1A includes a graph of the three color matching functions, or the chromatic response of a standard observer, for XYZ chromaticity.
Figure 1B:
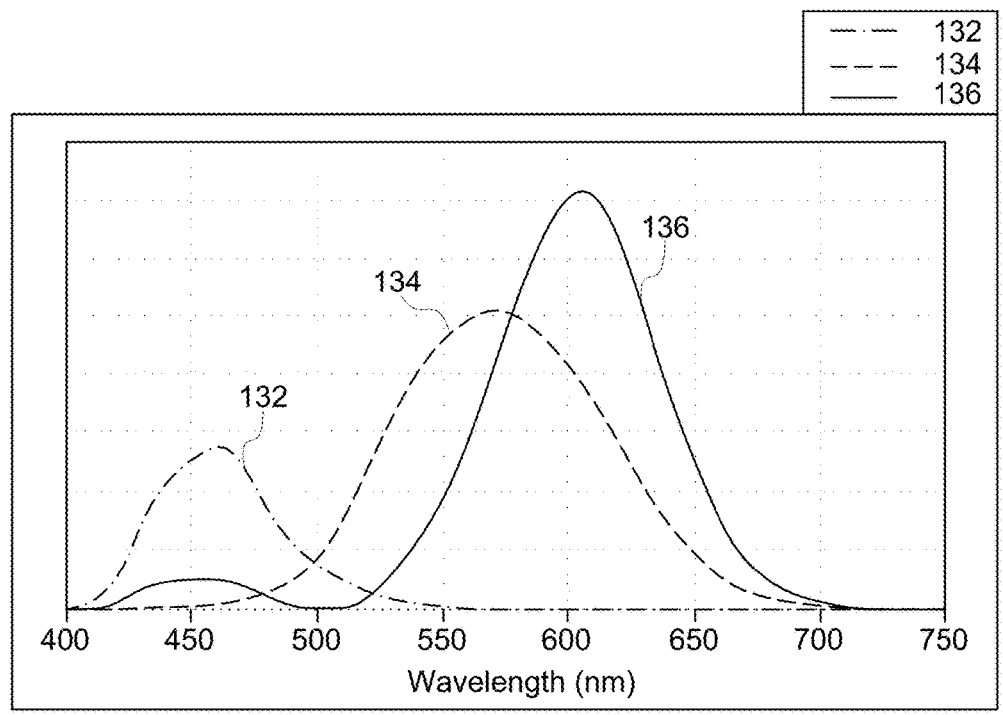
FIG. 1B includes a graph of the products of the three color matching functions with the spectrum for a standard incandescent lamp.
Figure 1C:
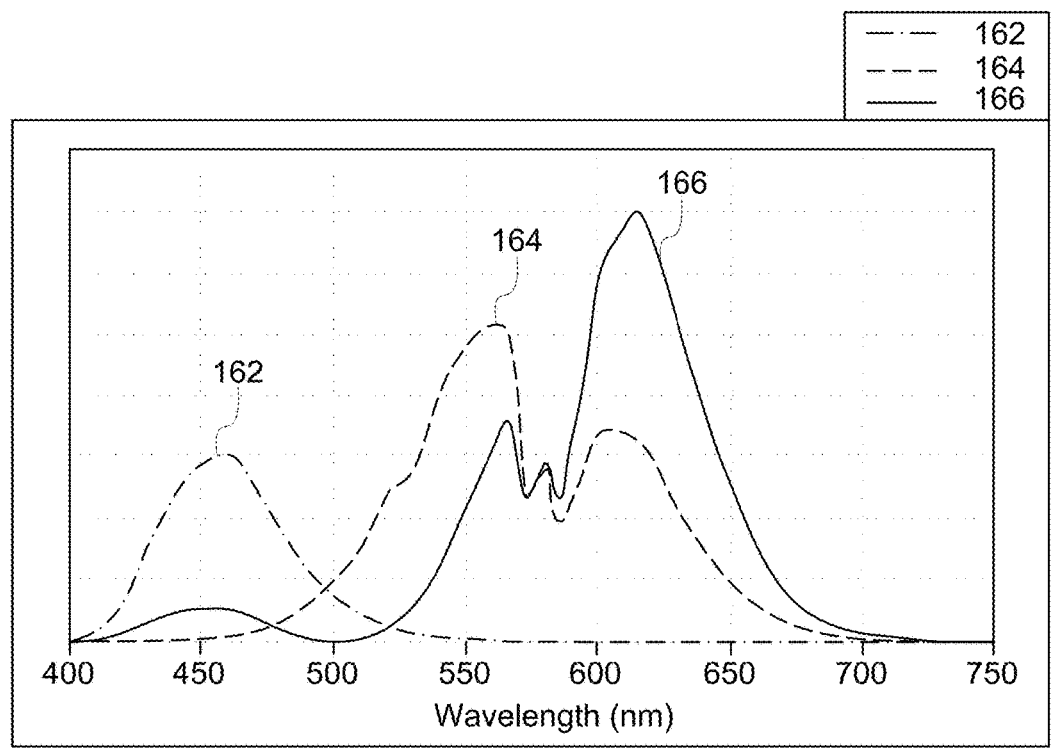
FIG. 1C includes a graph of the products of the three color matching functions with the spectrum for a Reveal® incandescent lamp.
Figure 14:
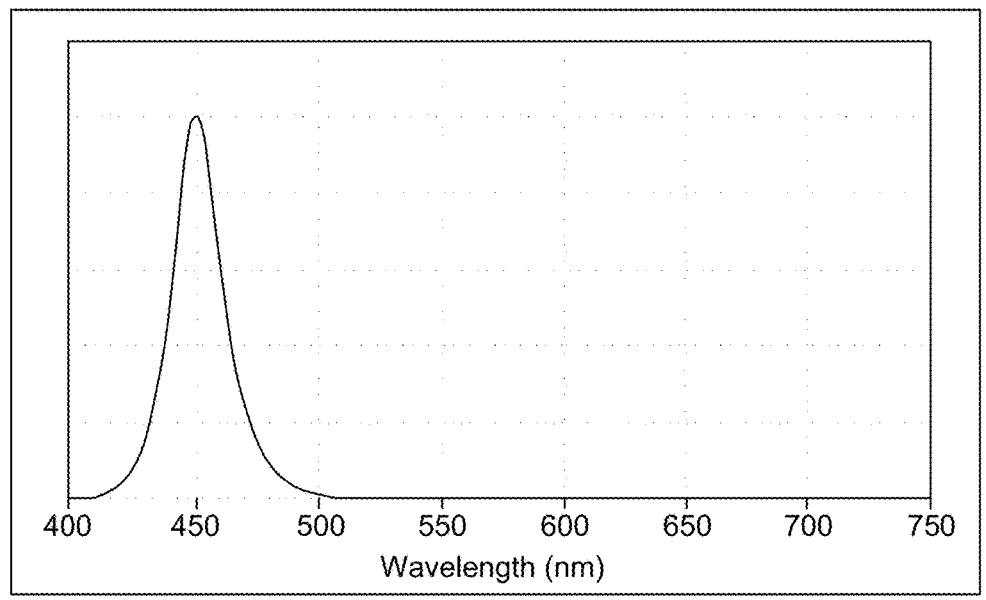
FIG. 14 illustrates the blue emission as a function of wavelength.

Each spectrum is comprised of three components (nominally blue, green, and red) superimposed into a composite spectrum. The blue emission component used in the DOE is that of a blue LED, peaked at 450 nm. This wavelength was chosen to be representative of the blue LED population; however, it should not be considered as a limitation of the results, since a similar DOE performed using different blue emission characteristics would be expected to produce very similar results because the LPI color metric is relatively much less sensitive to the blue emission than to the green and red emission. This can be understood from FIG. 1a where the retinal response in the blue 102 is clearly differentiated from the green 104 and red 106, but the green and red responses are not nearly as clearly differentiated from each other. FIG. 14 illustrates the blue emission as a function of wavelength as used in this DOE. Because of the relative insensitivity of LPI to the blue characteristics, the results of this DOE may be expected to represent the results given any blue light source having peak wavelength in the blue range (e.g. about 400 to about 460 nm) and having any FWHM less than about 50 nm.

Figure 15:
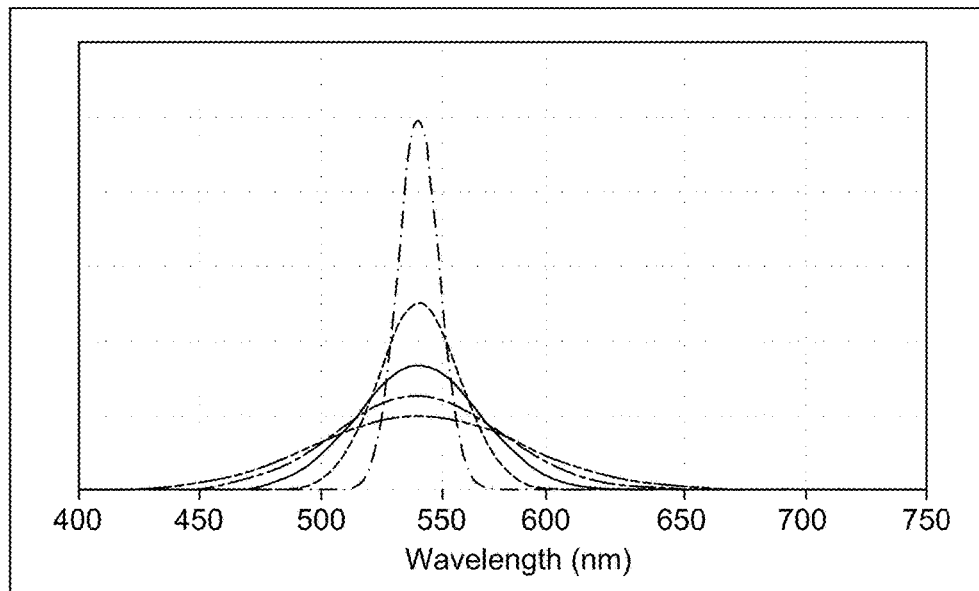
FIG. 15 displays a selection of five possible green components, of varying widths.

The green component is modelled using a Gaussian function as an approximation of, but not limited to, both LED and phosphor emissions, or more generally SSL and down-converter emissions. The peak wavelength of the green component is allowed to vary from 520 nm to 560 nm in 10 nm increments, while the full-width-at-half-maximum (FWHM) is varied from 20 nm to 100 nm in 10 nm increments as an approximation of, but not limited to, both LED and phosphor emissions. FIG. 15 displays a selection of five possible green components, of varying FWHM, out of 45 (5 peaks×9 FWHMs) that were used in the DOE (design of experiments).

Figure 16:
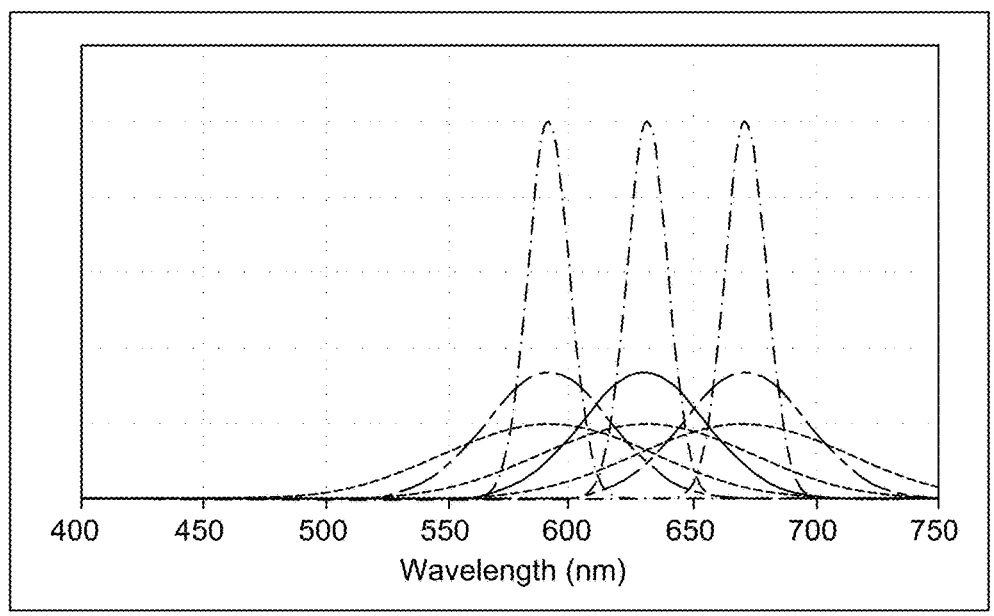
FIG. 16 displays a selection of nine possible red components of varying widths and peak wavelengths.
Figure 17:
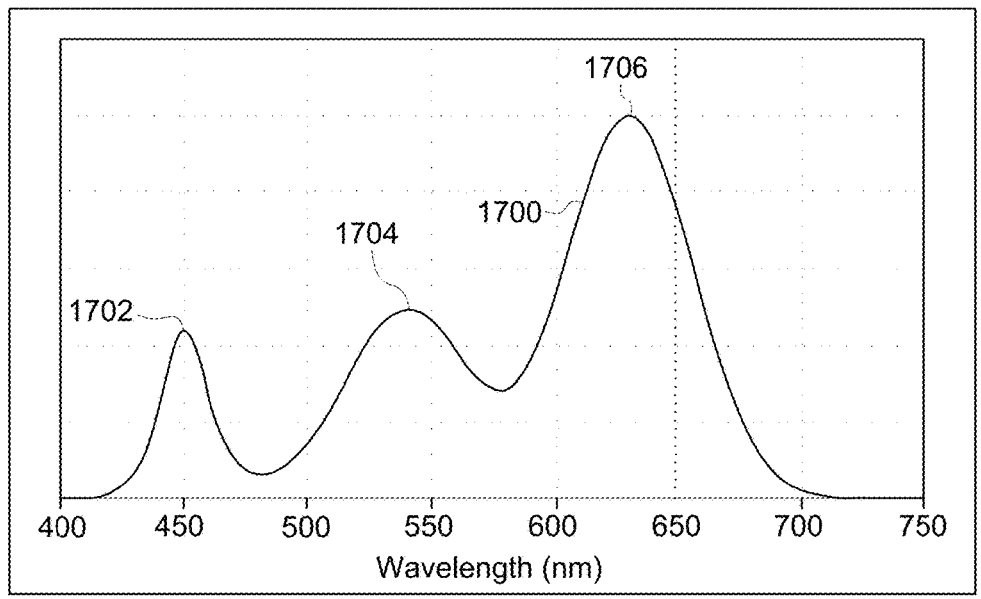
FIG. 17 depicts a representative spectrum comprised of a blue, green, and red component.

The red component is also modelled using a Gaussian function as an approximation of, but not limited to, both LED and phosphor emissions, or more generally SSL and down-converter emissions. The peak wavelength of the red component is allowed to vary from 590 nm to 680 nm in 10 nm increments, while the FWHM is varied from 20 nm to 100 nm in 10 nm increments. FIG. 16 displays a selection of nine possible red components out of 90 red components (10 peaks×9 FWHMs) that were used in the DOE. FIG. 17 depicts a representative spectrum 1700 comprised of a blue 1702, green 1704, and red 1706 component, for illustrative purposes.

All combinations of blue, green, and red components were generated, resulting in 4050 unique combinations (1 blue×45 greens×90 reds). With the shape of each component fixed by the chosen parameters, the relative amplitudes of the blue, green, and red components were adjusted in order to result in a chosen color point. Having defined the peak and width of the blue, green, and red Gaussian components, and the color point (which constrains the ratios of the green and red peak amplitudes relative to the blue amplitude) the composite spectrum is uniquely defined. The DOE was performed for two color points, one at 2700 K on the blackbody (Duv=0.000) and one at 2700 K near the "White Line" (Duv=−0.010), resulting in a total of 8100 spectra. Lighting preference index (LPI) values were then calculated for each spectrum and analyzed for trends and trade-offs.

Figure 18:
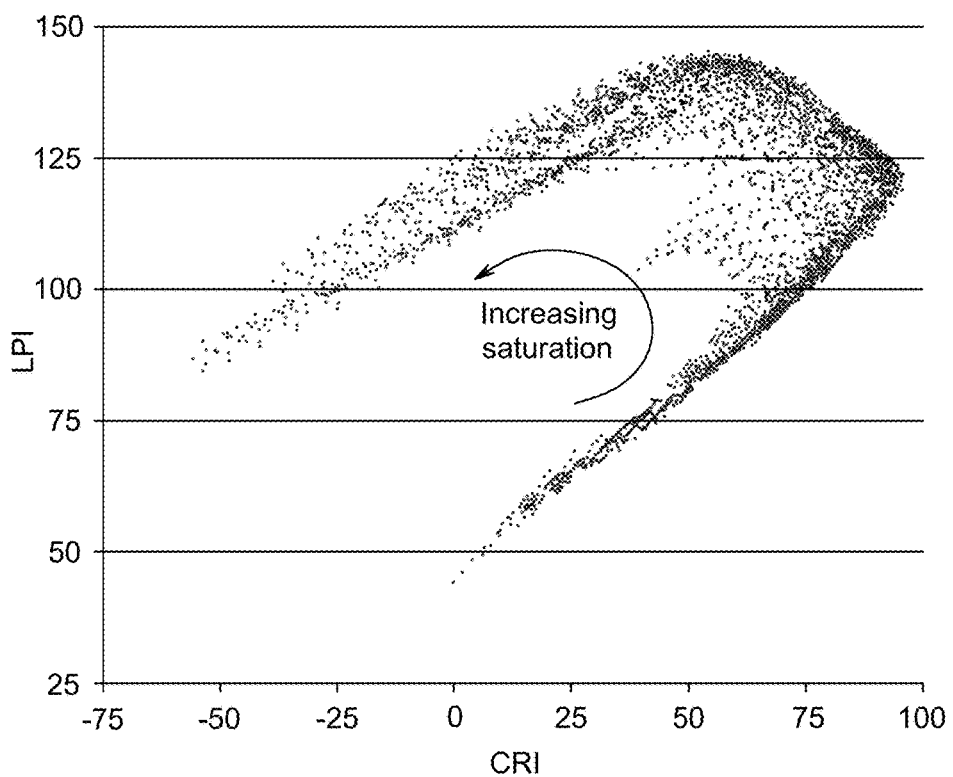
FIG. 18 plots the LPI values versus the CRI values for 4050 spectra having all possible combinations of green and red widths and peak wavelengths.
Figure 19A:
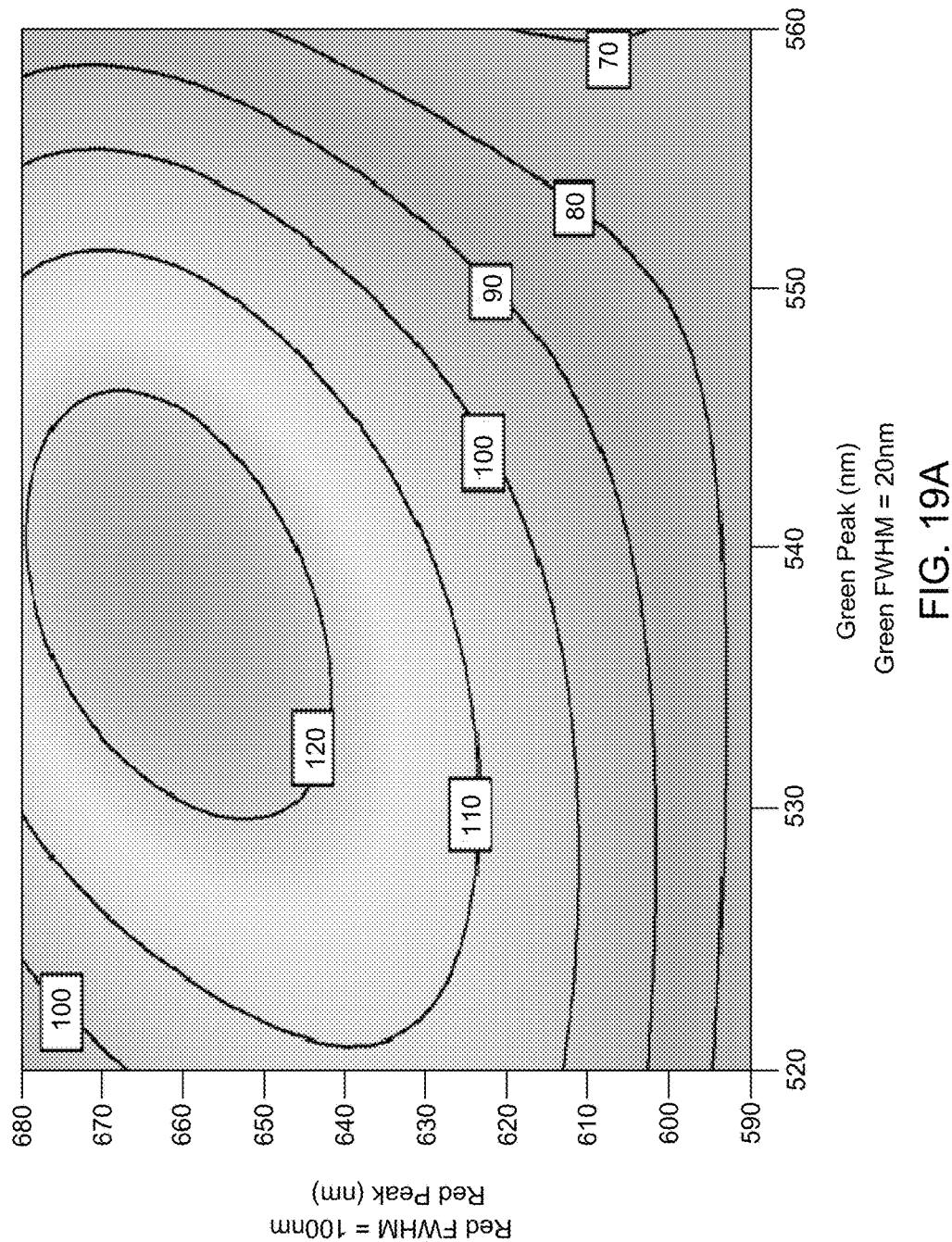
FIG. 19 displays the 3×3 contour plot grid of the lighting preference index (LPI) versus green and red widths and peak wavelengths associated with a color point on the blackbody locus, or Duv=0.000.
Figure 19B:
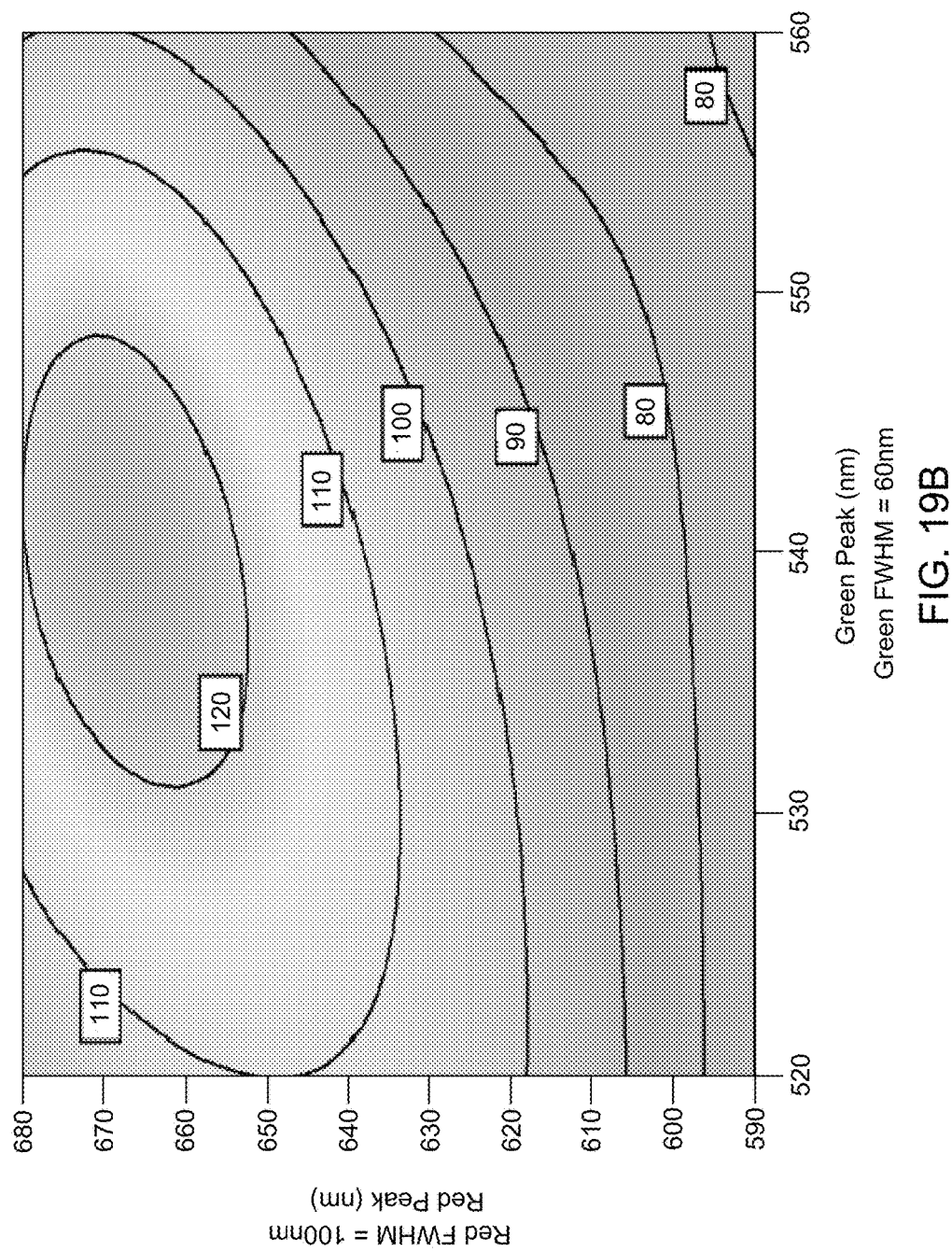
Figure 19C:
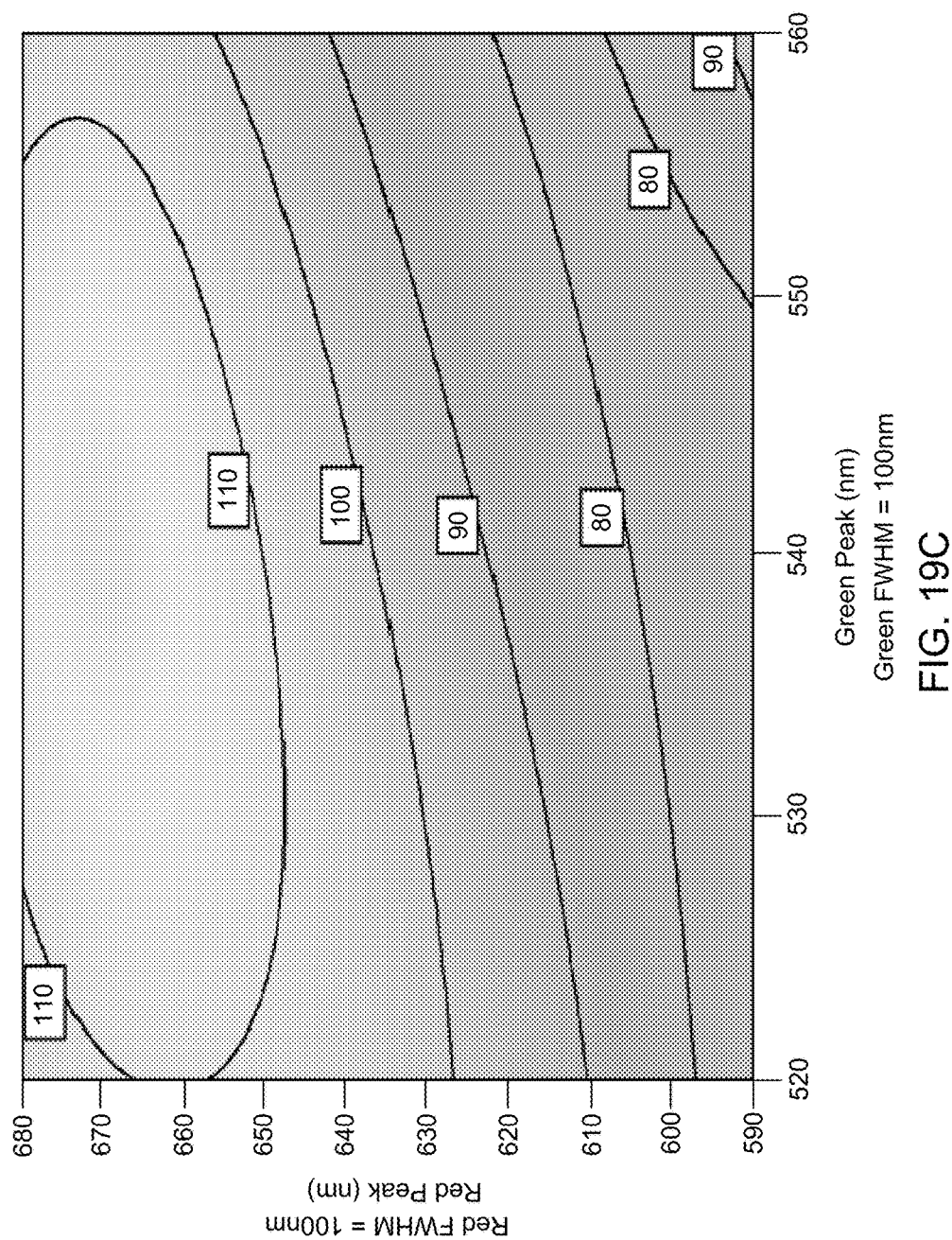
Figure 19D:
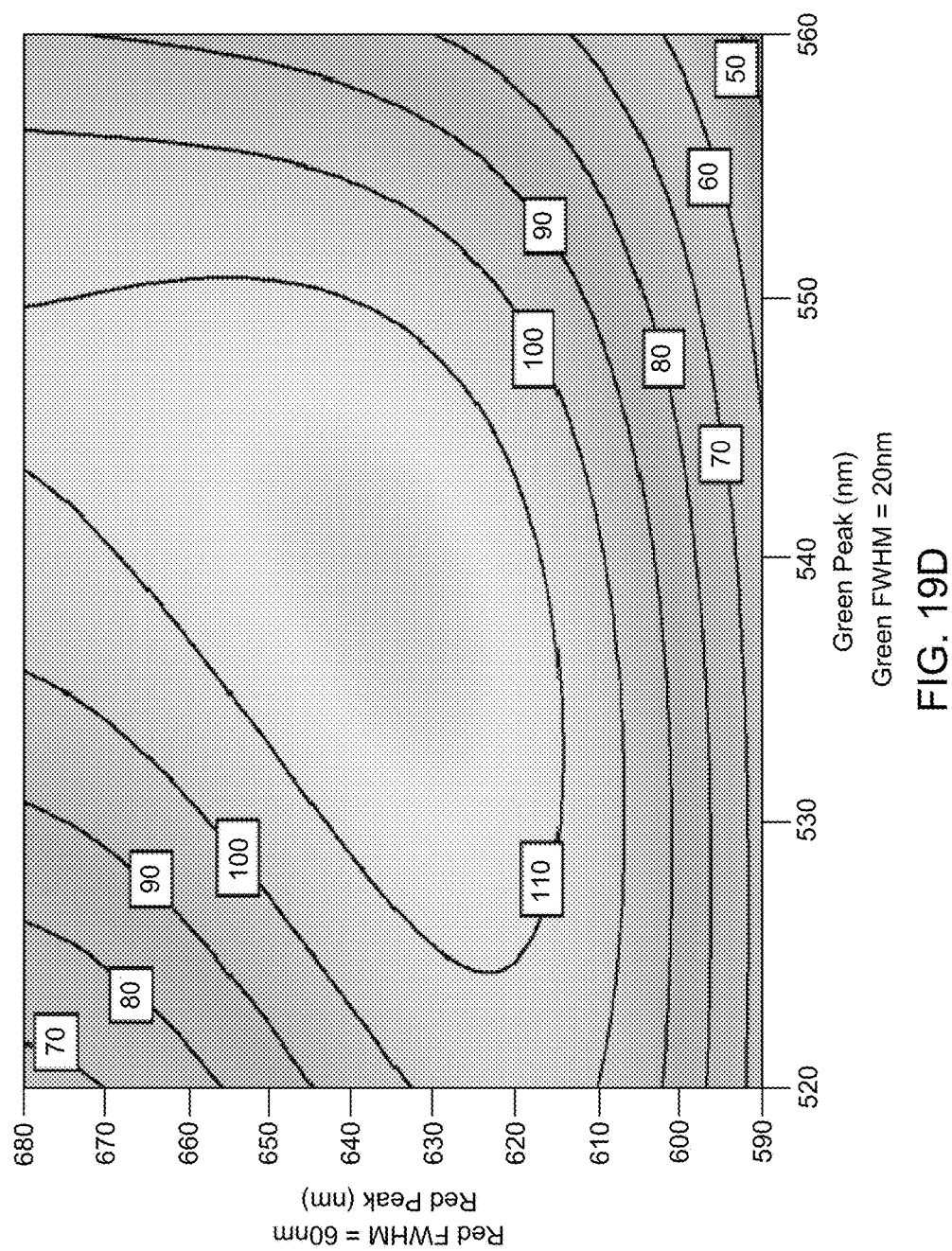
Figure 19E:
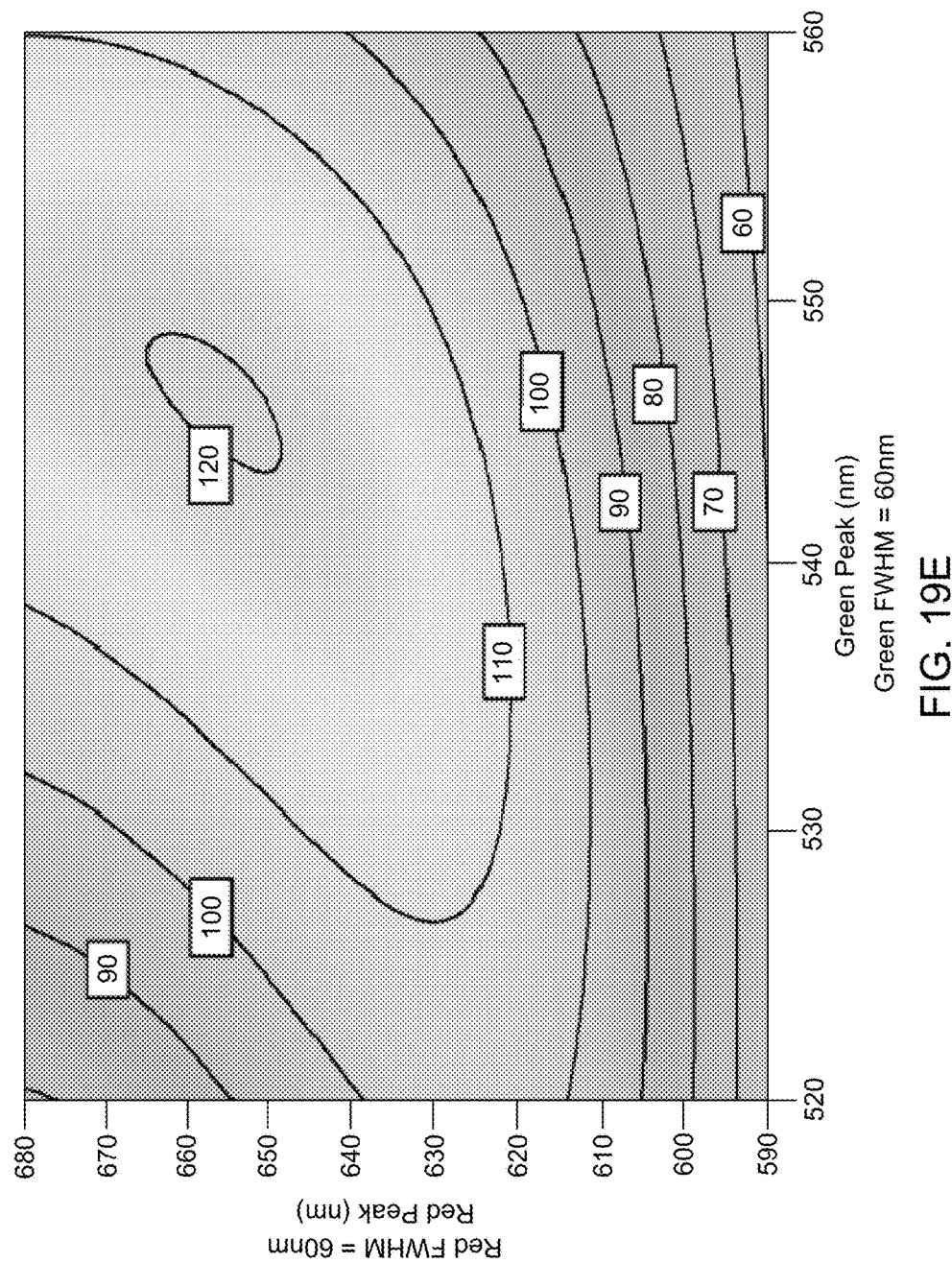
Figure 19F:
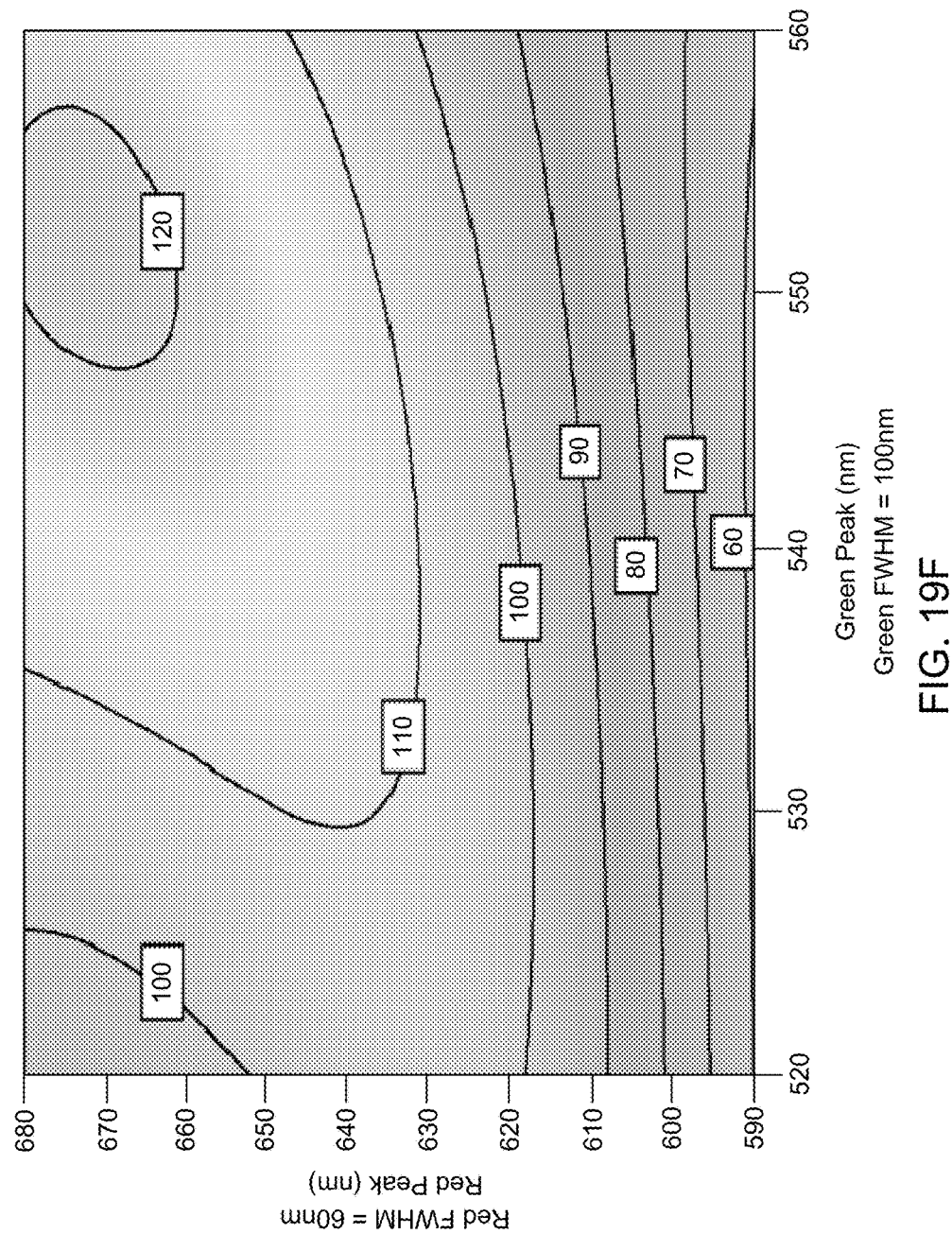
Figure 19G:
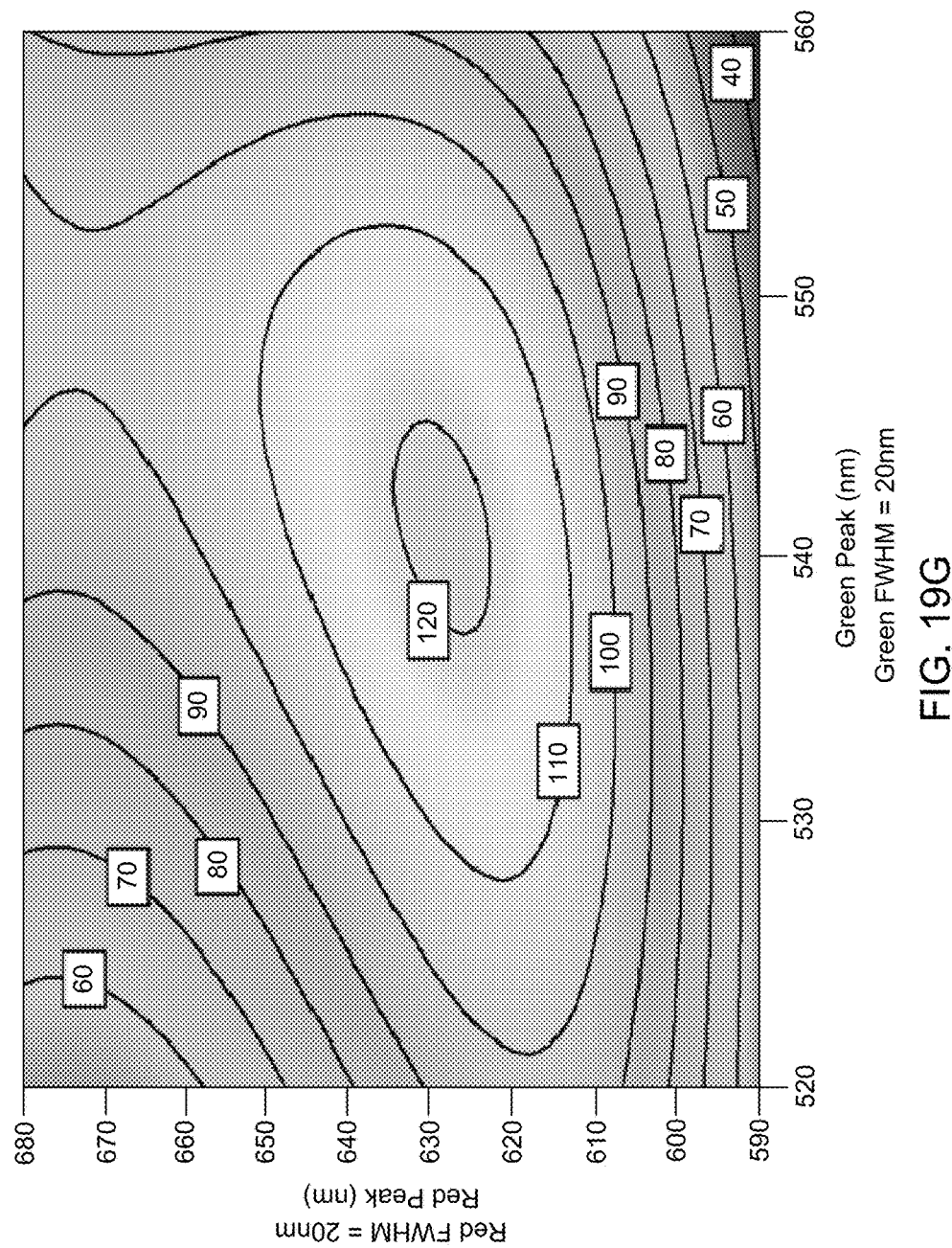
Figure 19H:
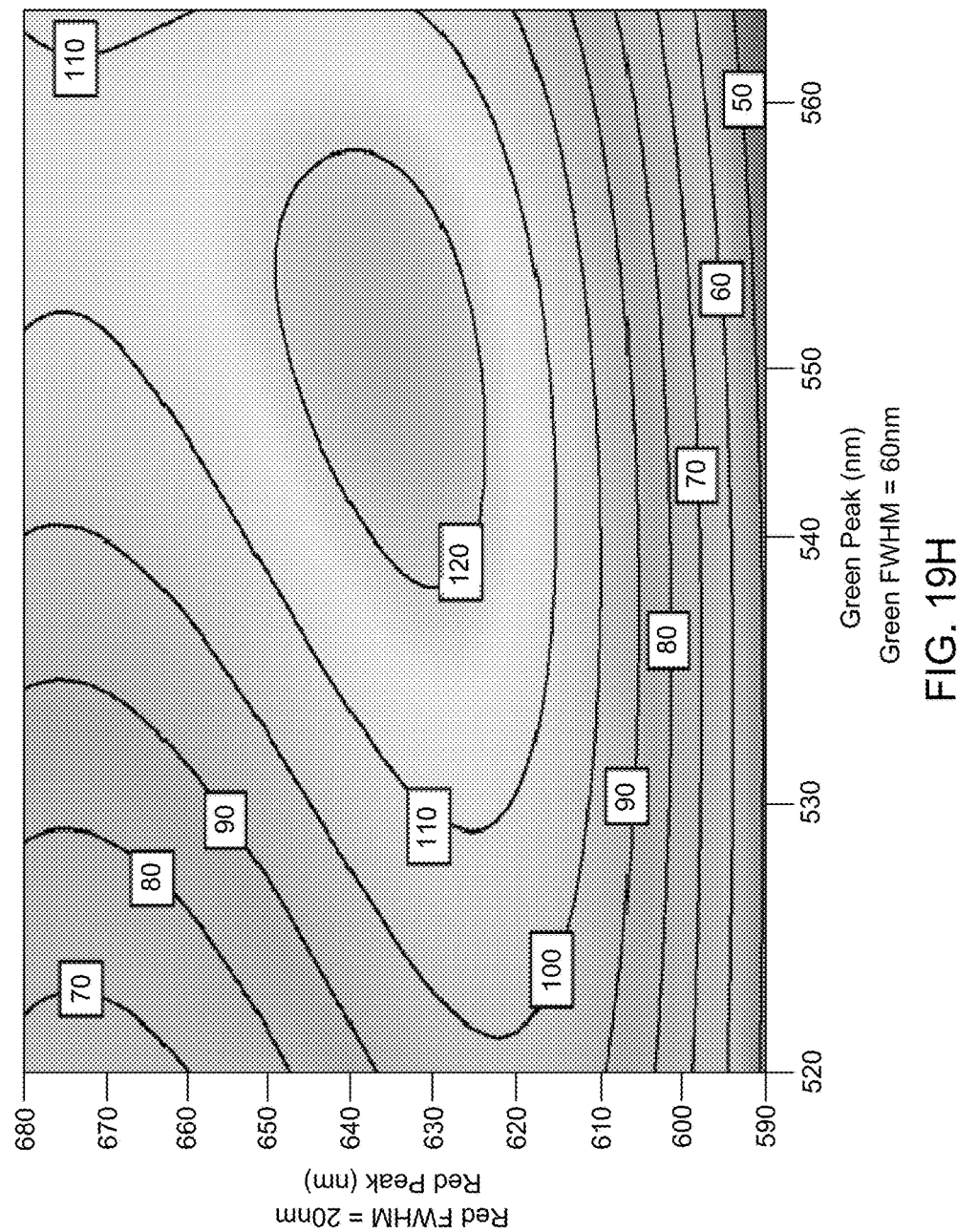
Figure 19I:
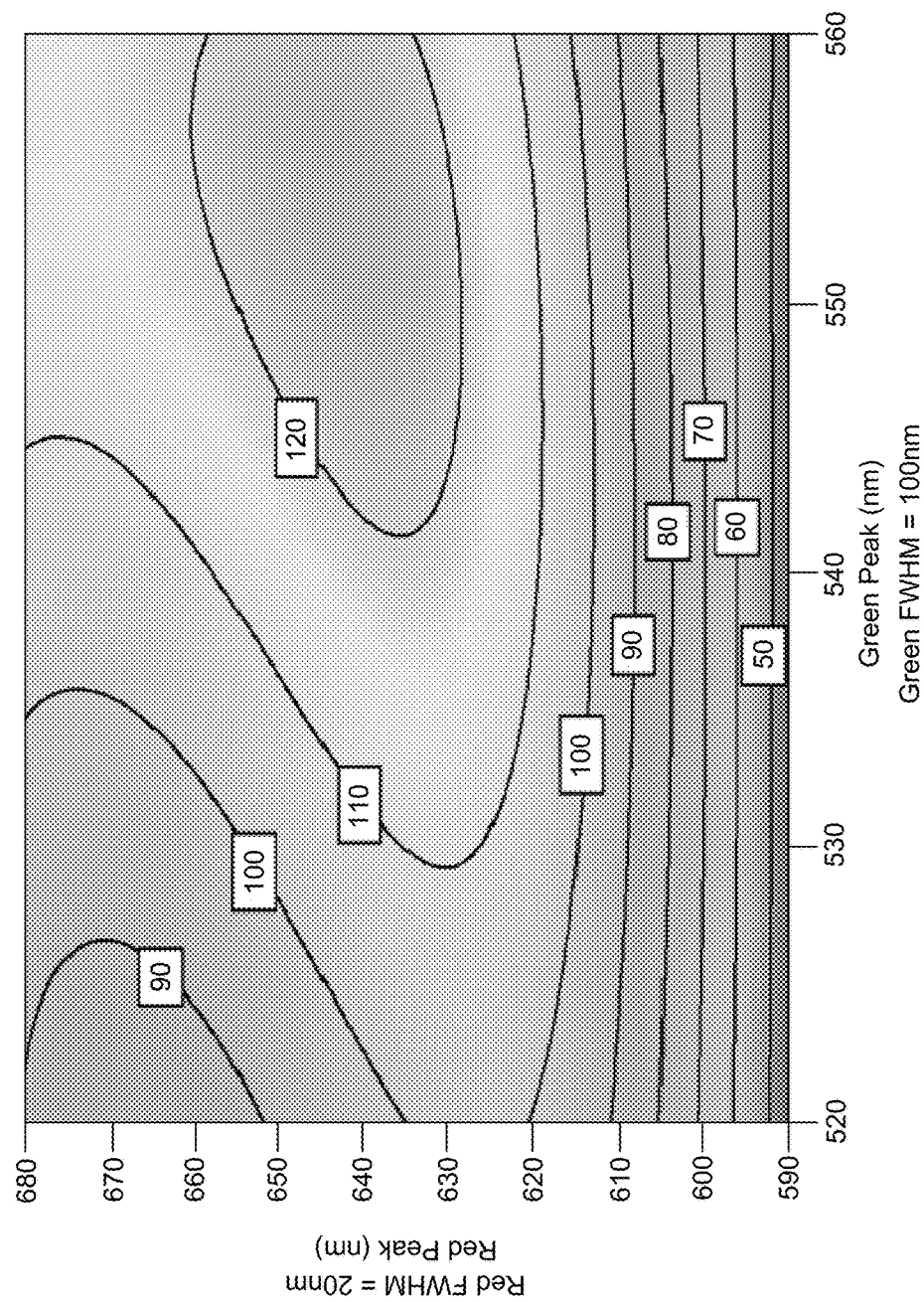
Figure 20A:
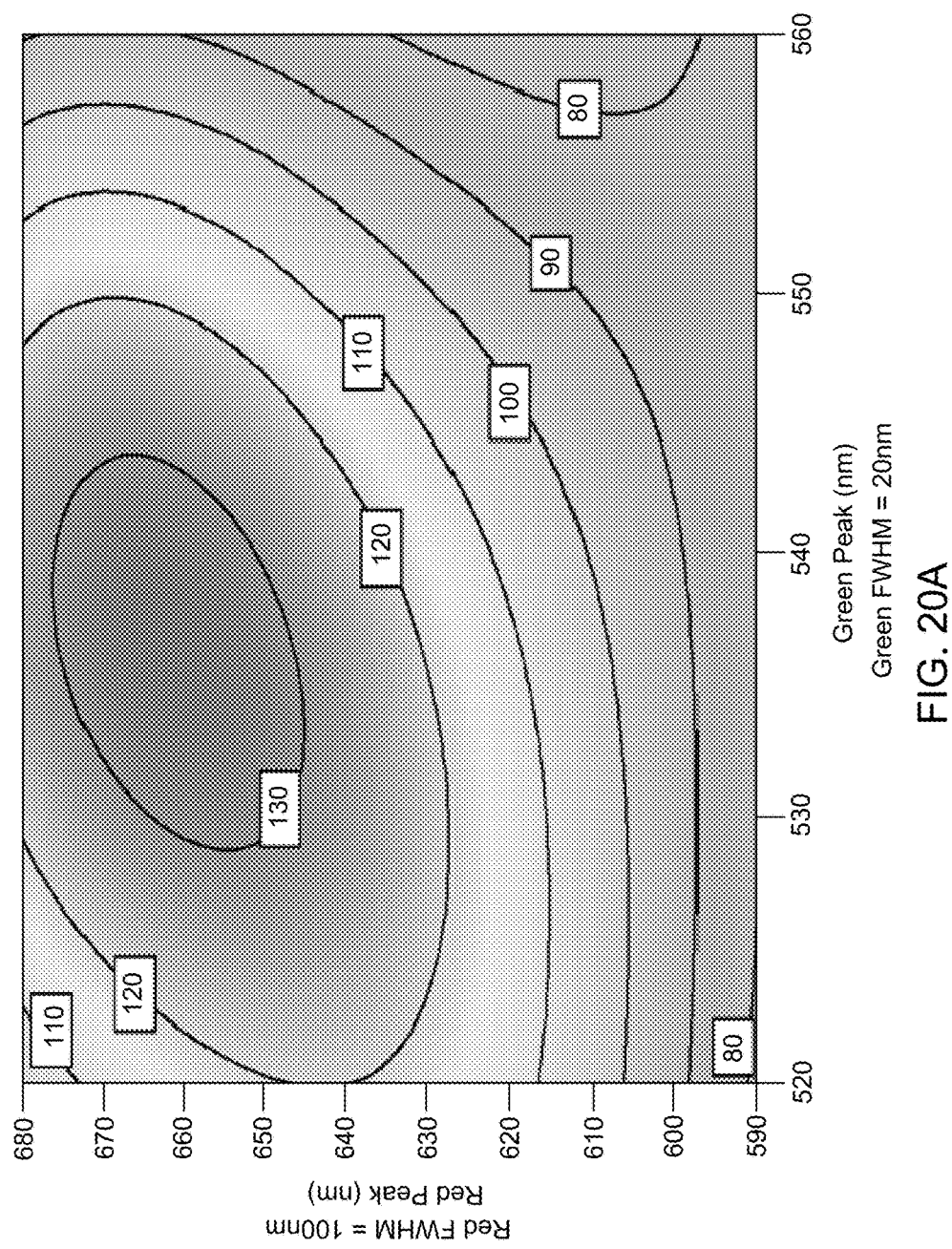
FIG. 20 displays the 3×3 contour plot grid of LPI versus green and red widths and peak wavelengths associated for a color point halfway between the blackbody locus and the "White Line", or Duv=−0.005.
Figure 20B:
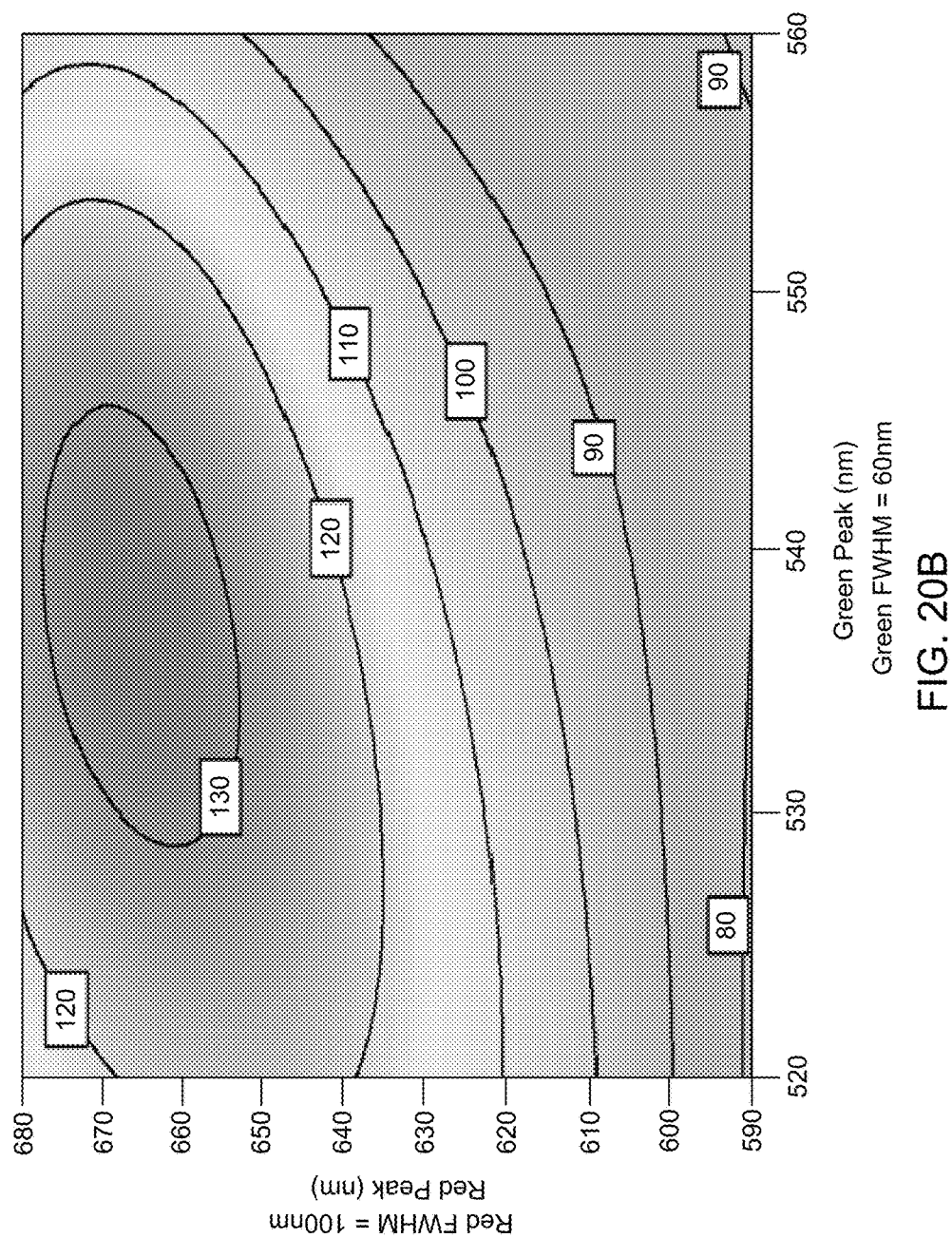
Figure 20C:
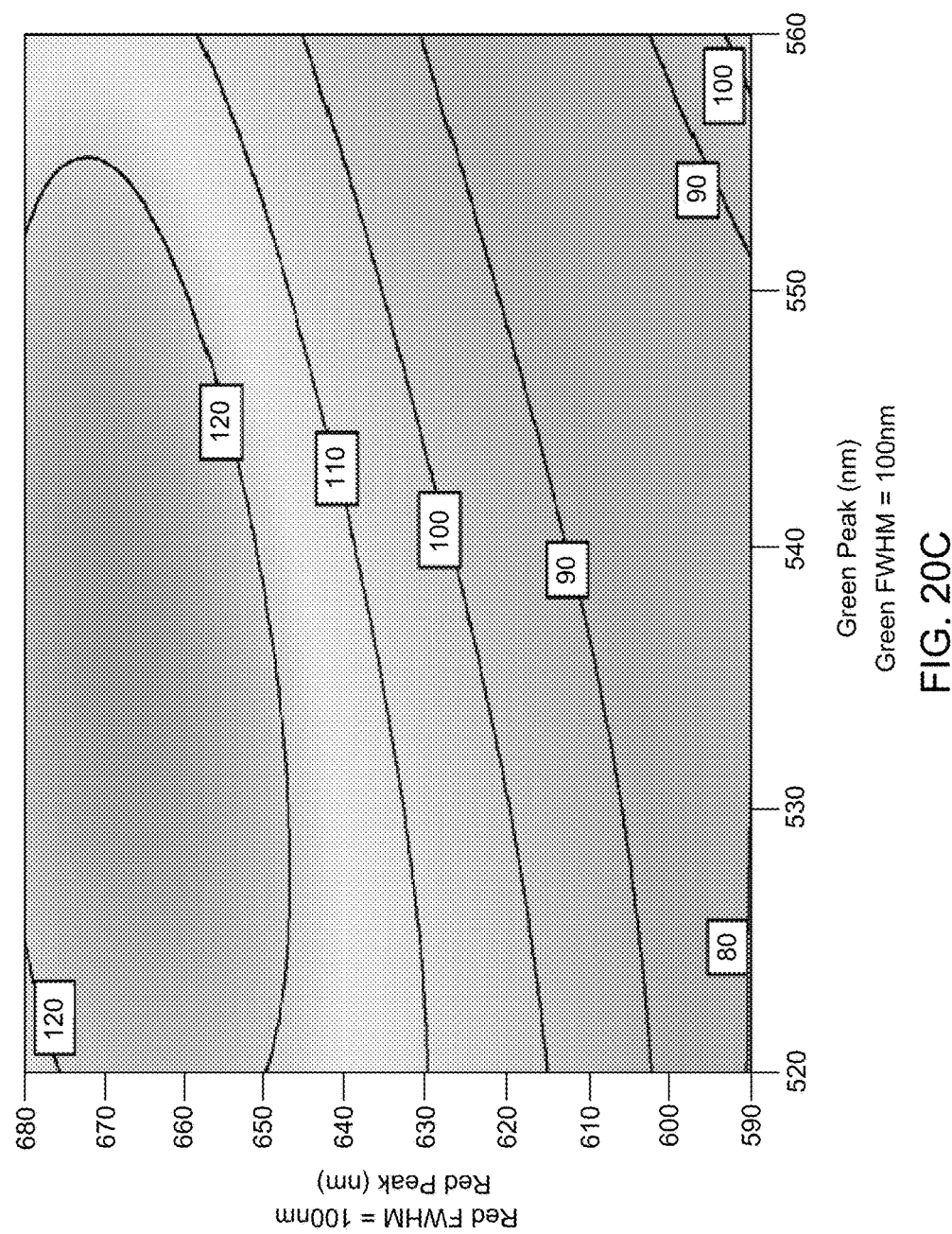
Figure 20D:
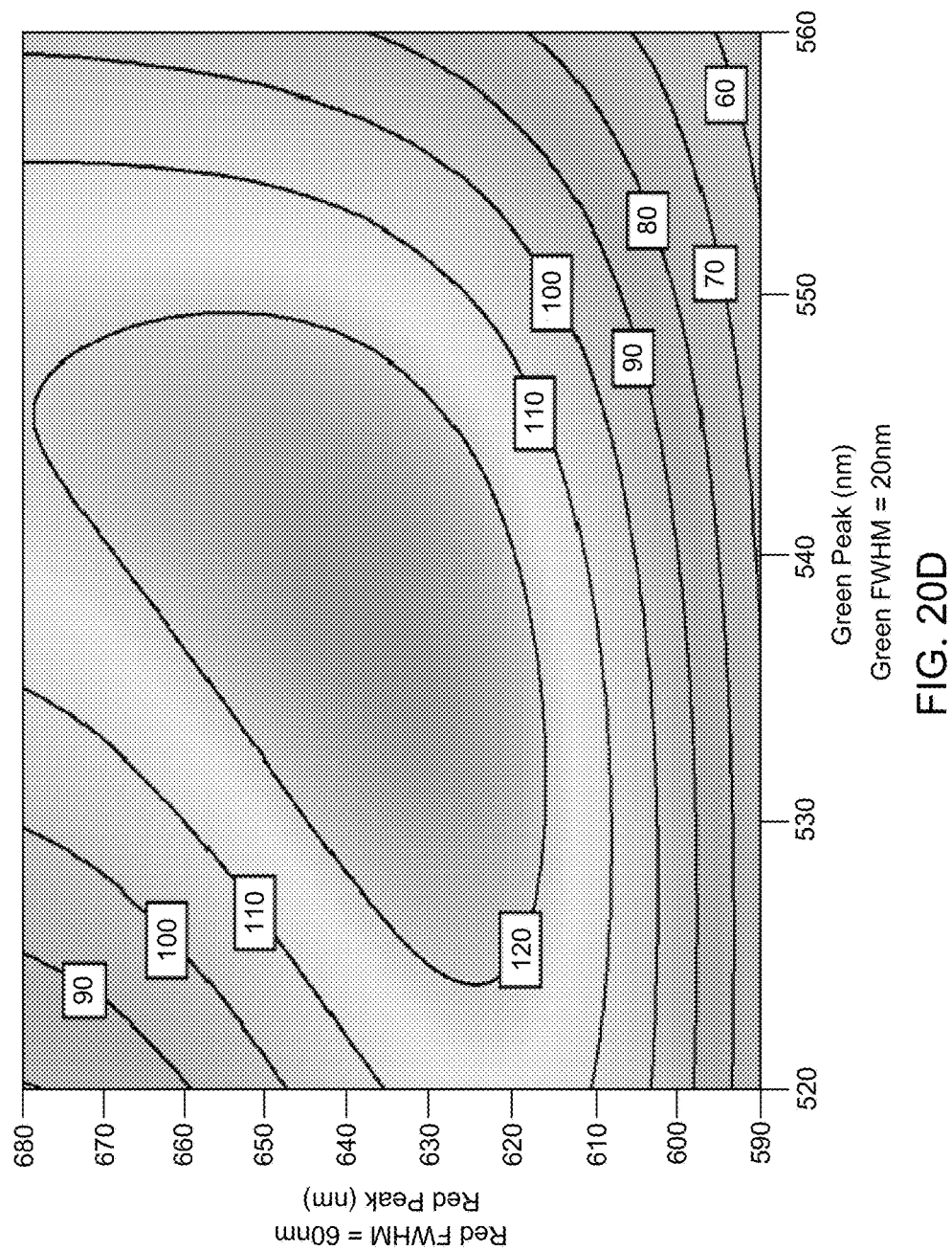
Figure 20F:
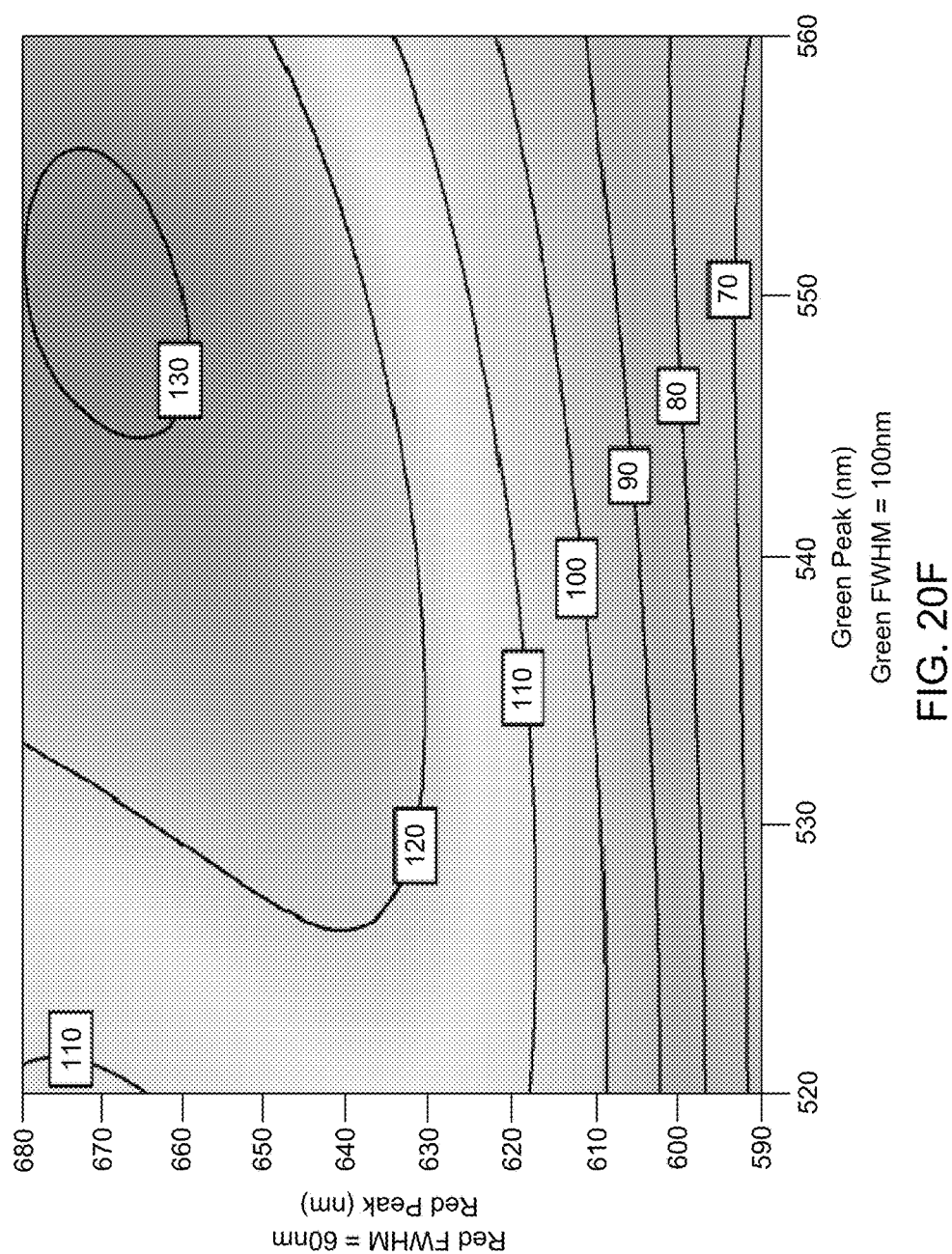
Figure 20G:
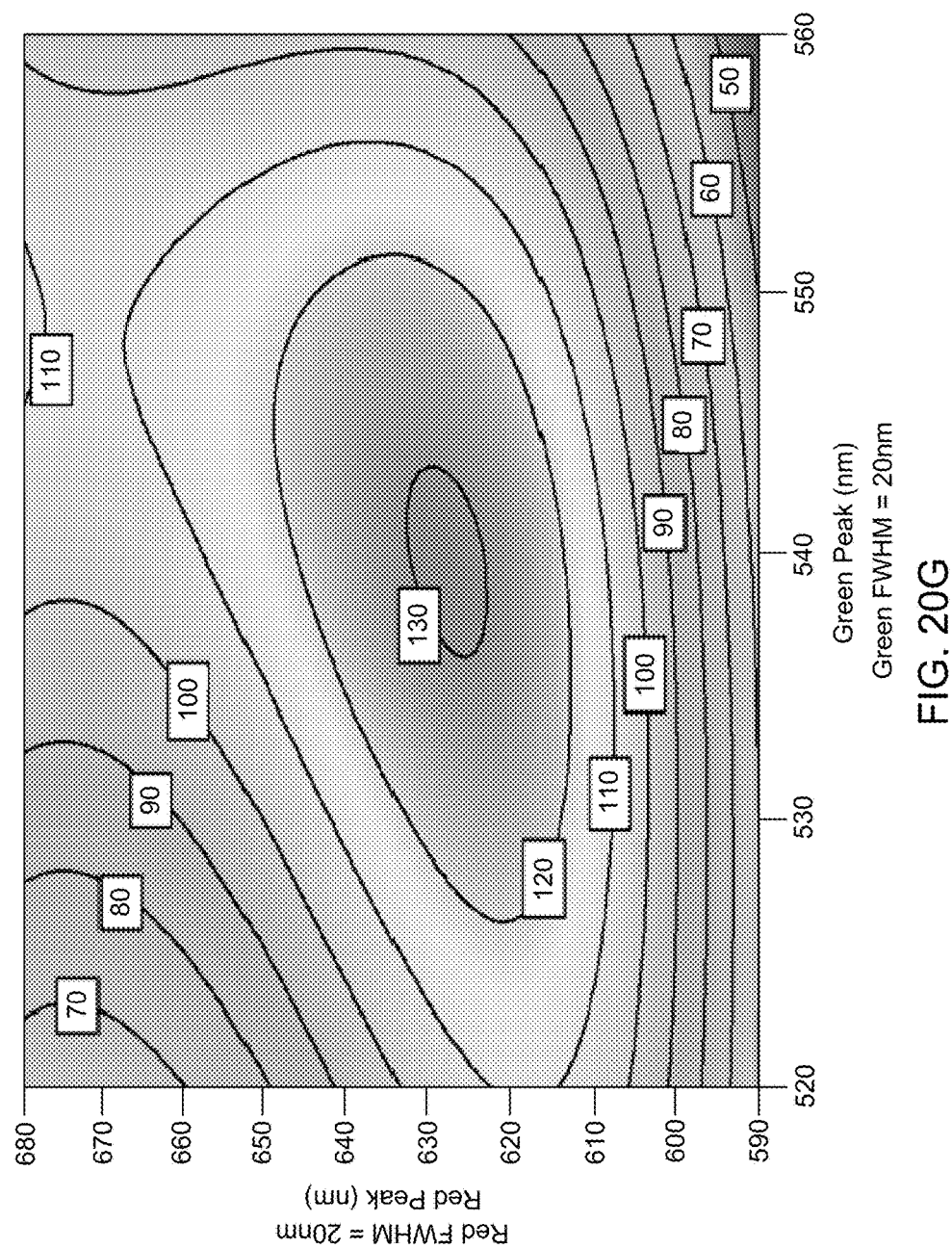
Figure 20H:
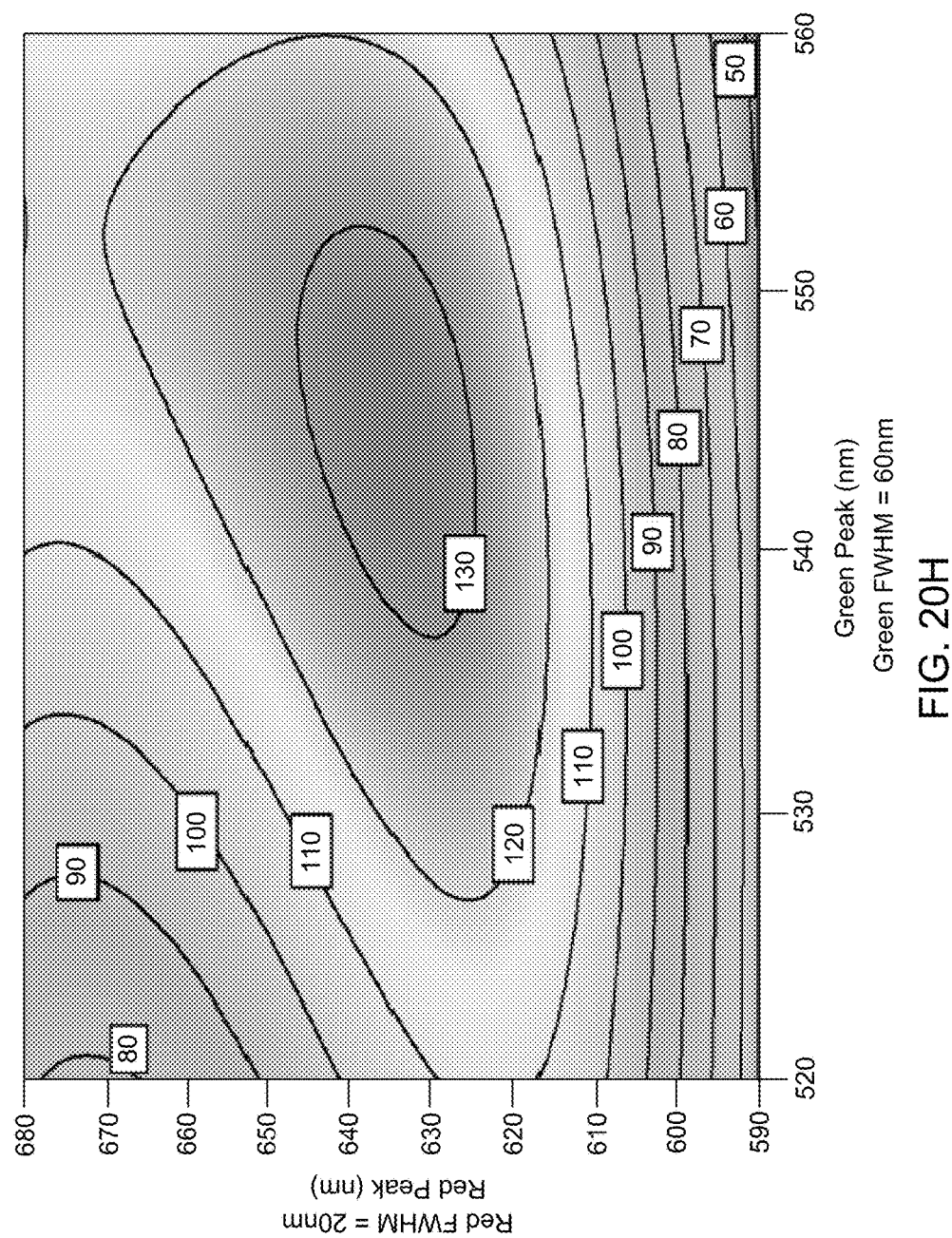
Figure 20I:
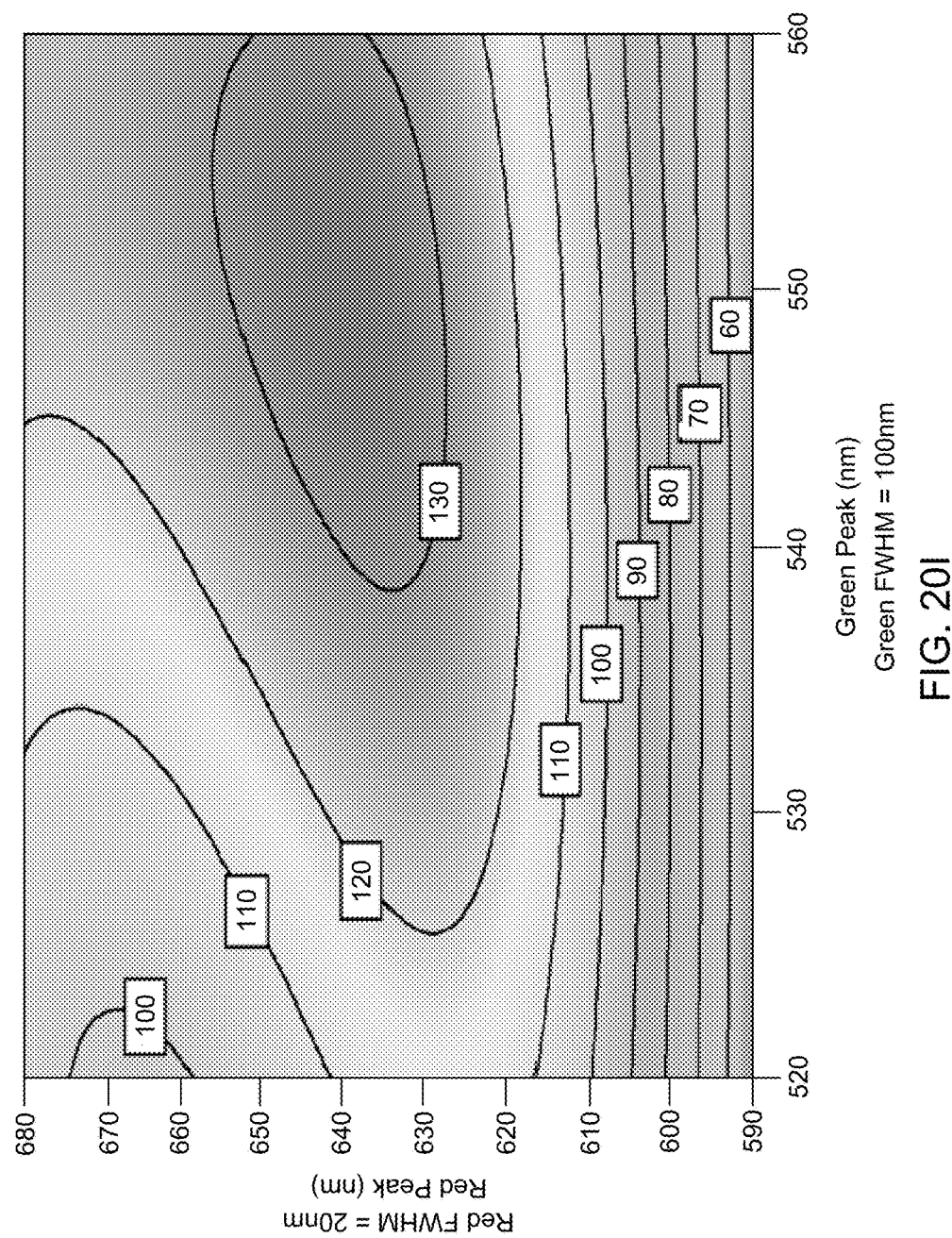
Figure 21A:
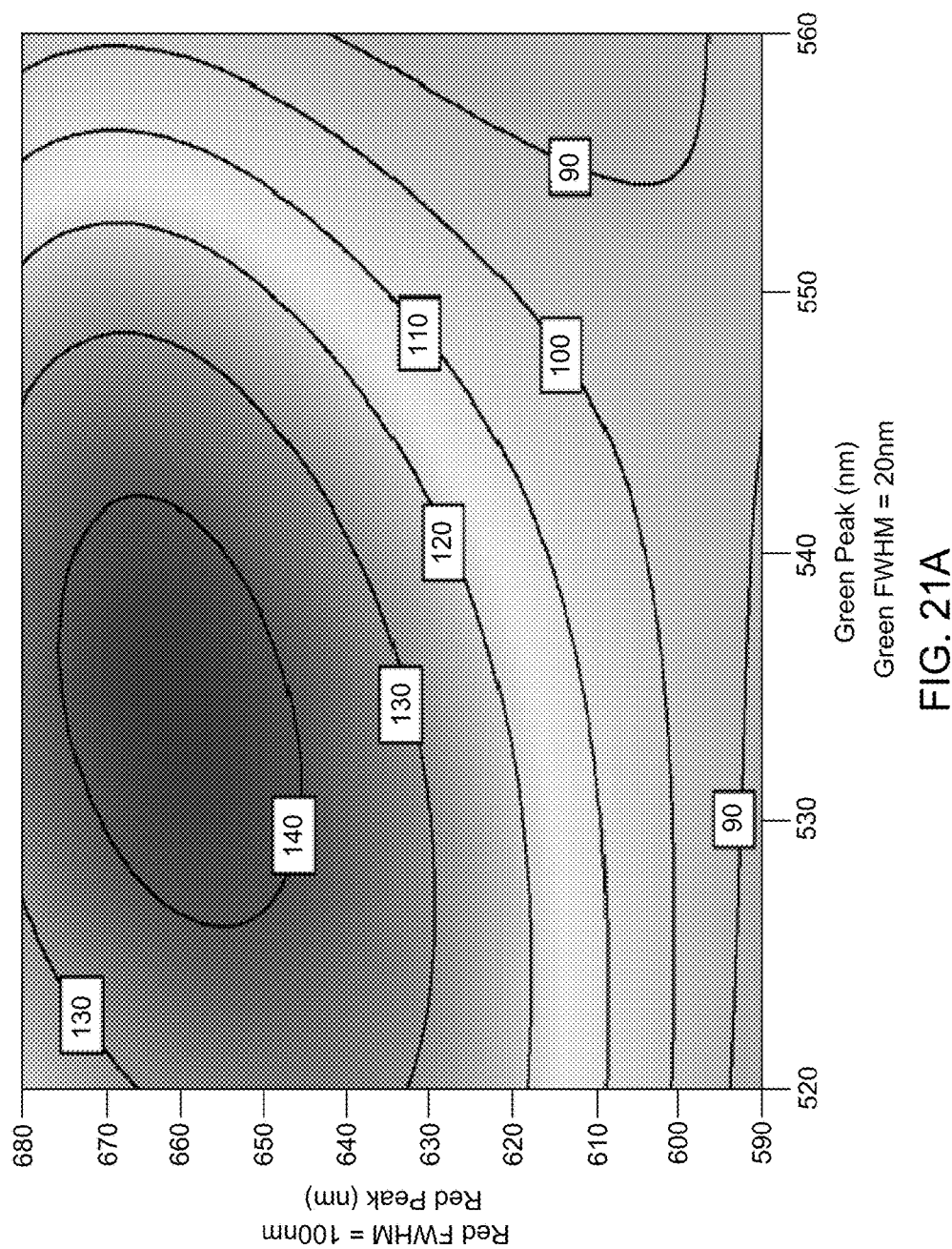
FIG. 21 displays the 3×3 contour plot grid of LPI versus green and red widths and peak wavelengths associated with a color point near the "White Line", or Duv=−0.010.
Figure 21B:
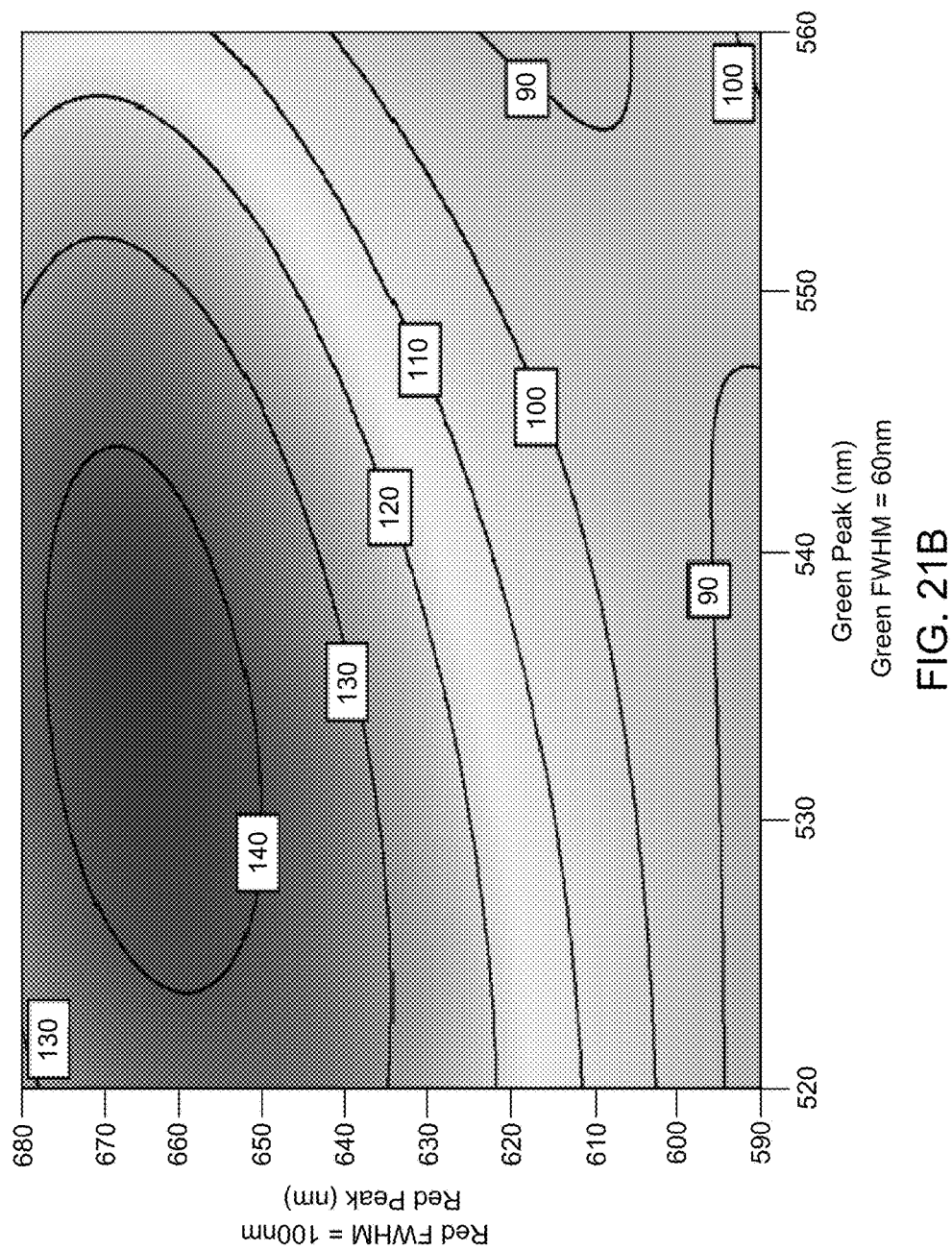
Figure 21C:
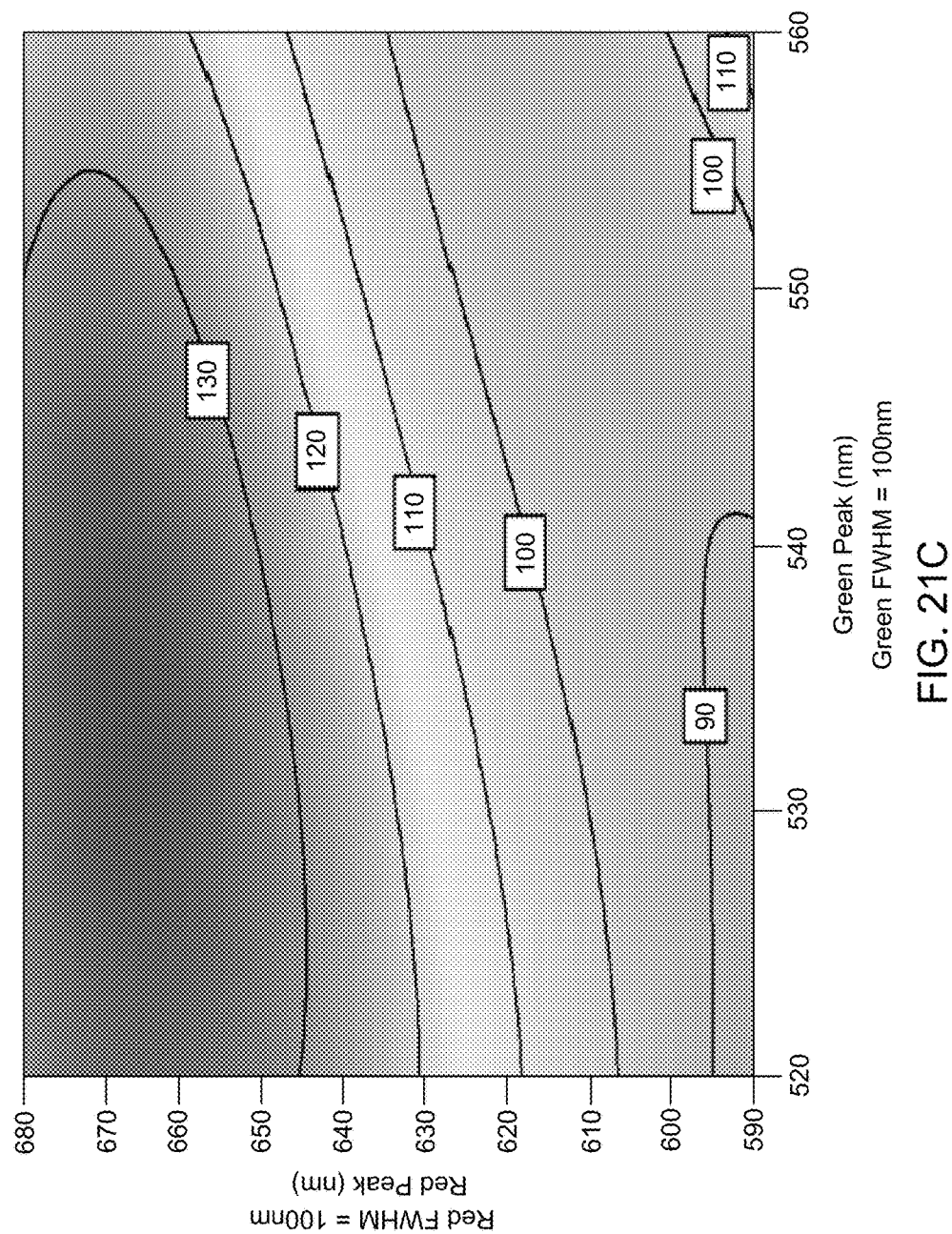
Figure 21D:
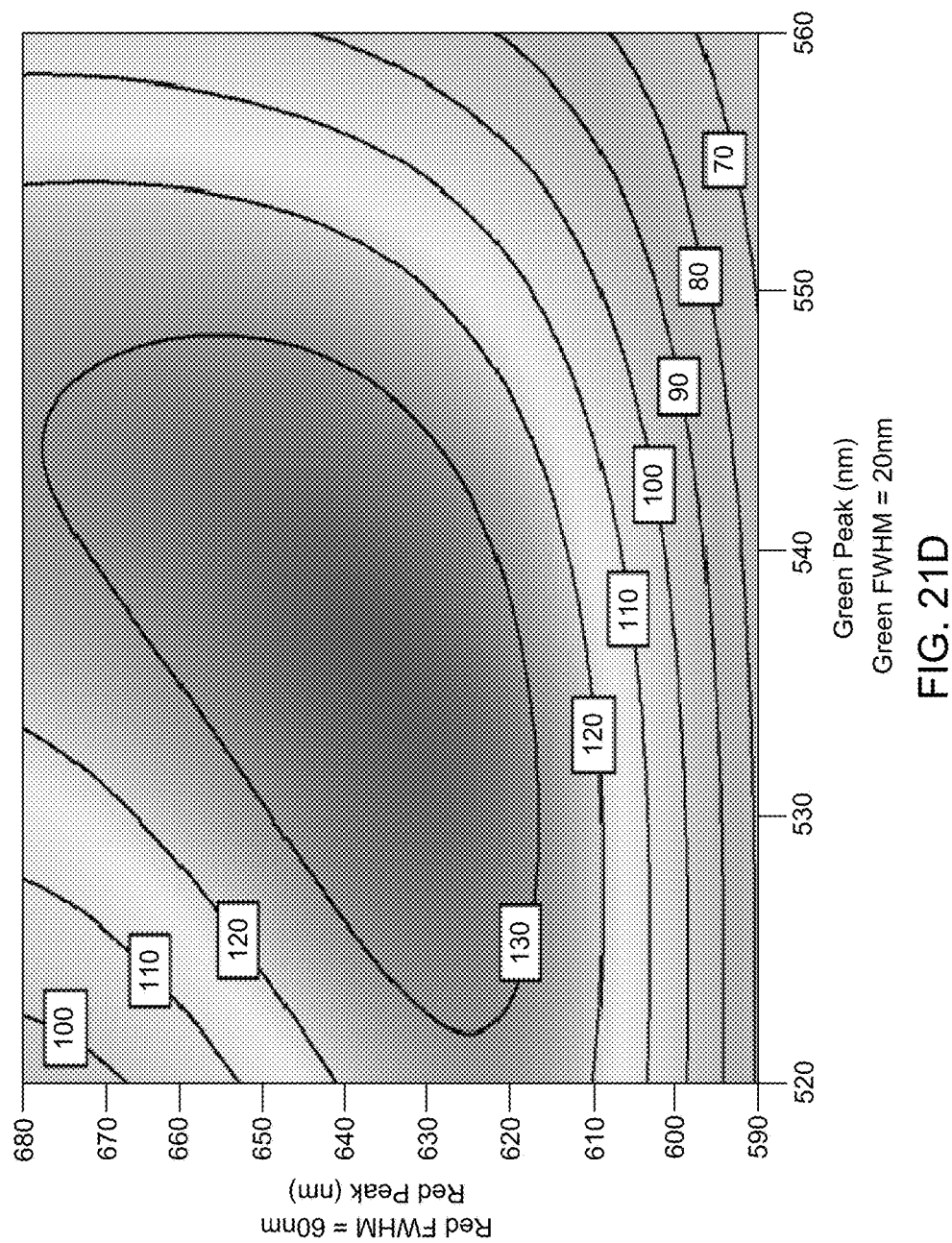
Figure 21E:
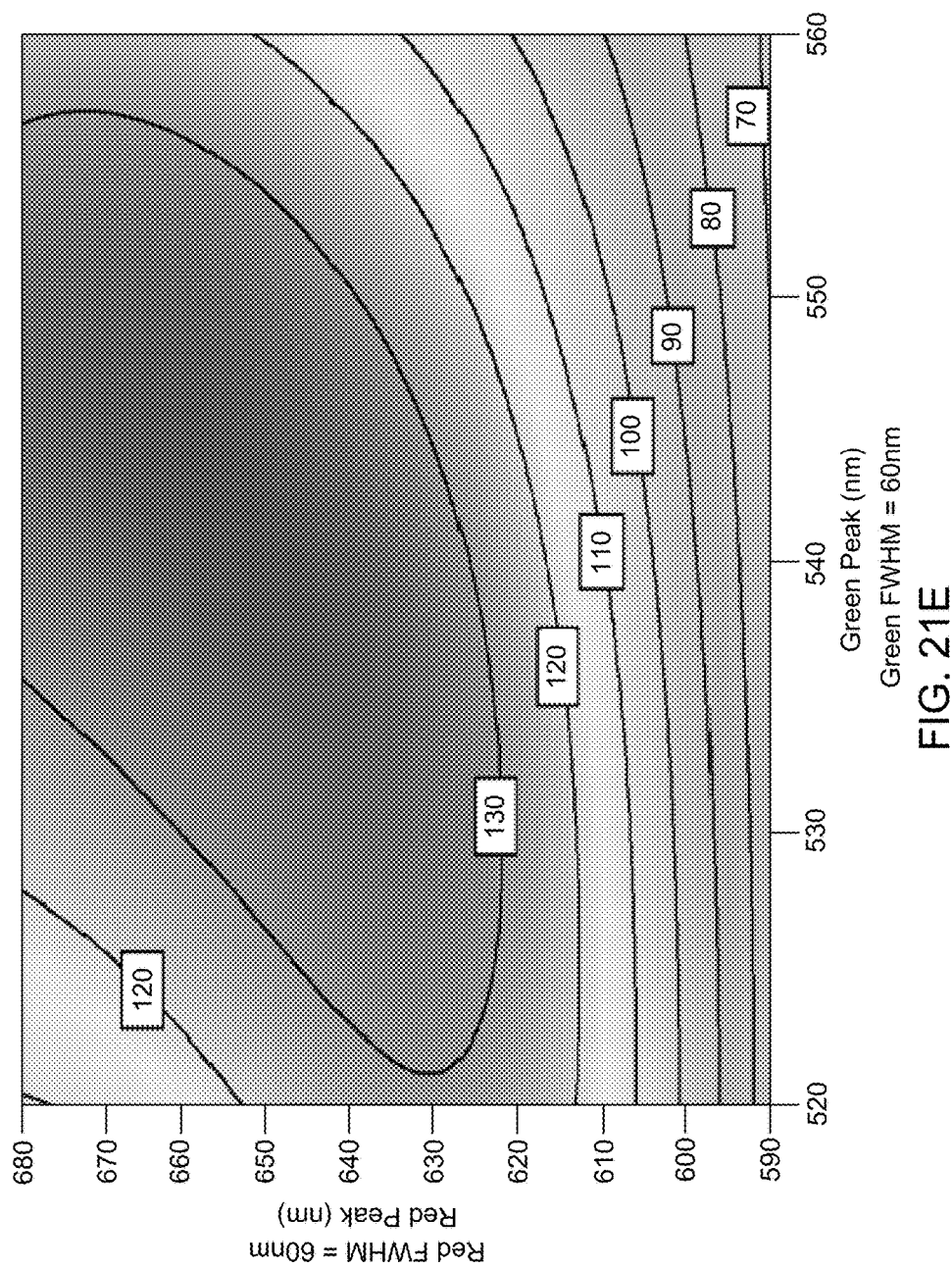
Figure 21F:
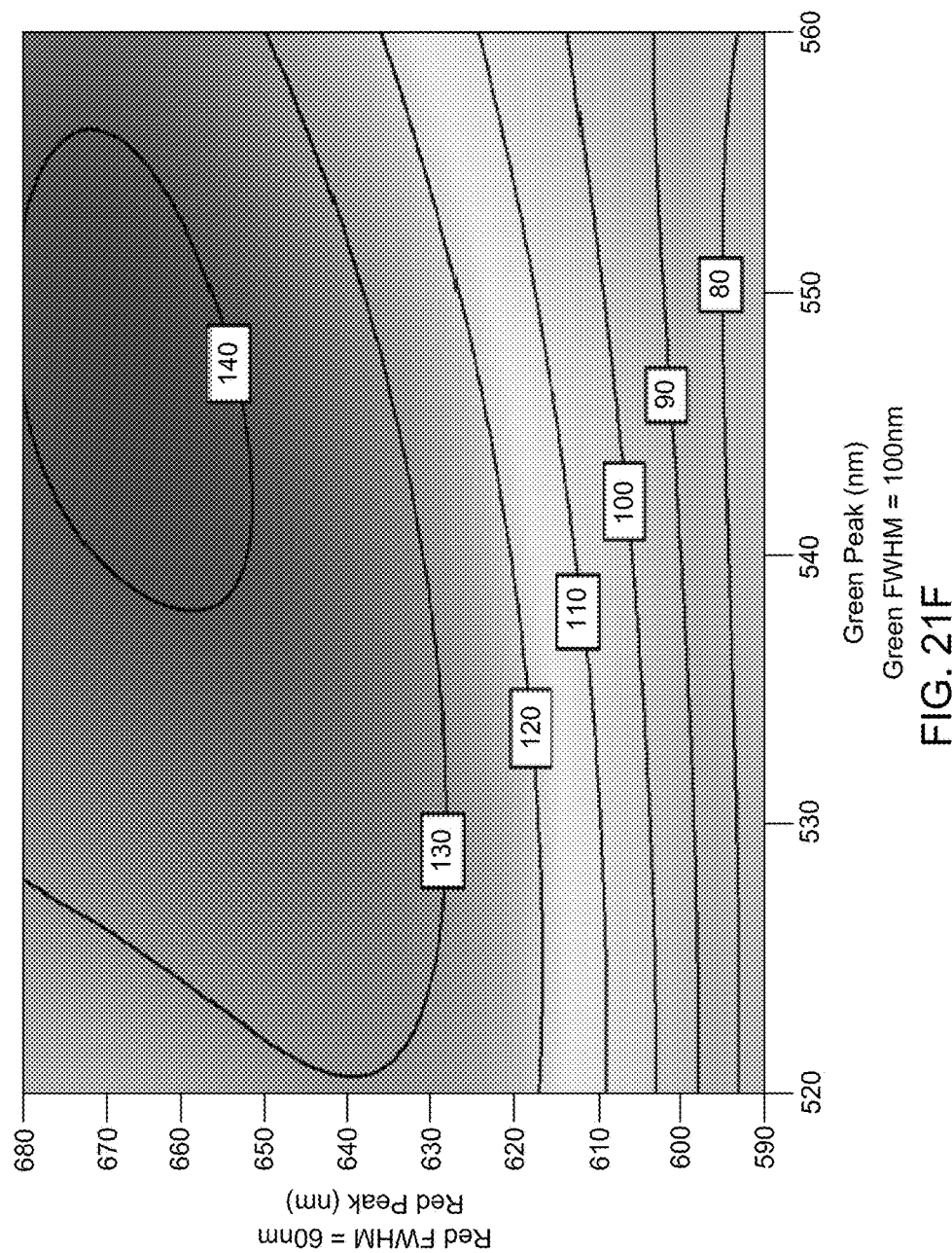
Figure 21G:
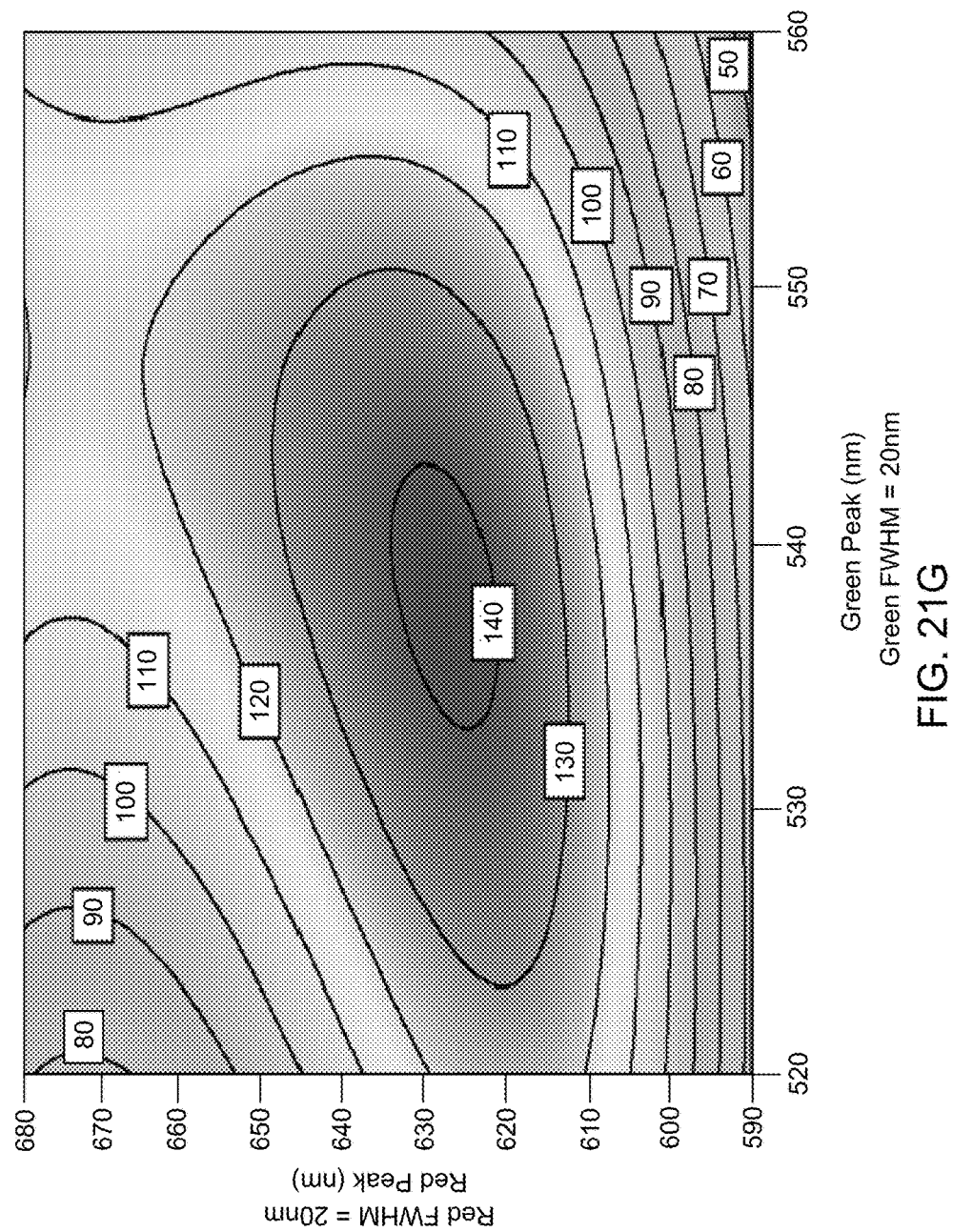
Figure 21H:
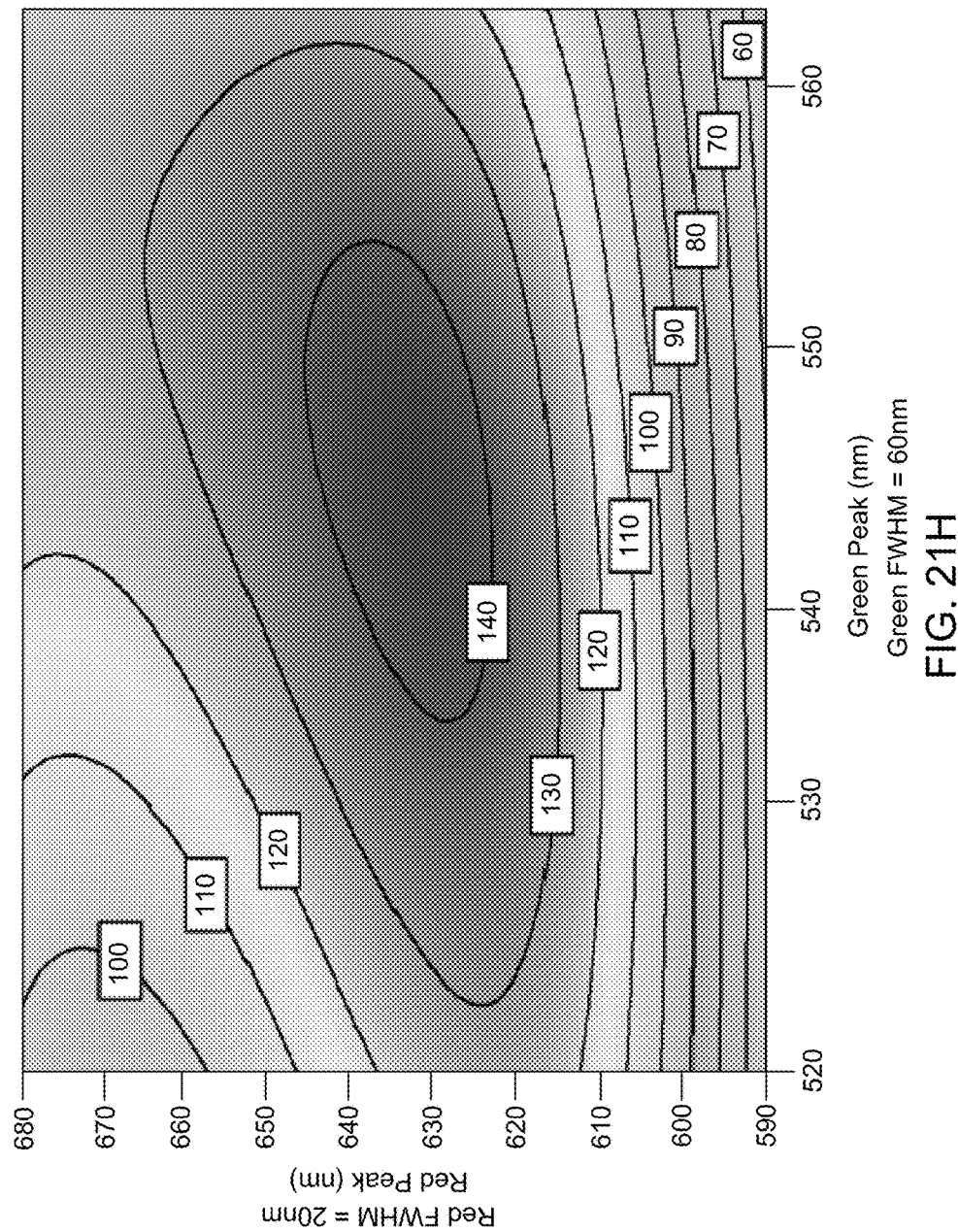
Figure 21I:
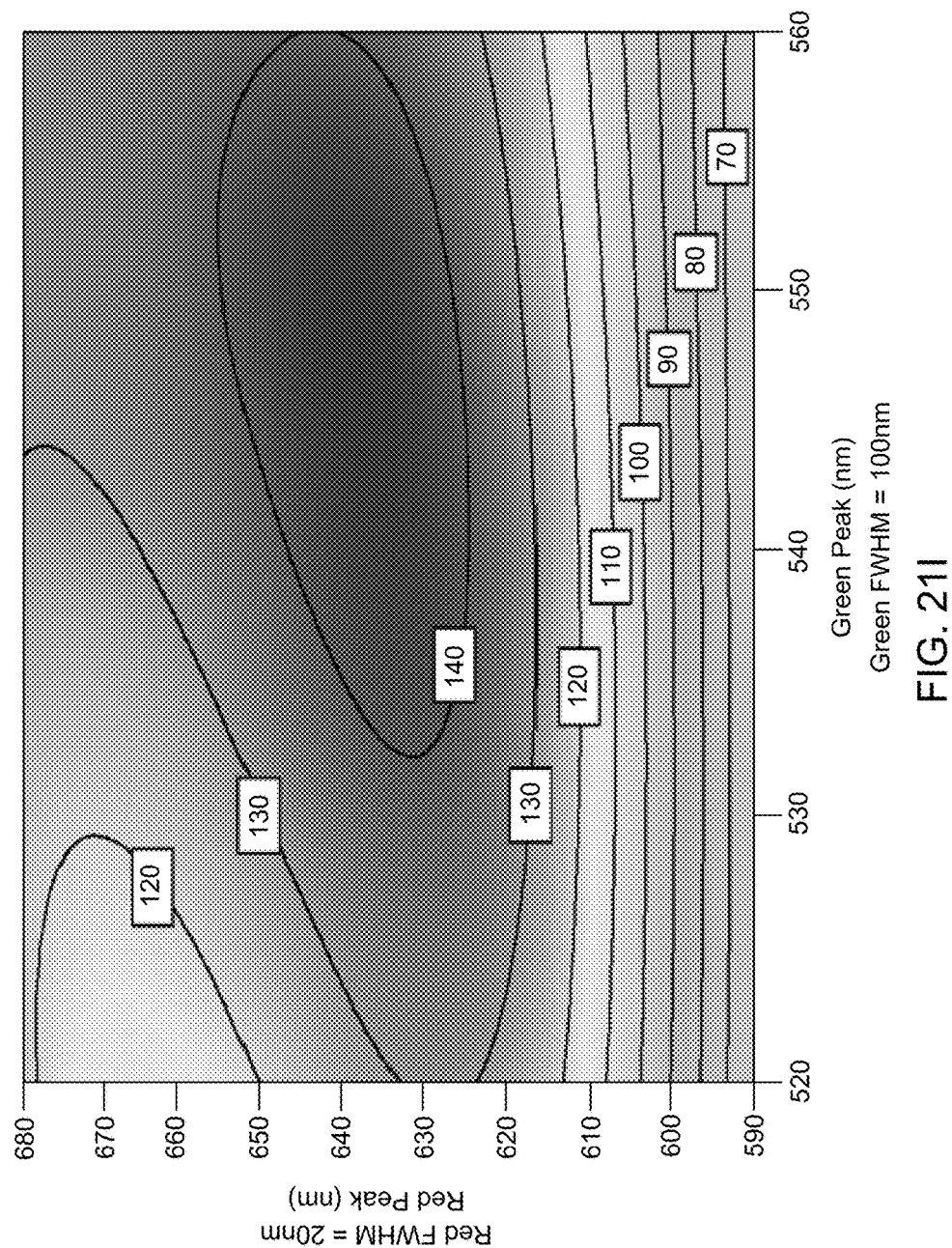

A notable outcome of the DOE as described above involves the relationship between LPI and CRI. For the color point near the "White Line" (Duv=−0.010), CRI values were calculated for all 4050 spectra and compared with their respective LPI values. FIG. 18 plots the LPI values versus the CRI values for these 4050 spectra at Duv=−0.010 and CCT=2700 K. In general, the saturation level of the spectra increases in a counter-clockwise manner. For spectra that render colors under-saturated, both CRI and LPI will be low, and will accordingly rise with increases in saturation. CRI will be maximized when colors appear similar to those of the reference illuminant, and will begin decreasing as saturation is enhanced further. LPI, however, continues to rise with saturation and peaks with CRI around 60. LPI then begins to fall as the spectra enter a region of over-saturation. As a result of this relationship, optimization for high CRI inherently limits the design for high LPI values, as CRI and LPI are inversely related for enhanced saturation levels beyond the reference illuminant.

In order to illustrate the impact of green peak wavelength, green FWHM, red peak wavelength, red FWHM, and Duv level on LPI, a series of contour plots were generated as shown in FIG. 19, FIG. 20, and FIG. 21. Each individual contour plot shows LPI contours in increments of 10 for red peak wavelength versus green peak wavelength. Within each of FIGS. 19, 20 and 21, the contour plots are broken into a 3×3 grid (with each contour plot labeled "a" through "i") where green FWHM varies from 20 nm to 60 nm to 100 nm along the horizontal direction and red FWHM varies from 20 nm to 60 nm to 100 nm along the vertical direction. This selection of contour plots was chosen to illustrate the interactions between LPI and red and green FWHM by selecting the lowest, middle, and highest level of FWHM contained in the DOE. FIG. 19 displays the 3×3 contour plot grid associated with a color point on the blackbody locus, or Duv=0.000. FIG. 20 displays the graphs for the same red and green parameters, but for a color point halfway between the blackbody locus and the "White Line", or Duv=−0.005. FIG. 21 displays the graphs for the same red and green parameters, but for a color point at the target Duv level near the "White Line", or Duv=−0.010. These three Duv levels were chosen to illustrate the effect of color point, or Duv, on LPI, and should not be taken as limitations of the application of LPI. Similar contour plots can be presented for a continuum of Duv levels from the blackbody line to the "White Line", with similar trends being realized. Furthermore, similar contour plots can be presented for intermediate values of the red and green FWHM, e.g. at 30, 40, 50, 70, 80, and 90 nm FWHM, in addition to the plots actually presented at 20, 60, and 100 nm FWHM. The 3×3 matrix of contour plots at each of the three Duv locations is a subset of the 9×9 matrix of contour plots that were produced and analyzed in the DOE. The reduced set of 3×3 contour plots was selected to represent the entire 9×9 matrix of plots in order to be concise, and also because the finely-stepped intermediate plots have been found to be smooth interpolations between the coarsely-stepped plots presented in FIGS. 19, 20, and 21. One skilled in the art will recognize the smooth transitions between the plots presented, and understand that the solutions representing all 8100 combinations of red and green emitters are represented therein.

By comparing FIG. 19 contour plots with those of FIG. 20 and FIG. 21, the effect of Duv, or Whiteness, can be seen. The general shapes of the contours remain the same, however the LPI contours increase in value from Duv=0.000 to Duv=−0.005 to Duv=−0.010 (i.e., from a maximum LPI contour of 120 in FIG. 19, to a maximum LPI contour of 130 in FIG. 20, and a maximum LPI contour of 140 in FIG. 21), showing the impact of Whiteness on LPI. By going from Duv=0.000 to Duv=−0.010, the Whiteness component of the LPI equation increases from 0 to 1, resulting in a 19 point increase in LPI based on Equation (7). In general, the optimal value for maximizing LPI in each contour plot experiences a very slight reduction in green peak wavelength (by roughly 5 nm), while the red peak wavelength remains relatively unchanged. This helps to illustrate the relatively orthogonal nature of Whiteness and Color Appearance as the Duv level, and hence Whiteness, has little effect on the shape of the contour plots and optimal green and red component characteristics, which drive the Color Appearance.

Within each of FIG. 19, FIG. 20, and FIG. 21, the effect of the green component can be seen. In general, particularly for middle to low FWHM levels for the red component (contour plots "d" through "i"), a wider green component leads to a higher optimal green peak wavelength. Green components with a higher FWHM also lead to higher attainable LPI values and larger optimal regions within a given contour. For example, as can be seen in FIG. 21 (contour plots "g" to "i"), the region within the LPI=140 contour grows substantially from a green FWHM of 20 nm (g) to a green FWHM of 100 nm (i), particularly in the horizontal direction. This creates greater stability within a design when using green components with a larger FWHM as the LPI value is not as sensitive to the green peak wavelength. However, for wide red components, with red FWHM=100 nm as seen in plots "a" to "c", the effect of the green FWHM does not have the same effect. With a broad red component, increasing the green FWHM to high levels reduces the maximum LPI attainable as some of the distinction between the red and green components is lost in a broad overlap. For the middle level of red FWHM, as seen in contour plots "d" to "f", increasing the green FWHM also shifts the optimal red peak wavelength to deeper reds, in order to maintain the distinction between the red and green components.

Similarly, FIG. 19, FIG. 20, and FIG. 21 illustrate the effect of the red component on LPI. Especially for middle to low FWHM levels (contour plots "d" to "i"), the LPI values are highly sensitive to the red peak wavelengths, as seen with the close grouping of contours in the vertical direction, particularly so for red peak wavelengths at 620 nm and below. For example, as can be seen in FIG. 21(i), increasing the red peak wavelength from 590 nm to 620 nm can result in an increase in LPI from 60 to 130. Beyond 620 nm, LPI is not as sensitive to the red peak wavelength. In general, as the red FWHM increases, the optimal red peak wavelength also increases, in order to maintain separation between the red and green components.

Figure 22:
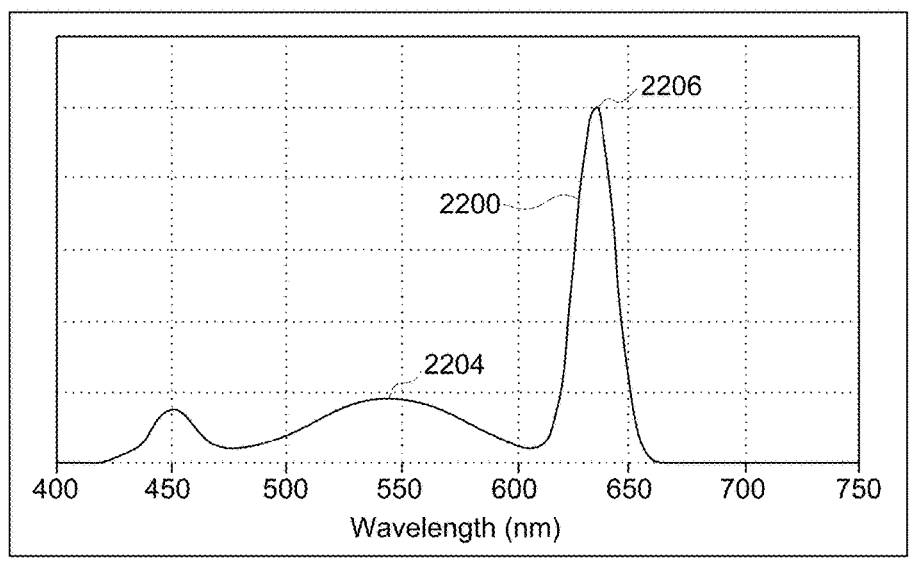
FIG. 22 includes a graph of the spectral power distribution (SPD) of the optimal three-component spectrum achieving the highest LPI value.
Figure 23A:
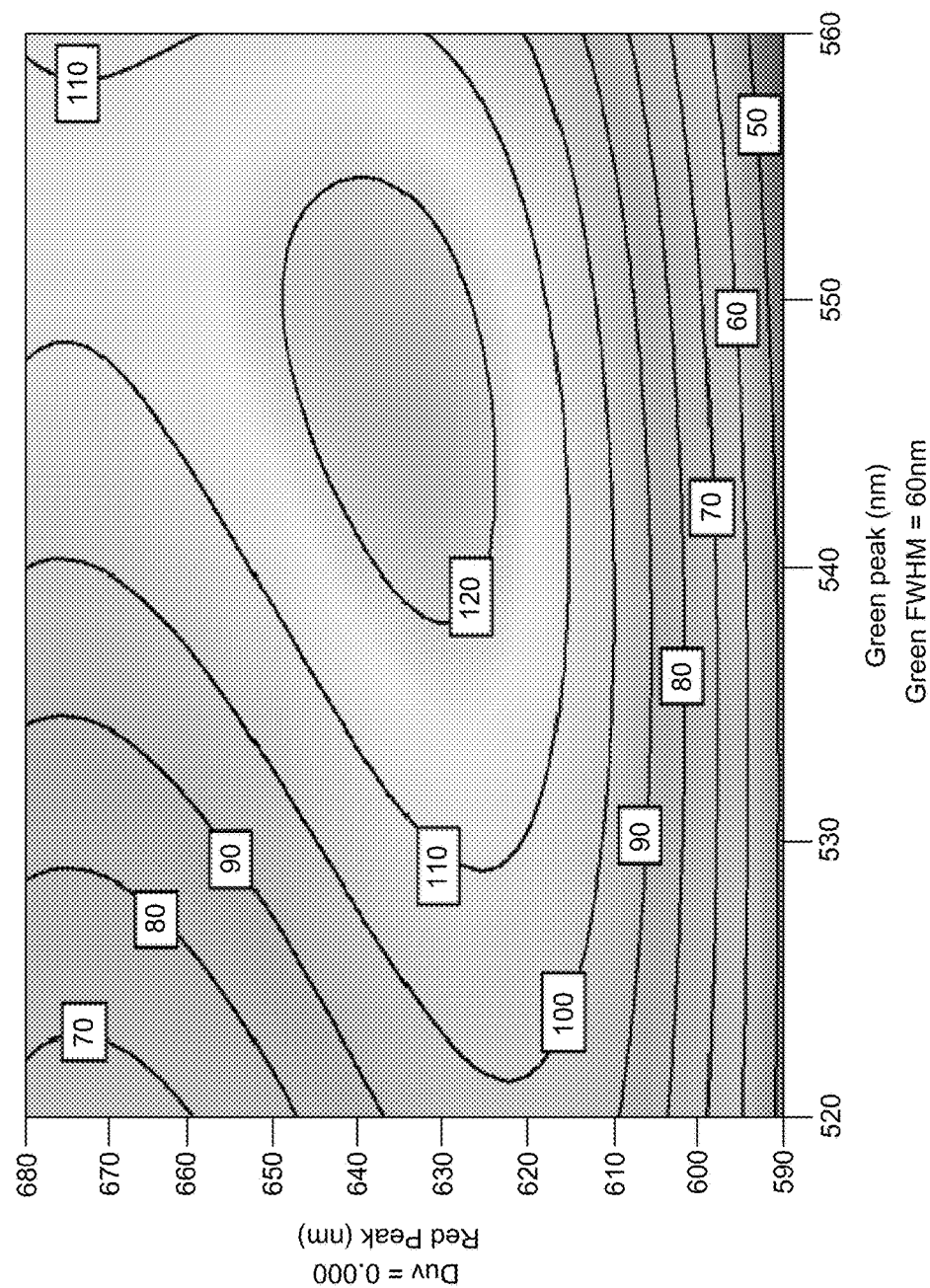
FIG. 23 displays the 3×3 contour plot grid of LPI versus green widths, green peak wavelengths, red peak wavelengths, and Duv associated with a BSY+R system.
Figure 23C:
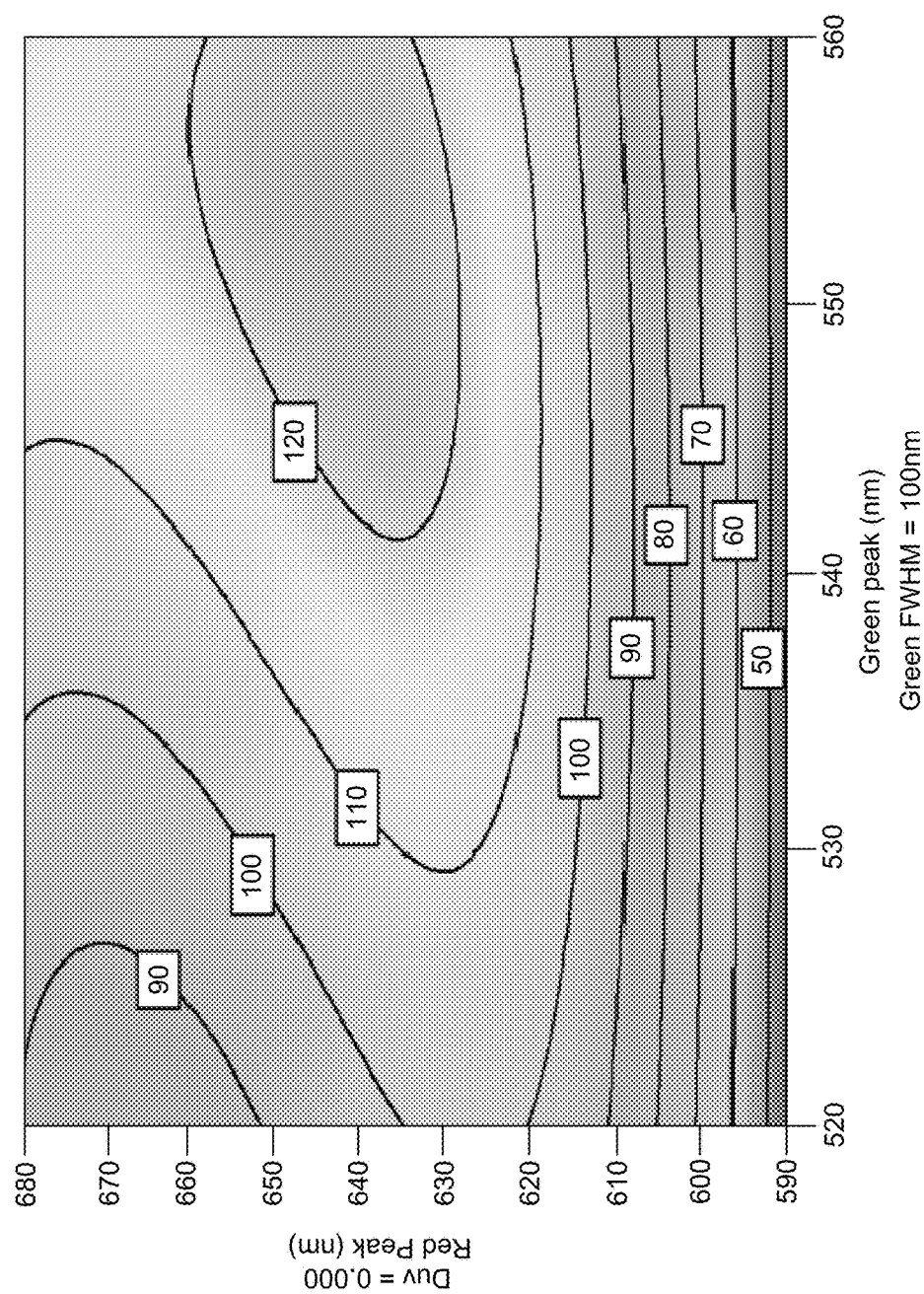
Figure 23D:
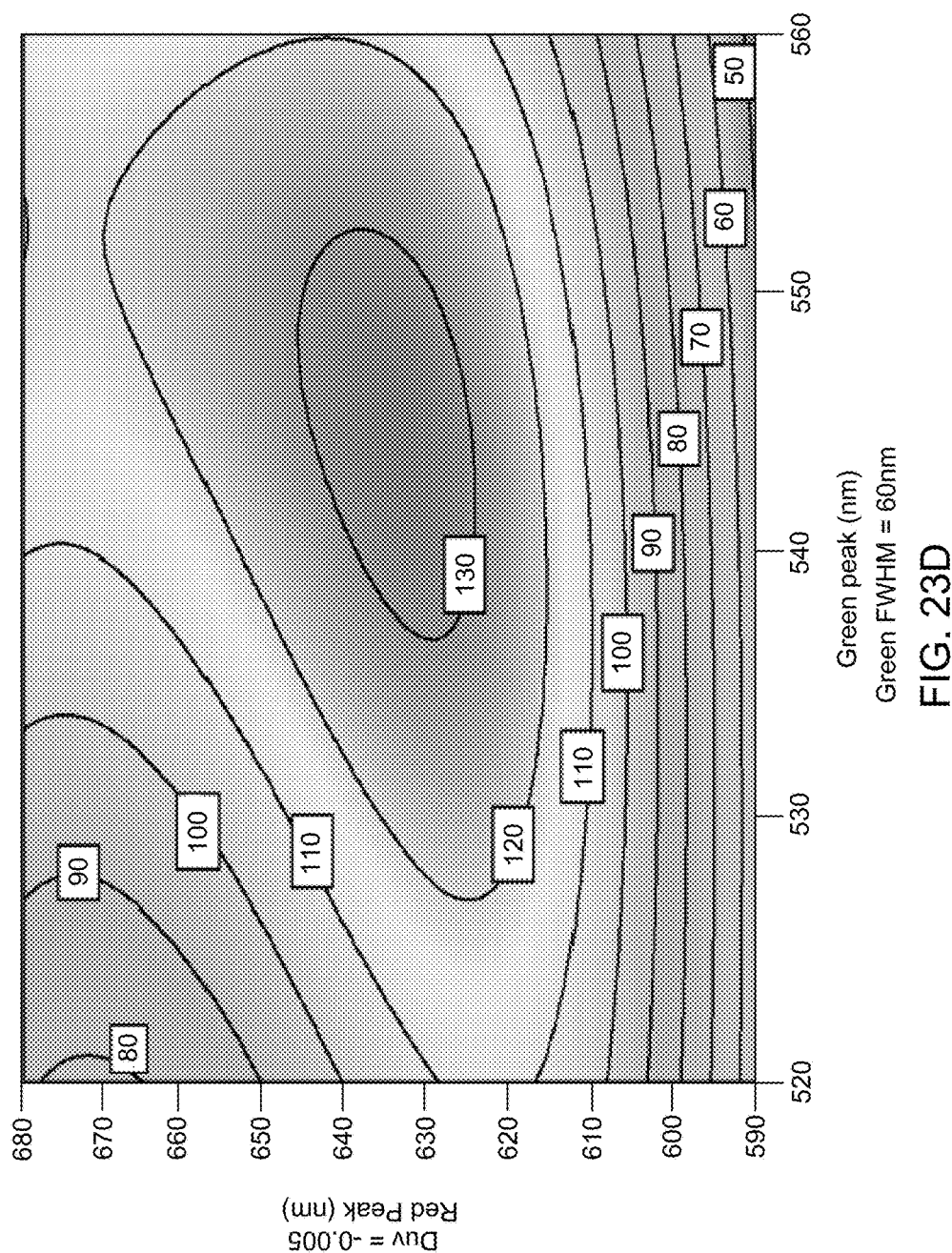
Figure 23E:
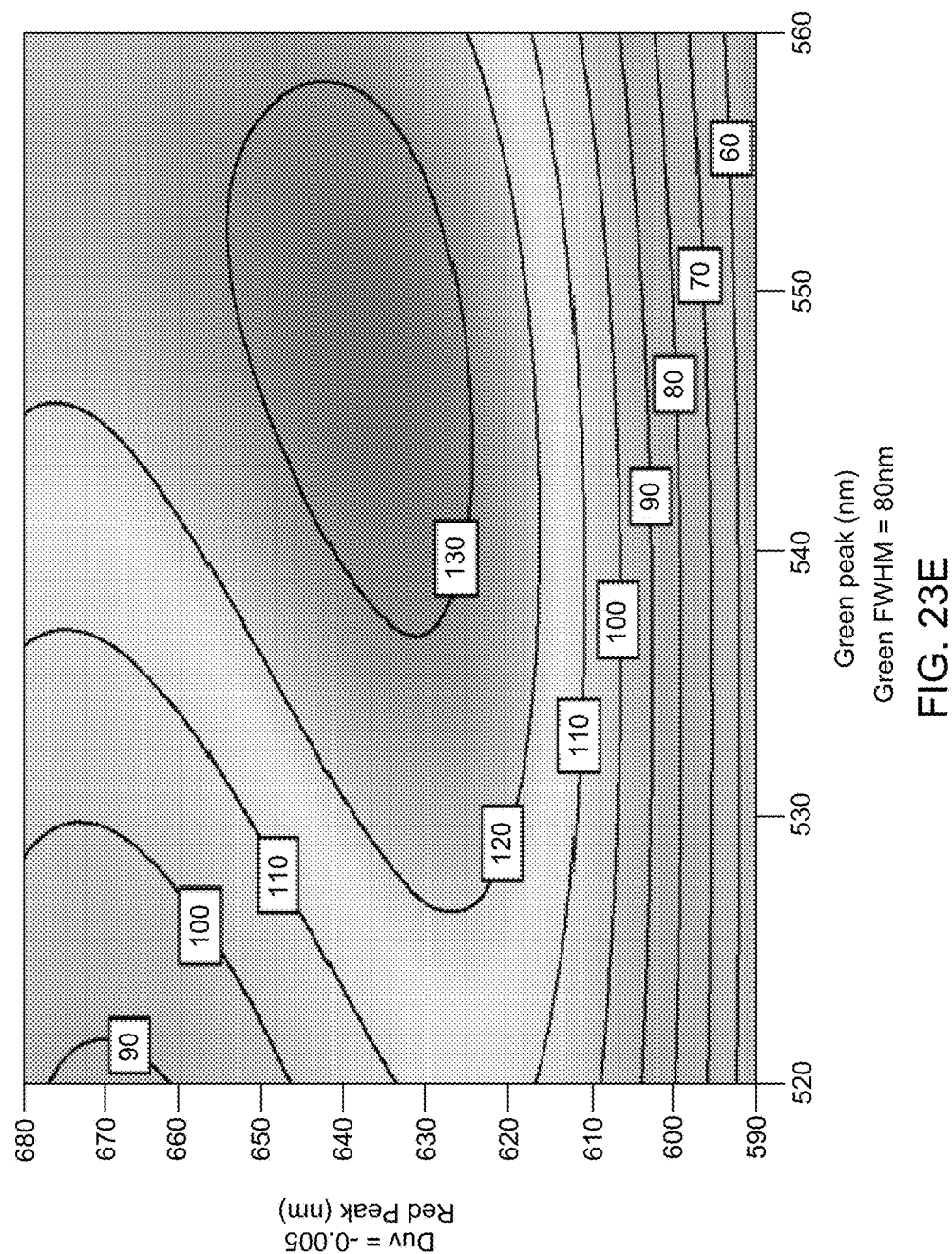
Figure 23F:
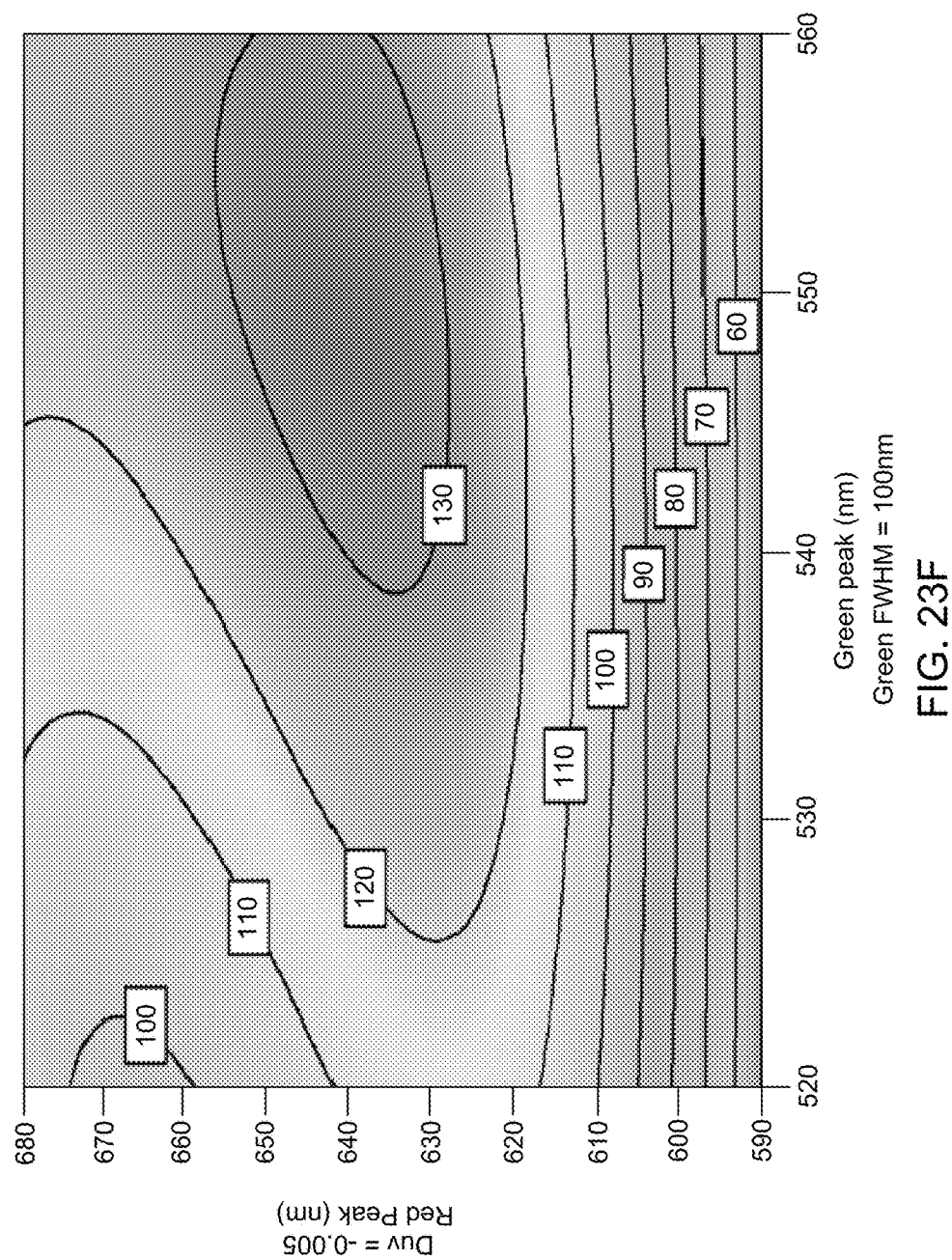
Figure 23G:
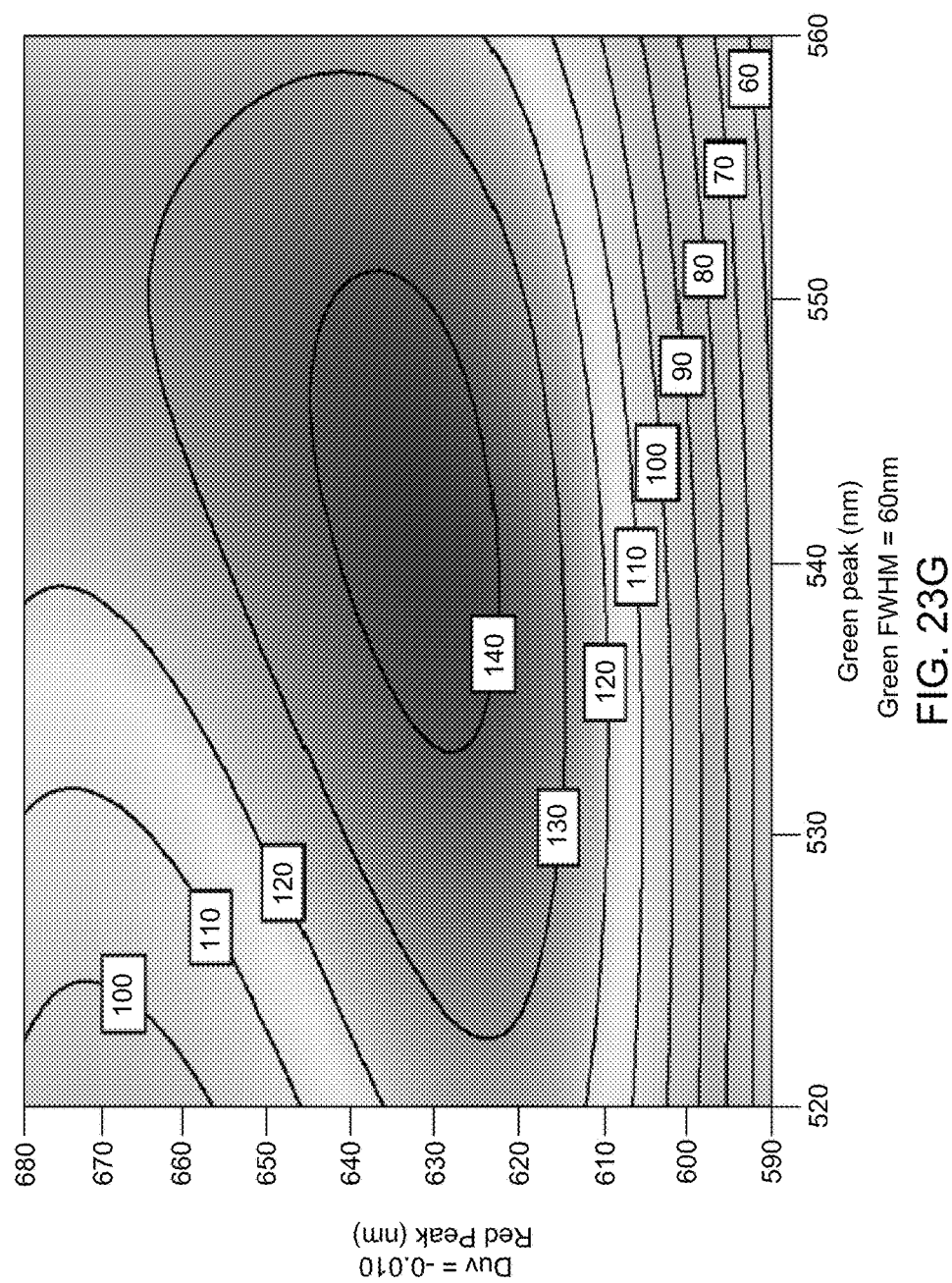
Figure 23H:
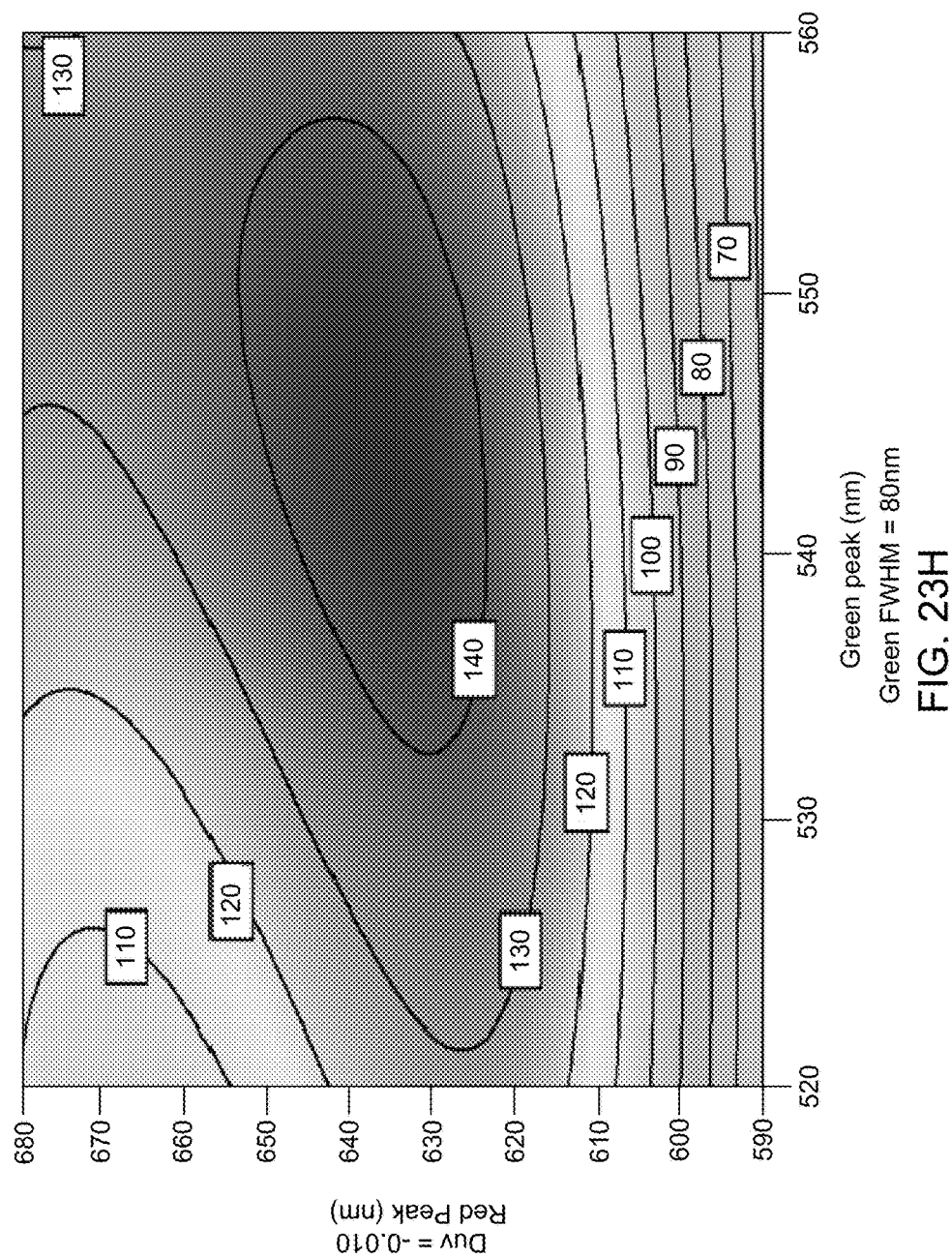
Figure 23I:
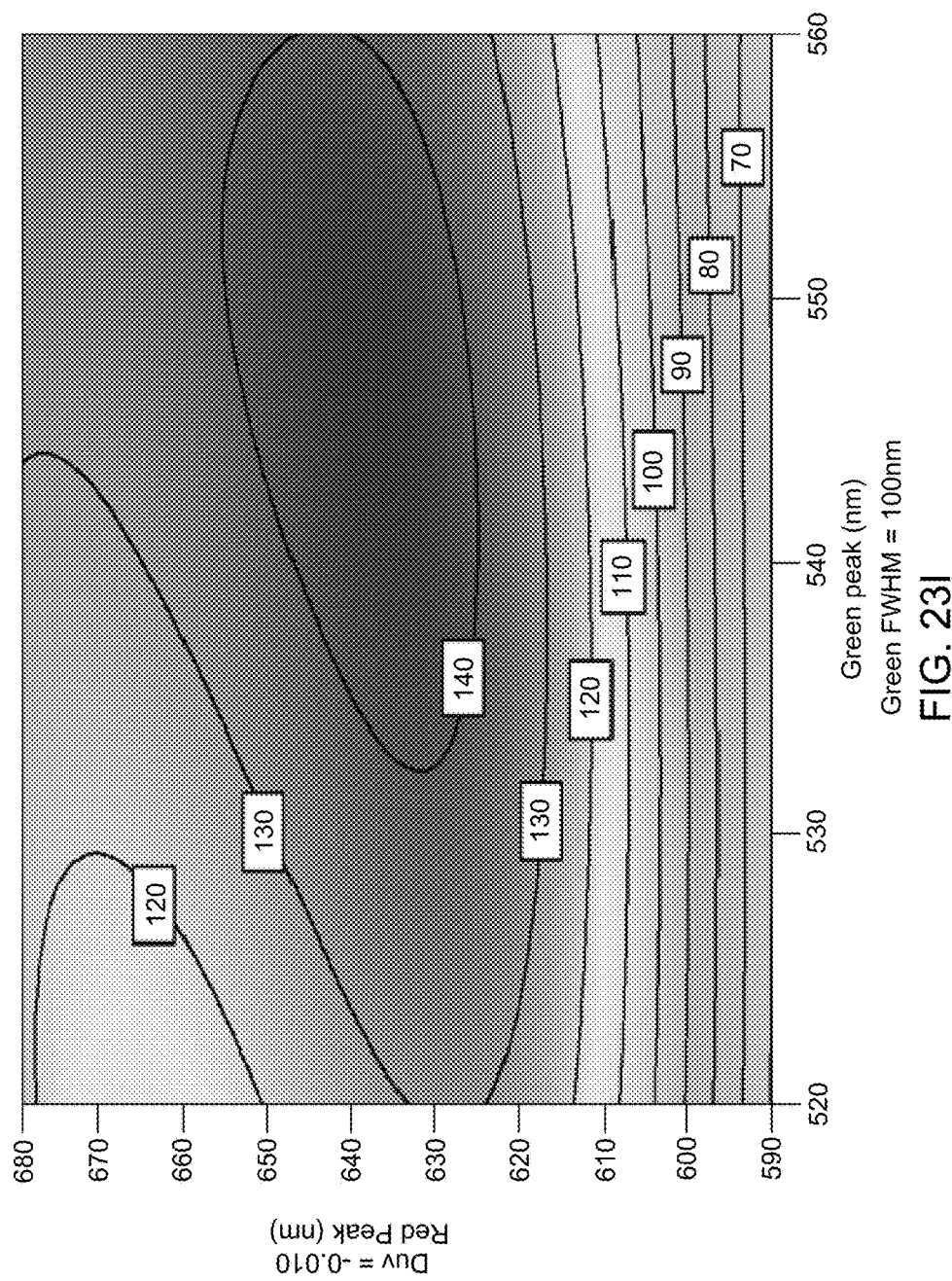

With the three component system as designed with the DOE described above, the maximum LPI values attainable are around 145. With reference to the spectrum 2200 shown in FIG. 22, this is most easily achieved with Duv=−0.010, a green component 2204 that peaks around 545 nm with a FWHM around 80 nm, and a red component 2206 that peaks around 635 nm with a FWHM around 20 nm. Thus, the spectrum 2200 results from such selections.

In accordance with the methods and apparatus described herein, presented below are novel and inventive "BSY+R" light source embodiments that provide an enhanced level of LPI; and in general, that make the colors of natural objects appear more appealing, for example food, wood, plants, skin, and garments. As explained above, most observers prefer the appearance of most objects under such illumination. As also mentioned above, persons respond favorably to light sources that provide a white light with enhanced color saturation and/or contrast, which can be accomplished by suppressing or removing yellow from the spectrum and/or by enhancing the red and green portions of the spectrum, or both.

In general, a BSY+R light source utilizes at least one blue light source, which may be an SSL light source or LED (e.g., royal blue InGaN LED), or a down-converter excited by a violet or ultraviolet light source, and at least one yellow-green down-converter such as a phosphor (such as a YAG: Ce phosphor), the combination supplemented by red light from at least one red SSL or LED. The light from the BSY LED may be essentially white, with a color point that is above the blackbody locus (that is, the light has excess yellow and green emission relative to a white light that lies on the blackbody locus). The BSY emission may be combined with light from the red LED (e.g., having a wavelength of about 610 nm to 630 nm or higher, which may be supplied by, for example one or more AlInGaP LEDs) to move the color point near to the blackbody curve (or below) to produce light in the color temperature range of about 2700 K to about 3200 K, or warm white.

In some embodiments, the primary light sources are warm white BSY+R LED products and phosphor light sources. The novel products disclosed herein may utilize red LEDs having peak red wavelengths of at least about 630 nm to about 640 nm and may additionally use (i.e., in addition to the red LEDs having peak red wavelengths of at least about 630 nm to about 640 nm), deep red LEDs having a peak wavelength of about 640 nm to about 670 nm. With regard to such warm white LED and red LED light source products, the red, green and blue regions of the spectrum must be balanced to obtain the desired color point. It has been found that, in such products, the addition of a deep red LED enhances the appearance of red/red-based and green/green-based colored objects by increasing the perceived color saturation of the objects. Given green LEDs of sufficiently high efficiency, phosphor-free RGB LED spectra may provide even higher efficacy with high CRI than the present BSY+R LED spectra. The benefits of the present invention using BSY+R LEDs will generally apply to RGB LEDs.

Regarding color rendering, in particular, the R9 color plaque in the CIE color system is a saturated red color. The R9 value is often specified in addition to the usual CRI, which is the average of the R1 through R8 pastel colors. Whereas CRI denotes the color rendering of unsaturated pastel colors, R9 denotes the ability of the light source to render saturated red objects, something that most non-incandescent light sources do poorly relative to incandescent light sources. The reflectance spectrum of the R9 color begins at about 600 nm, nearly reaches its maximum at about 660 nm and continues to increase slowly to past 800 nm. The spectra for incandescent and halogen technologies add light in the deep red spectrum, but also continue to add light past 750 nm which leads to wasted energy. Adding a red LED that is peaked at 630-670 nm to a nominally white LED product significantly increases the R9 reflectance spectrum without unduly adding wasted light in the longer infrared wavelengths that the eye cannot perceive. Green objects are also enhanced due to the red-green opponency response of the human eye.

The results from the design of experiments (DOE) discussed above can also be applied to BSY+R systems. As used hereinbelow, the term "BSY phosphor" refers to the phosphor(s) used in a BSY system. In general, the emission from the BSY phosphor is typically wider and in the FWHM range of about 60 nm to about 100 nm, while the emission from the red LED is typically narrow on the order of a FWHM around 20 nm. By constraining the FWHM values to these targets, a model for the LPI values resulting from a BSY+R system follows. To illustrate the impact of green peak wavelength of a BSY phosphor, green FWHM, red peak wavelength, and Duv level on LPI for BSY+R systems, a series of contour plots "a" through "i" are displayed in FIG. 23. Each individual contour plot shows LPI contours in increments of 10 for red peak wavelength versus green peak wavelength. Within FIG. 23, the contour plots are broken into a 3×3 grid where green FWHM varies from 60 nm to 80 nm to 100 nm along the horizontal direction and Duv varies from −0.010 to −0.005 to 0.000 along the vertical direction. For all nine contour plots in FIG. 23, the red FWHM is fixed to 20 nm. As before, the three Duv levels were chosen to illustrate the effect of color point, or Duv, on LPI, and should not be taken as constraints of the application of LPI. Similar contour plots can be made for a continuum of Duv levels from the blackbody line to the "White Line", with similar trends being realized.

By comparing the three rows of FIG. 23, the effect of Duv can easily be seen. The general shapes of the contours remain the same, however the LPI contours increase in value from Duv=0.000 (plots "a" to "c") to Duv=−0.005 (plots "d" to "f") to Duv=−0.010 (plots "g" to "i"). By going from Duv=0.000 to Duv=−0.010, the Whiteness component of the LPI equation increases from 0 to 1, resulting in a 19 point increase in LPI based on Equation (7) for LPI described herein. In general, the optimal value for maximizing LPI in each contour plot experiences a very slight reduction in green peak wavelength (by roughly 5 nm), while the red peak wavelength remains relatively unchanged.

The effect of the BSY component in the BSY+R system can also be seen in FIG. 23. In general, a wider emission from a green BSY phosphor component leads to a slightly higher optimal green peak wavelength, but the shape of the contours remains relatively unchanged. Green phosphor components with a higher FWHM also lead to higher attainable LPI values and larger optimal regions within a given contour. For example, as can be seen in FIG. 23 contours "g" to "i"), the region within the LPI=140 contour grows from a green FWHM of 60 nm ("g") to a green FWHM of 100 nm ("i"), particularly in the horizontal direction. This creates greater stability within a design when using green components with a larger FWHM as the LPI value is not as sensitive to the green peak wavelength.

Similarly, FIG. 23 also illustrates the effect of the red LED peak wavelength on LPI. In general, the LPI values are highly sensitive to the red LED peak wavelength, as seen with the close grouping of contours in the vertical direction, particularly so for red peak wavelengths at 620 nm and below. For example, as can be seen in FIG. 23 contour plot "i", increasing the red peak wavelength from 590 nm to 620 nm can result in an increase in LPI from 60 to 130. Beyond 620 nm, LPI is not as sensitive to the red peak wavelength, with an ideal peak wavelength in the range of about 625 nm to about 650 nm.

In order to achieve high LPI values, the BSY characteristics and the red LED peak wavelength should generally be chosen judiciously. For LPI values greater than 120 and color points near the blackbody, or close to Duv=0.000, the BSY phosphor component should have a FWHM in the range of about 60 nm to about 100 nm and a peak wavelength in the range of about 540 nm and about 560 nm, while the red LED should have a peak wavelength in the range of about 625 nm to about 660 nm. For LPI values greater than 120 and color points near the midpoint between the blackbody and "White Line", or close to Duv=−0.005, the BSY phosphor component should have a FWHM in the range of about 60 nm to about 100 nm and a peak wavelength in the range of about 525 nm and about 570 nm, while the red LED should have a peak wavelength in the range of about 615 nm to about 670 nm. For LPI values greater than 120 and color points near the "White Line", or close to Duv=−0.010, the BSY phosphor component should have a FWHM in the range of about 60 nm to about 100 nm and a peak wavelength in the range of about 520 nm and about 580 nm, while the red LED should have a peak wavelength in the range of about 610 nm to about 680 nm. For LPI values greater than 130 and color points near the midpoint between the blackbody and "White Line", or close to Duv=−0.005, the BSY phosphor component should have a FWHM in the range of about 60 nm to about 100 nm and a peak wavelength in the range of about 535 nm and about 560 nm, while the red LED should have a peak wavelength in the range of about 625 nm to about 655 nm. For LPI values greater than 130 and color points near the "White Line", or close to Duv=−0.010, the BSY component should have a FWHM in the range of about 60 nm to about 100 nm and a peak wavelength in the range of about 525 nm and about 570 nm, while the red LED should have a peak wavelength in the range of about 615 nm to about 670 nm. For LPI values greater than 140 and color points near the "White Line", or close to Duv=−0.010, the BSY component should have a FWHM in the range of about 60 nm to about 100 nm and a peak wavelength in the range of about 535 nm and about 560 nm, while the red LED should have a peak wavelength in the range of about 625 nm to about 655 nm.

In one embodiment of a BSY+R system, the LED light source 850 in accordance with FIG. 8b may include one or more groups of LEDs 806 and 808 that may each consist of a mixture of blue LEDs coated with BSY phosphor and red LEDs, where the portion of the blue light generated by the blue LED that is not absorbed by the phosphor materials, combined with the light emitted by the phosphor material and the red light emitted by the red LED provides light which appears to the human eye as being nearly white in color. The mixed-light spectrum is composed of a blue LED peak emission in the range of about 400 nm to about 460 nm, a BSY peak emission in the range of about 500 nm to about 580 nm created by the excitation of a green or yellow-green phosphor by the blue emission from the LED, and a red LED peak emission in the range of about 600 nm to about 640 nm. The spectrum is also similar to that of a blackbody spectrum, but may include a depression in the wavelength range between the blue LED emission and the green or yellow-green phosphor emission, and may include a second depression in the yellow wavelength range between the green or yellow-green phosphor and the red LED. The light source may also have a CCT between about 2700 K and about 4000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green or yellow-green phosphor and the red LED that results from the combination of the relatively narrow width, and relatively short peak wavelength, of the BSY phosphor, and the very narrow width of the red LED. The depression of the spectrum in the yellow, if sufficiently deep, may provide a light source having an enhanced color preference, or color saturation or color contrast capability that is typically preferred by a human observer relative to light emitted from the same light source employing typical blue and red LED and phosphor combinations that do not produce a depression in the yellow.

Figure 24:
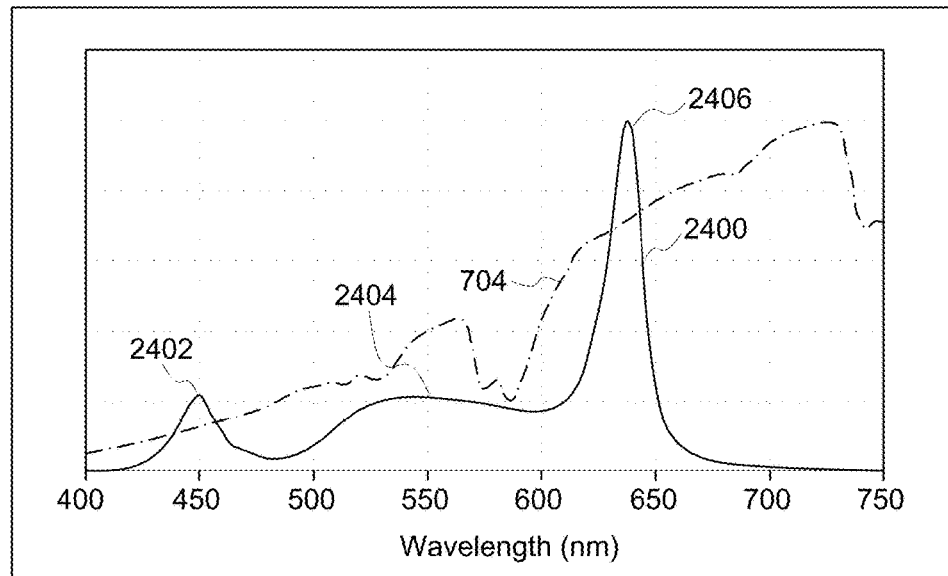
FIG. 24 includes a graph of the SPD of a BSY+R type of LED light source, having a CCT=2700 K, and a graph of the SPD of a Reveal® type incandescent light source having a CCT=2755 K.

FIG. 24 includes a graph 2400 of the SPD of a BSY+R type of LED light source discussed immediately above with CCT=2700 K, and a graph 704 of the SPD of a Reveal® type incandescent light source having a CCT=2755 K. The curve 2400 shows that the peak wavelength 2402 of the blue LEDs occurs at approximately 450 nm, the peak wavelength of the yellow-green phosphor 2404 occurs at about 550 nm, and the peak wavelength 2406 of the red LEDs occurs at about 635 nm. This spectrum produces a light having CCT=2700 K, CRI=78, and LPI=136. The LPI score of 136 is high, meaning that a human observer will perceive more saturated colors and a more preferred appearance when utilizing the BSY+R spectrum 2400 than possible by using some prior art light engines.

Figure 25:
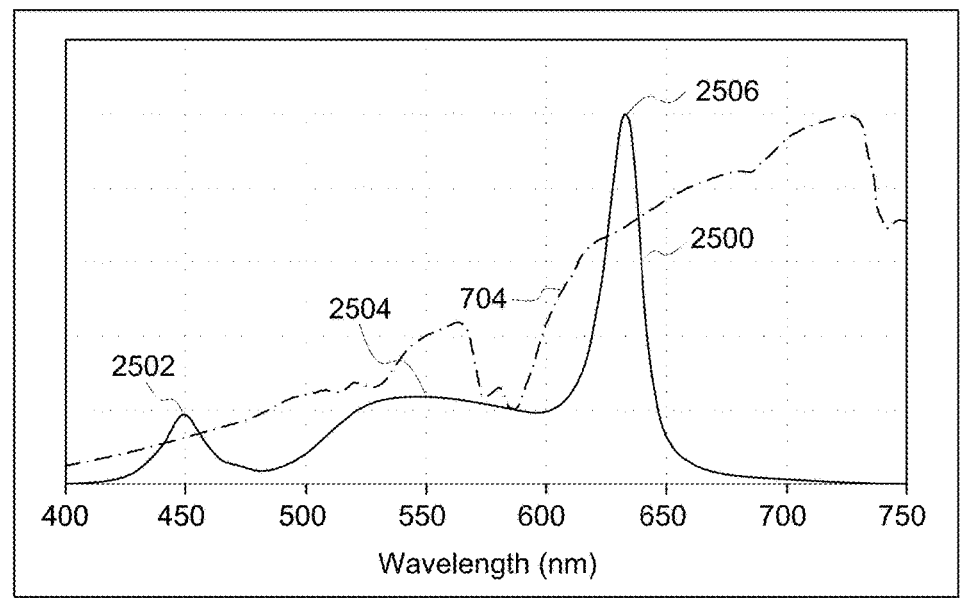
FIG. 25 includes a graph of the SPD of a BSY+R type of LED light source, optimized for Energy Star criteria, having a CCT=2700 K, and a graph of the SPD of a Reveal® type incandescent light source having a CCT=2755 K.
Figure 26:
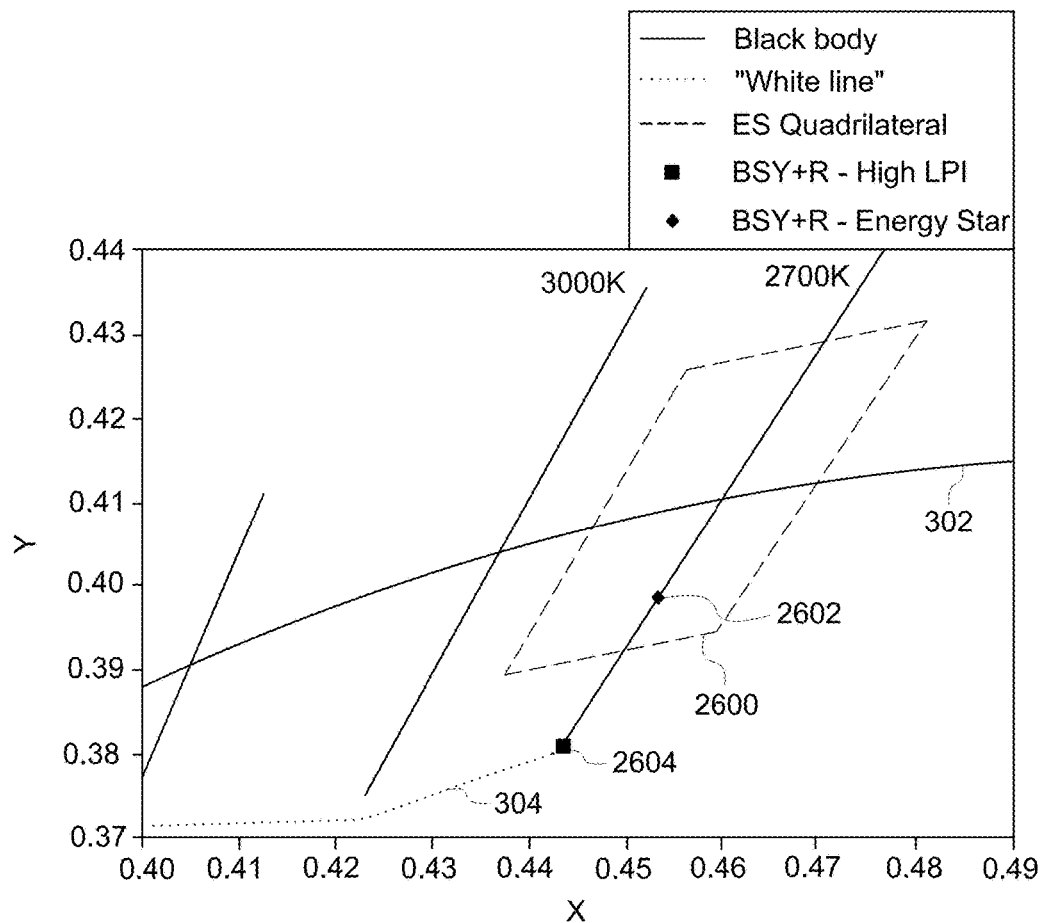
FIG. 26 includes a plot of x-y chromaticity space with the blackbody locus, the "White Line", and the Energy Star quadrilateral, along with the color points of a BSY+R system optimized to high LPI and a BSY+R system optimized to high LPI with Energy Star constraints.

FIG. 25 includes a graph 2500 of the SPD of a different implementation of a BSY+R type of LED light source discussed immediately above, and a graph 704 of the SPD of a Reveal® type incandescent light source having a CCT=2755 K. The curve 2500 shows that the peak wavelength 2502 of the blue LEDs occurs at approximately 450 nm, the peak wavelength 2504 of the yellow-green phosphor occurs at about 550 nm, and the peak wavelength 2506 of the red LEDs occurs at about 630 nm. For this implementation, the spectrum has been optimized to meet current Energy Star criteria, which requires a CRI greater than 80 and a color point within the "Energy Star" quadrilateral, demarcated by dotted lines 2600 in the chromaticity diagram of FIG. 26. The Energy Star quadrilateral has approximately equal portions above and below the Planckian locus, or blackbody locus 302, and is positioned above the "White Line" 304 in chromaticity space. The spectrum 2500 in FIG. 25 produces a light having CCT=2700 K, CRI=84, and LPI=123, along with color point 2602 that lies within the Energy Star quadrilateral in FIG. 26. In contrast, the spectrum 2400 in FIG. 24 produces a light having a color point 2604 in FIG. 26, which is below the Energy Star quadrilateral. The LPI score of 123 is relatively high, meaning that a human observer will perceive more saturated colors and a more preferred appearance when utilizing the BSY+R spectrum 2500 than possible by using some prior art light engines, but not quite as high as that of spectrum 2400 in FIG. 24.

In a second embodiment of a BSY+R system, the LED light source 850 shown in FIG. 8b may include one or more groups of LEDs 806 and 808 that may each consist of a mixture of blue LEDs coated with BSY phosphor and deep red LEDs, where the portion of the blue light generated by the blue LED that is not absorbed by the phosphor materials, combined with the light emitted by the phosphor material and the red light emitted by the deep red LED provides light which appears to the human eye as being nearly white in color. The mixed-light spectrum is composed of a blue LED peak emission in the range of about 400 nm to about 460 nm, a BSY peak emission in the range of about 500 nm to about 580 nm created by the excitation of a green or yellow-green phosphor by the blue emission from the LED, and a deep red LED peak emission in the range of about 640 nm to about 670 nm. The spectrum may include a depression in the wavelength range between the blue LED emission and the green or yellow-green phosphor emission, and may include a second depression in the yellow wavelength range between the green or yellow-green phosphor and the deep red LED. The light source may also have a CCT between about 2700 K and about 4000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green or yellow-green phosphor and the red LED that results from the combination of the relatively narrow width, and relatively short peak wavelength, of the BSY phosphor, and the very narrow width of the red LED. The depression of the spectrum in the yellow, if sufficiently deep, may provide a light source having an enhanced color preference, or color saturation or color contrast capability that is typically preferred by a human observer relative to light emitted from the same light source employing typical blue and red LED and phosphor combinations that do not produce a depression in the yellow.

Figure 27:
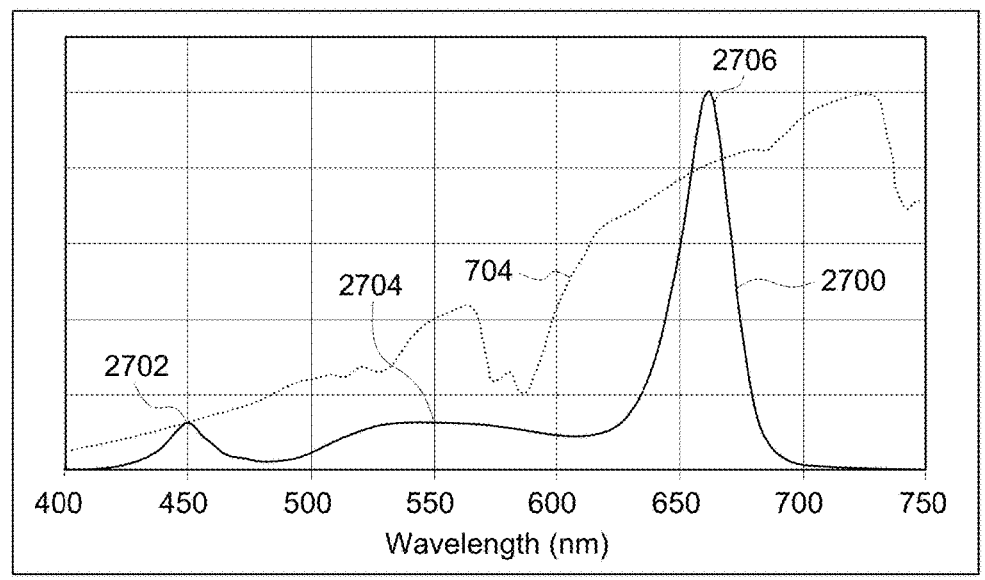
FIG. 27 includes a graph of the SPD of a BSY+DR type of LED light source, optimized for Energy Star criteria, having a CCT=2700 K, and a graph of the SPD of a Reveal® type incandescent light source having a CCT=2755 K.

FIG. 27 includes a graph 2700 of the SPD of the second embodiment of a BSY+R type of LED light source discussed immediately above, and a graph 704 of the SPD of a Reveal® type incandescent light source having a CCT=2755 K. The curve 2700 shows that the peak wavelength 2702 of the blue LEDs occurs at approximately 450 nm, the peak wavelength 2704 of the yellow-green phosphor occurs at about 550 nm, and the peak wavelength 2706 of the deep red LEDs occurs at about 660 nm. This spectrum produces a light having CCT=2700 K, CRI=66, and LPI=139. The LPI score of 139 is high, meaning that a human observer will perceive more saturated colors and a more preferred appearance when utilizing the BSY+R spectrum 2700 than possible by using some prior art light engines.

In a third embodiment of a BSY+R system, the LED light source 850 shown in FIG. 8b may include one or more groups of LEDs 806 and 808 that may each consist of a mixture of blue LEDs coated with BSY phosphor, red LEDs, and also deep red LEDs, where the portion of the blue light generated by the blue LED that is not absorbed by the phosphor materials, combined with the light emitted by the phosphor material and the red light emitted by the red LED(s) and deep red LED(s) provides light which appears to the human eye as being nearly white in color. The mixed-light spectrum is composed of a blue LED peak emission in the range of about 400 nm to about 460 nm, a BSY peak emission in the range of about 500 nm to about 580 nm created by the excitation of a green or yellow-green phosphor by the blue emission from the LED, a red LED peak emission in the range of about 600 nm to about 640 nm, and a deep red LED peak emission in the range of about 640 nm to about 670 nm. The spectrum may include a depression in the wavelength range between the blue LED emission and the green or yellow-green phosphor emission, and may include a second depression in the yellow wavelength range between the green or yellow-green phosphor and the red LED, and may include a third depression in the red wavelength range between the red LED and the deep red LED. The light source may also have a CCT between about 2700 K and about 4000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green or yellow-green phosphor and the red LED that results from the combination of the relatively narrow width, and relatively short peak wavelength of the BSY phosphor, and the very narrow width of the red LED. The depression of the spectrum in the yellow, if sufficiently deep, may provide a light source having an enhanced color preference, or color saturation or color contrast capability that is typically preferred by a human observer relative to light emitted from the same light source employing typical blue and red LED and phosphor combinations that do not produce a depression in the yellow.

Figure 28:
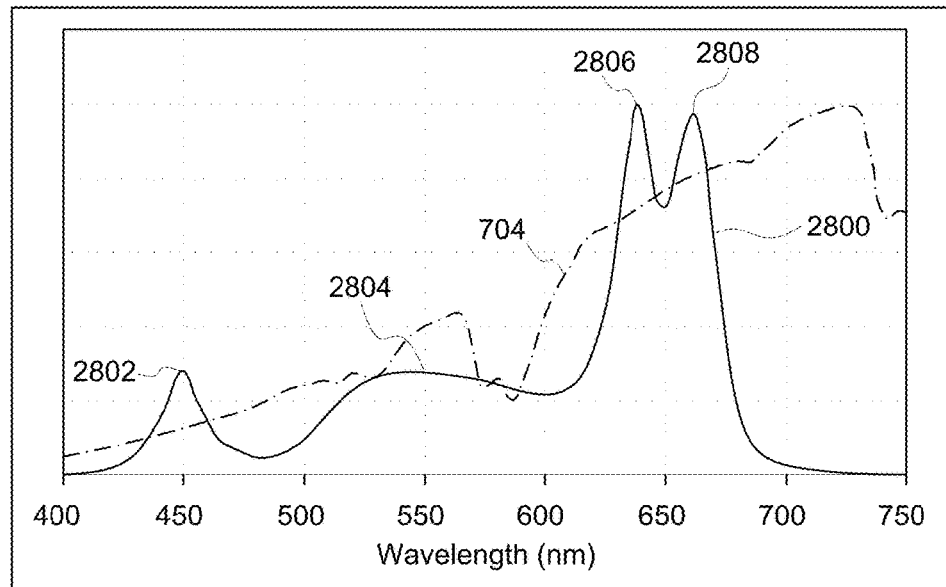
FIG. 28 includes a graph of the SPD of a BSY+R+DR type of LED light source, having a CCT=2700 K, and a graph of the SPD of a Reveal® type incandescent light source having a CCT=2755 K.

FIG. 28 includes a graph 2800 of the SPD of a BSY+R +deep red type of LED light source discussed immediately above, and a graph 704 of the SPD of a Reveal® type incandescent light source having a CCT=2755 K. The curve 2800 shows that the peak wavelength 2802 of the blue LEDs occurs at approximately 450 nm, the peak wavelength 2804 of the yellow-green phosphor occurs at about 550 nm, the peak wavelength 2806 of the red LEDs occurs at about 635 nm, and the peak wavelength 2808 of the deep red LEDs occurs at about 660 nm. This spectrum produces a light having CCT=2700 K, CRI=73, and LPI=138. The LPI score of 138 is high, meaning that a human observer will perceive more saturated colors and a more preferred appearance when utilizing the BSY+R spectrum 2800 than possible by using some prior art light engines.

Further, in some embodiments a neodymium (Nd) or other yellow filter may be placed over the light source, and the filter functions to suppress yellow light to further enhance the perception of red and green vibrancy. This may allow, for example, the peak wavelength of the red LED to be moved to shorter wavelengths, while still maintaining the high levels of LPI In a fourth embodiment of a BSY+R system, the LED light source 850 shown in FIG. 8*b* may include one or more groups of LEDs 806 and 808 that may each consist of a mixture of blue LEDs coated with BSY phosphor and red LEDs, where the portion of the blue light generated by the blue LED that is not absorbed by the phosphor materials, combined with the light emitted by the phosphor material and the red light emitted by the red LED provides light which appears to the human eye as being nearly white in color. In addition, with reference to FIG. 8*b*, this embodiment includes a glass dome 802 impregnated with neodymium oxide that encapsulates the BSY+R light engine therein. The mixed-light spectrum is composed of a blue LED peak emission in the range of about 400 nm to about 460 nm, a BSY peak emission in the range of about 500 nm to about 580 nm created by the excitation of a green or yellow-green phosphor by the blue emission from the LED, and a red LED peak emission in the range of about 600 nm to about 640 nm. The spectrum may include a depression in the wavelength range between the blue LED emission and the green or yellow-green phosphor emission, and may include a second depression in the yellow wavelength range between the green or yellow-green phosphor and the red LED, enhanced by the addition of the Nd glass. The light source may also have a CCT between about 2700 K and about 4000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green or yellow-green phosphor and the red LED that results from the combination of the relatively narrow width, and relatively short peak wavelength, of the BSY phosphor, and the very narrow width of the red LED, and is further enhanced by the addition of the Nd glass. The depression of the spectrum in the yellow, if sufficiently deep, may provide a light source having an enhanced color preference, or color saturation or color contrast capability that is typically preferred by a human observer relative to light emitted from the same light source employing typical blue and red LED and phosphor combinations that do not produce a depression in the yellow.

Figure 29:
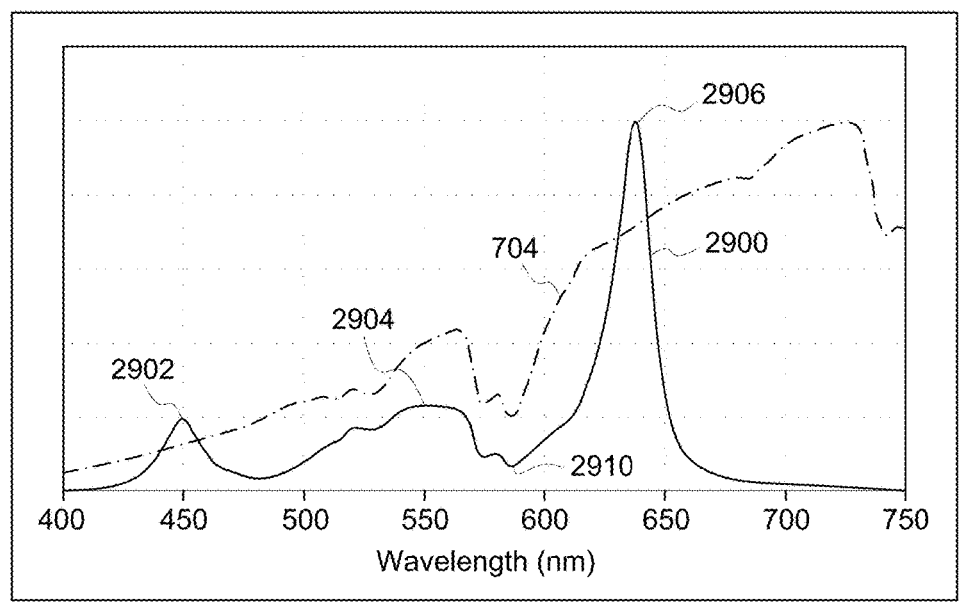
FIG. 29 includes a graph of the SPD of a BSY+R+Nd type of LED light source, having a CCT=2700 K, and a graph of the SPD of a Reveal® type incandescent light source having a CCT=2755 K.

FIG. 29 includes a graph 2900 of the SPD of a BSY+R type of LED light source of FIG. 8*b* discussed immediately above, which includes a Nd glass dome, and a graph 704 of the SPD of a Reveal® type incandescent light source having a CCT=2755 K. The curve 2900 shows that the peak wavelength 2902 of the blue LEDs occurs at approximately 450 nm, the peak wavelength 2904 of the yellow-green phosphor occurs at about 550 nm, and the peak wavelength 2906 of the red LEDs occurs at about 635 nm. The Nd glass functions to filter out light in the yellow portion 2910 of the color spectrum which may have been produced by the yellow-green phosphor and red LEDs, such that the light 2900 has further enhanced color preference. This spectrum produces a light having CCT=2700 K, CRI=64, and LPI=143. The LPI score of 143 is high, meaning that a human observer will perceive more saturated colors and a more preferred appearance when utilizing the BSY+R spectrum 2900 than possible by using some prior art light engines.

In a fifth embodiment of a BSY+R system, the LED light source 850 shown in FIG. 8*b* may include one or more groups of LEDs 806 and 808 that may each consist of a mixture of blue LEDs coated with BSY phosphor and deep red LEDs, where the portion of the blue light generated by the blue LED that is not absorbed by the phosphor materials, combined with the light emitted by the phosphor material and the red light emitted by the deep red LED provides light which appears to the human eye as being nearly white in color. In addition, with reference to FIG. 8*b*, this embodiment includes a glass dome 802 impregnated with neodymium oxide that encapsulates the BSY+R light engine therein. The mixed-light spectrum is composed of a blue LED peak emission in the range of about 400 nm to about 460 nm, a BSY peak emission in the range of about 500 nm to about 580 nm created by the excitation of a green or yellow-green phosphor by the blue emission from the LED, and a deep red LED peak emission in the range of about 640 nm to about 670 nm. The spectrum may include a depression in the wavelength range between the blue LED emission and the green or yellow-green phosphor emission, and may include a second depression in the yellow wavelength range between the green or yellow-green phosphor and the deep red LED, enhanced by the addition of the Nd glass. The light source may also have a CCT between about 2700 K and about 4000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green or yellow-green phosphor and the red LED that results from the combination of the relatively narrow width, and relatively short peak wavelength, of the BSY phosphor, and the very narrow width of the red LED, and is further enhanced by the addition of the Nd glass. The depression of the spectrum in the yellow, if sufficiently deep, may provide a light source having an enhanced color preference, or color saturation or color contrast capability that is typically preferred by a human observer relative to light emitted from the same light source employing typical blue and red LED and phosphor combinations that do not produce a depression in the yellow.

Figure 30:
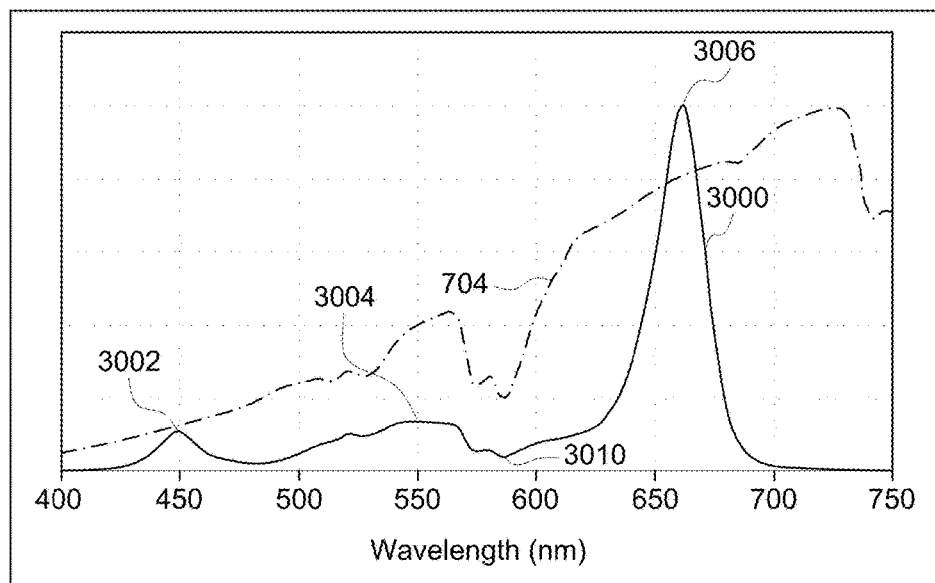
FIG. 30 includes a graph of the SPD of a BSY+DR+Nd type of LED light source, having a CCT=2700 K, and a graph of the SPD of a Reveal® type incandescent light source having a CCT=2755 K.

FIG. 30 includes a graph 3000 of the SPD of a BSY+R type of LED light source of FIG. 8*b* discussed immediately above, which includes a Nd glass dome, and a graph 704 of the SPD of a Reveal® type incandescent light source having a CCT=2755 K. The curve 3000 shows that the peak wavelength 3002 of the blue LEDs occurs at approximately 450 nm, the peak wavelength 3004 of the yellow-green phosphor occurs at about 550 nm, and the peak wavelength 3006 of the deep red LEDs occurs at about 660 nm. The Nd glass functions to filter out light in the yellow portion 3010 of the color spectrum which may have been produced by the yellow-green phosphor and red LEDs, such that the light 3000 has further enhanced color preference. This spectrum produces a light having CCT=2700 K, CRI=51, and LPI=142. The LPI score of 142 is high, meaning that a human observer will perceive more saturated colors and a more preferred appearance when utilizing the BSY+R spectrum 3000 than possible by using some conventional light engines.

In a sixth embodiment of a BSY+R system, the LED light source 850 shown in FIG. 8*b* may include one or more groups of LEDs 806 and 808 that may each consist of a mixture of blue LEDs coated with BSY phosphor, red LEDs, and deep red LEDs, where the portion of the blue light generated by the blue LED that is not absorbed by the phosphor materials, combined with the light emitted by the phosphor material and the red light emitted by the red LED and deep red LED provides light which appears to the human eye as being nearly white in color. In addition, with reference to FIG. 8*b*, this embodiment includes a glass dome 802 impregnated with neodymium oxide that encapsulates the BSY+R light engine therein. The mixed-light spectrum is composed of a blue LED peak emission in the range of about 400 nm to about 460 nm, a BSY peak emission in the range of about 500 nm to about 580 nm created by the excitation of a green or yellow-green phosphor by the blue emission from the LED, a red LED peak emission in the range of about 600 nm to about 640 nm, and a deep red LED peak emission in the range of about 640 nm to about 670 nm. The spectrum is also similar to that of a blackbody spectrum, but may include a depression in the wavelength range between the blue LED emission and the green or yellow-green phosphor emission, and may include a second depression in the yellow wavelength range between the green or yellow-green phosphor and the red LED, enhanced by the addition of the Nd glass, and may include a third depression in the red wavelength range between the red LED and the deep red LED. The light source may also have a CCT between about 2700 K and about 4000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green or yellow-green phosphor and the red LED that results from the combination of the relatively narrow width, and relatively short peak wavelength, of the BSY phosphor compared with a typical yellow-green YAG phosphor, and the very narrow width of the red LED compared with the width of a typical red phosphor, and is further enhanced by the addition of the Nd glass. The depression of the spectrum in the yellow, if sufficiently deep, may provide a light source having an enhanced color preference, or color saturation or color contrast capability that is typically preferred by a human observer relative to light emitted from the same light source employing typical blue and red LED and phosphor combinations that do not produce a depression in the yellow.

Figure 31:
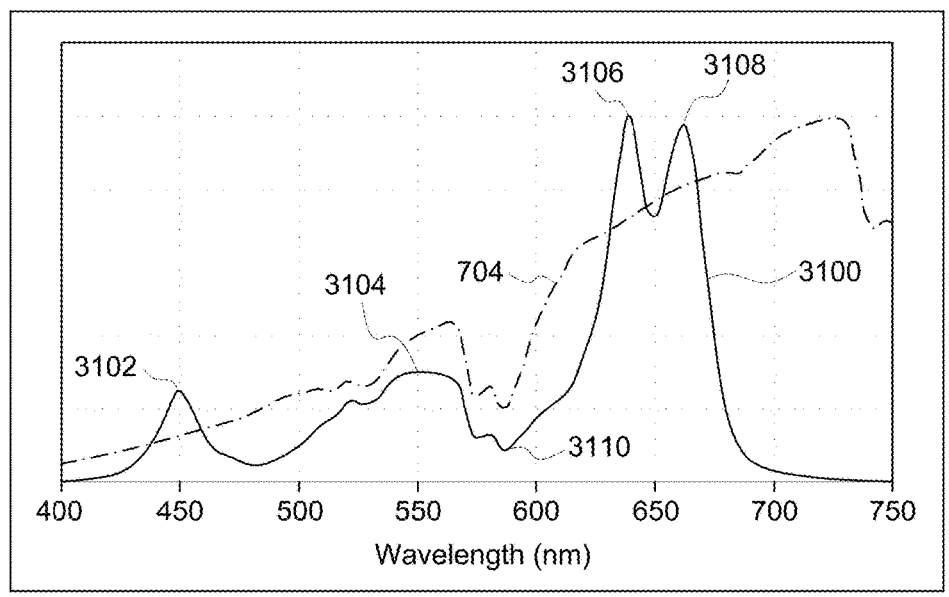
FIG. 31 includes a graph of the SPD of a BSY+R+DR+Nd type of LED light source, having a CCT=2700 K, and a graph of the SPD of a Reveal® type incandescent light source having a CCT=2755 K.

FIG. 31 includes a graph 3100 of the SPD of a BSY+R type of LED light source of FIG. 8*b* discussed immediately above, which includes a Nd glass dome, and a graph 704 of the SPD of a Reveal® type incandescent light source having a CCT=2755 K. The curve 3100 shows that the peak wavelength 3102 of the blue LEDs occurs at approximately 450 nm, the peak wavelength 3104 of the yellow-green phosphor occurs at about 550 nm, the peak wavelength 3106 of the red LEDs occurs at about 635 nm, and the peak wavelength 3108 of the deep red LEDs occurs at about 660 nm. The Nd glass functions to filter out light in the yellow portion 3110 of the color spectrum which may have been produced by the yellow-green phosphor and red LEDs, such that the light 3100 has further enhanced color preference. This spectrum produces a light having CCT=2700 K, CRI=59, and LPI=144. The LPI score of 144 is high, meaning that a human observer will perceive more saturated colors and a more preferred appearance when utilizing the BSY+R spectrum 3100 than possible by using some prior art light engines.

Presented below are additional novel phosphor-based LED light source spectral embodiments that provide an enhanced level of LPI; and as mentioned earlier, such light sources enhance the colors of natural objects so that they appear more appealing, for example, for food, wood, plants, skin, and garments. In general, most observers prefer the appearance of most objects under such illumination. Persons respond favorably to light sources that provide a white light with enhanced color saturation and/or contrast, which can be accomplished by suppressing or removing yellow from the spectrum and/or by enhancing the red and green portions of the spectrum, or both. The suppression of yellow or enhancement of red and green has been previously accomplished by adding a Nd glass filter, or a filter containing some other embodiment of Nd or Didymium or other rare earth that preferentially absorbs yellow light; or by some other dopant or coating on the glass that absorbs preferentially in the yellow; or by the addition of any yellow absorber to any of the optically active components of the lamp or lighting system, such as a reflector or diffuser or lens, which may be a glass or polymer or metal or any other material that accommodates the yellow absorber; or by using a separate red LED having a narrow spectral width instead of using a relatively broad red phosphor, in order to minimize the overlap of emission from the yellow-green phosphor and the red led so that a relative minimum intensity can be provided in the yellow, with distinct emission peaks in the green and red portions of the spectrum.

It has been determined, as explained above, that a sufficient suppression of the yellow emission can be provided by a suitably narrow and blue-shifted green phosphor in combination with a red phosphor, especially if the red phosphor is also suitably narrow and has a favorable peak wavelength. In addition, it was found that the suppression of the yellow emission and the separation of the red and green peak wavelengths can provide a more favorable red-green contrast, overall color preference, and crisp white appearance than previous techniques involving Nd glass, and with potentially higher efficacy than techniques using Nd glass. The FWHM and peak wavelengths of the green and red phosphors each have minima and maxima, and ideal values were identified that provide optimal LPI values. In addition, commercially available green and red phosphors exist which provide emission within the preferred ranges of FWHM and peak wavelengths.

In general, these light sources utilize at least one blue or violet LED (e.g., royal blue InGaN LED) and phosphor combination, whereas the phosphor is composed of a nominally green or yellow phosphor (e.g., YAG or green aluminate or similar green phosphor) and/or a nominally red phosphor (e.g., red nitride or red sulfide or similar red phosphor). The green and red phosphors are both excited by the blue or violet LED emission and may be combined into a single phosphor blend sharing the same LED pump, or alternatively, the green and red phosphors may be on separate blue or violet LED pumps. The combined emission from the blue or violet LED, green phosphor, and red phosphor provides light which appears to the human eye as being nearly white in color with a color point near to the blackbody curve or below to produce light in the color temperature range of about 2700 K to about 3200 K, or warm white.

In some embodiments, the green phosphor has a lower peak wavelength (e.g., about 500 nm to about 540 nm) than standard high-efficacy phosphors, and may be characterized as blue-shifted green (BSG), as opposed to blue-shifted yellow (BSY) or other designation. The red phosphor can have varying ranges of FWHM and may be characterized as broad red (BR) for emission with FWHM greater than 60 nm, or narrow red (NR) for emission with FWHM less than 60 nm. Some conventional light sources that exhibit enhanced color saturation and color preference use a red LED having a narrow FWHM of about 10 nm to about 20 nm to provide the red contribution to the spectrum, whereby the peak wavelength of the red LED can be selected to provide favorable optimization between color preference and efficacy. A disadvantage of using a separate red LED, along with using a blue or violet LED with green phosphor, is that it requires the use of a second current channel, or some other means for adjusting the drive current to the red LED, independently of the drive current to the blue LED, because the red and blue LEDs respond differently to temperature.

The results from the design of experiments (DOE) previously discussed can also be applied to phosphor-based systems (e.g., BSG+BR and BSG+NR). In general, the emission from a BR phosphor typically falls in the FWHM range of about 60 nm to about 100 nm and the emission from a NR phosphor typically falls in the FWHM range of about 20 nm to about 60 nm. By constraining the FWHM values to these targets, models for the LPI values resulting from a BSG+BR system and a BSG+NR system follow. FIG. 19, FIG. 20, and FIG. 21 help to illustrate the impact of green peak wavelength, green FWHM, red peak wavelength, red FWHM, and Duv level on LPI for BSG+BR and BSG+NR systems, whereas contour plots "a" to "f" apply to a BSG+BR system and contour plots "d" to "i" apply to a BSG+NR system.

The effect of the BSG component in the BSG+BR system can be seen in FIG. 19, FIG. 20, and FIG. 21, contour plots "a" to "f". For the middle level of red FWHM, as seen in contour plots "d" to "f", increasing the green FWHM leads to a higher optimal green peak wavelength and a higher optimal red peak wavelength, in order to maintain the distinction between the red and green components. Increasing the green FWHM also leads to higher attainable LPI values. For example, as can be seen in FIG. 21, contour plots "d" to "f", the system can only achieve LPI=140 for green FWHM closer to 100. For broad red components, with red FWHM=100 nm as seen in contour plots "a" to "c", increasing the green FWHM to high levels reduces the maximum LPI attainable as some of the distinction between the red and green components is lost in a broad overlap.

The effect of the BR component in the BSG+BR system can also be seen in FIG. 19, FIG. 20, and FIG. 21, contour plots "a" to "f". For middle FWHM levels "d" to "f", the LPI values are more sensitive to the red peak wavelengths, as seen with the close grouping of contours in the vertical direction, particularly so for red peak wavelengths at 620 nm and below. For example, as can be seen in FIG. 21(f), increasing the red peak wavelength from 590 nm to 620 nm can result in an increase in LPI from about 70 to 120. Beyond 620 nm, LPI is not as sensitive to the red peak wavelength. In general, as the red FWHM increases, the optimal red peak wavelength also increases, in order to maintain separation between the red and green components.

In order to achieve high LPI values with the BSG+BR system, the peak wavelength and FWHM characteristics should be chosen carefully. For LPI values greater than 120 and color points near the blackbody, or close to Duv=0.000, the BSG component should have a FWHM in the range of about 20 nm to about 100 nm and a peak wavelength in the range of about 530 nm and about 560 nm, while the BR component should have a FWHM in the range of about 60 nm to about 100 nm and a peak wavelength in the range of about 640 nm to about 680 nm, whereas a broader red requires a narrower green in order to maintain a depression between the red and green components. For LPI values greater than 120 and color points near the midpoint between the blackbody and "White Line", or close to Duv=−0.005, the BSG component should have a FWHM in the range of about 20 nm to about 100 nm and a peak wavelength in the range of about 520 nm and about 560 nm, while the BR component should have a FWHM in the range of about 60 nm to about 100 nm and a peak wavelength in the range of about 620 nm to about 680 nm, whereas a broader red requires a narrower green in order to maintain a depression between the red and green components. For LPI values greater than 120 and color points near the "White Line", or close to Duv=−0.010, the BSG component should have a FWHM in the range of about 20 nm to about 100 nm and a peak wavelength in the range of about 520 nm and about 570 nm, while the BR component should have a FWHM in the range of about 60 nm to about 100 nm and a peak wavelength in the range of about 610 nm to about 680 nm, whereas a broader red requires a narrower green in order to maintain a depression between the red and green components. For LPI values greater than 130 and color points near the midpoint between the blackbody and "White Line", or close to Duv=−0.005, the BSG component should have a FWHM in the range of about 20 nm to about 100 nm and a peak wavelength in the range of about 530 nm and about 560 nm, while the BR component should have a FWHM in the range of about 60 nm to about 100 nm and a peak wavelength in the range of about 640 nm to about 680 nm, whereas a broader red requires a narrower green in order to maintain a depression between the red and green components. For LPI values greater than 130 and color points near the "White Line", or close to Duv=−0.010, the BSG component should have a FWHM in the range of about 20 nm to about 100 nm and a peak wavelength in the range of about 520 nm and about 560 nm, while the BR component should have a FWHM in the range of about 60 nm to about 100 nm and a peak wavelength in the range of about 620 nm to about 680 nm, whereas a broader red requires a narrower green in order to maintain a depression between the red and green components. For LPI values greater than 140 and color points near the "White Line", or close to Duv=−0.010, the BSG component should have a FWHM in the range of about 20 nm to about 100 nm and a peak wavelength in the range of about 525 nm and about 560 nm, while the BR component should have a FWHM in the range of about 60 nm to about 100 nm and a peak wavelength in the range of about 640 nm to about 680 nm, whereas a broader red requires a narrower green in order to maintain a depression between the red and green components.

Similarly, the effect of the BSG component in the BSG+NR system can be seen in FIG. 19, FIG. 20, and FIG. 21, contour plots "d" to "i". In general, a wider green component leads to a higher optimal green peak wavelength. Green components with a higher FWHM also lead to higher attainable LPI values and larger optimal regions within a given contour. For example, as can be seen in FIG. 21, contour plots "g" to "i", the region within the LPI=140 contour grows substantially from a green FWHM of 20 nm shown in plot "g" to a green FWHM of 100 nm shown in plot "i", particularly in the horizontal direction. This creates greater stability within a design when using green components with a larger FWHM as the LPI value is not as sensitive to the green peak wavelength. For the middle level of red FWHM, as seen in contour plots "d" to "f", increasing the green FWHM also shifts the optimal red peak wavelength to deeper reds, in order to maintain the distinction between the red and green components.

The effect of the NR component in the BSG+NR system can also be seen in FIG. 19, FIG. 20, and FIG. 21, contour plots "d" to "i". In general, the LPI values are highly sensitive to the red peak wavelengths, as seen with the close grouping of contours in the vertical direction, particularly so for red peak wavelengths at 620 nm and below. For example, as can be seen in FIG. 21(i), increasing the red peak wavelength from 590 nm to 620 nm can result in an increase in LPI from 60 to 130. Beyond 620 nm, LPI is not as sensitive to the red peak wavelength. In general, as the red FWHM increases, the optimal red peak wavelength also increases, in order to maintain separation between the red and green components.

In order to achieve high LPI values with the BSG+NR system, the peak wavelength and FWHM characteristics should be chosen carefully. For LPI values greater than 120 and color points near the blackbody, or close to Duv=0.000, the BSG component should have a FWHM in the range of about 20 nm to about 100 nm and a peak wavelength in the range of about 535 nm and about 560 nm, while the NR component should have a FWHM in the range of about 20 nm to about 60 nm and a peak wavelength in the range of about 620 nm to about 680 nm, whereas a broader red requires a deeper red peak wavelength in order to maintain a depression between the red and green components. For LPI values greater than 120 and color points near the midpoint between the blackbody and "White Line", or close to Duv=−0.005, the BSG component should have a FWHM in the range of about 20 nm to about 100 nm and a peak wavelength in the range of about 525 nm and about 570 nm, while the NR component should have a FWHM in the range of about 20 nm to about 60 nm and a peak wavelength in the range of about 615 nm to about 680 nm, whereas a broader red requires a deeper red peak wavelength in order to maintain a depression between the red and green components. For LPI values greater than 120 and color points near the "White Line", or close to Duv=−0.010, the BSG component should have a FWHM in the range of about 20 nm to about 100 nm and a peak wavelength in the range of about 520 nm and about 580 nm, while the NR component should have a FWHM in the range of about 20 nm to about 60 nm and a peak wavelength in the range of about 610 nm to about 680 nm, whereas a broader red requires a deeper red peak wavelength in order to maintain a depression between the red and green components. For LPI values greater than 130 and color points near the midpoint between the blackbody and "White Line", or close to Duv=−0.005, the BSG component should have a FWHM in the range of about 20 nm to about 100 nm and a peak wavelength in the range of about 535 nm and about 560 nm, while the NR component should have a FWHM in the range of about 20 nm to about 60 nm and a peak wavelength in the range of about 620 nm to about 680 nm, whereas a broader red requires a deeper red peak wavelength in order to maintain a depression between the red and green components. For LPI values greater than 130 and color points near the "White Line", or close to Duv=−0.010, the BSG component should have a FWHM in the range of about 20 nm to about 100 nm and a peak wavelength in the range of about 520 nm and about 570 nm, while the NR component should have a FWHM in the range of about 20 nm to about 60 nm and a peak wavelength in the range of about 615 nm to about 680 nm, whereas a broader red requires a deeper red peak wavelength in order to maintain a depression between the red and green components. For LPI values greater than 140 and color points near the "White Line", or close to Duv=−0.010, the BSG component should have a FWHM in the range of about 20 nm to about 100 nm and a peak wavelength in the range of about 535 nm and about 560 nm, while the NR component should have a FWHM in the range of about 20 nm to about 60 nm and a peak wavelength in the range of about 620 nm to about 680 nm, whereas a broader red requires a deeper red peak wavelength in order to maintain a depression between the red and green components.

In one embodiment of a phosphor-based LED system, the LED light source 850 shown in FIG. 8b may include one or more groups of LEDs 806 and 808 that may each consist of a mixture of blue LEDs coated with a green phosphor of the BSG type (e.g., blue-shifted green that may use a YAG or green aluminate or similar green phosphor) and/or red phosphor of the BR type (e.g., broad red that may use a red nitride or red sulfide or similar red phosphor), where the portion of the blue light generated by the blue LED that is not absorbed by the phosphor materials, combined with the light emitted by the phosphor materials provides light which appears to the human eye as being nearly white in color. The mixed-light spectrum is composed of a blue LED peak emission in the range of about 400 nm to about 460 nm, a BSG peak emission in the range of about 500 nm to about 560 nm created by the excitation of a green phosphor by the blue emission from the LED, and a BR peak emission in the range of about 610 nm to about 680 nm, with a FWHM greater than 60 nm, created by the excitation of a red phosphor by the blue emission from the LED. The spectrum is also similar to that of a blackbody spectrum, but may include a depression in the wavelength range between the blue LED emission and the green phosphor emission, and may include a second depression in the yellow wavelength range between the green phosphor emission and the red phosphor emission. The light source may also have a CCT between about 2700 K and about 6000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green phosphor and the red phosphor that results from the combination of the relatively narrow width, and relatively short peak wavelength, of the BSG phosphor, and the deeper (i.e., more red) peak wavelength of the BR phosphor compared with a typical red phosphor. The depression of the spectrum in the yellow, if sufficiently deep, may provide a light source having an enhanced color preference, or color saturation or color contrast capability that is typically preferred by a human observer relative to light emitted from the same light source employing typical yellow-green and red phosphor combinations that do not produce a depression in the yellow.

Figure 32:
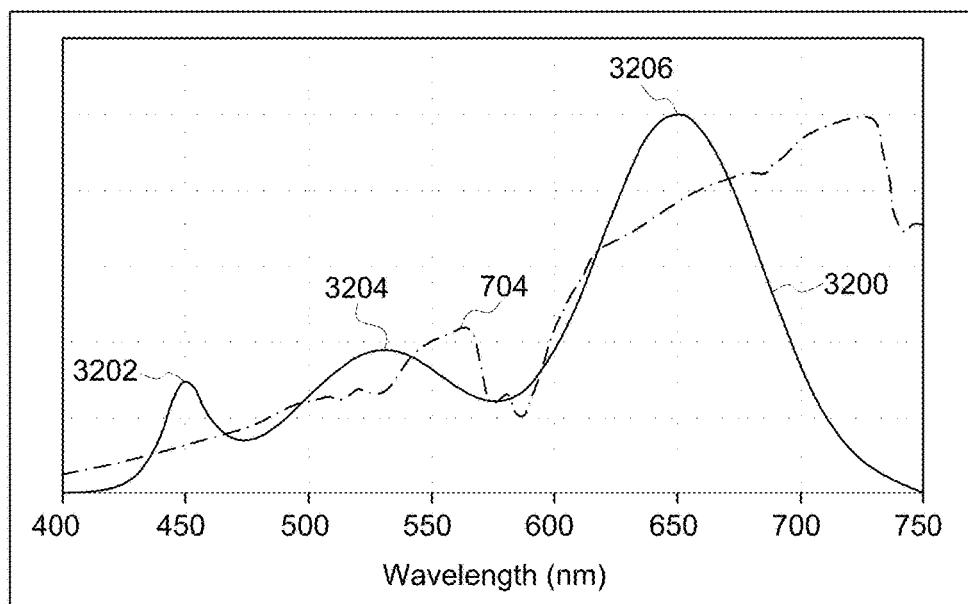
FIG. 32 includes a graph of the SPD of a BSG+BR type of LED light source, having a CCT=2700 K, and a graph of the SPD of a Reveal® type incandescent light source having a CCT=2755 K.

FIG. 32 includes a graph 3200 of the SPD of a BSG+BR type of LED light source discussed immediately above, and a graph 704 of the SPD of a Reveal® type incandescent light source having a CCT=2755 K. The graph 3200 shows that the peak wavelength 3202 of the blue LEDs occurs at approximately 450 nm, the peak wavelength 3204 of the green phosphor occurs at about 530 nm, and the peak wavelength 3206 of the red phosphor occurs at about 650 nm, with a FWHM of about 80 nm. This spectrum produces a light having CCT=2700 K, CRI=66, and LPI=139. The LPI score of 139 is high, meaning that a human observer will perceive more saturated colors and a more preferred appearance when utilizing the BSG+BR spectrum 3200 than possible by using some prior art light engines.

In other embodiments of a phosphor-based LED system, the LED light source 850 shown in FIG. 8b may include one or more groups of LEDs 806 and 808 that may each consist of a mixture of blue LEDs coated with a green phosphor of the BSG type (e.g., blue-shifted green that may use a YAG or green aluminate or similar green phosphor) and/or red phosphor of the NR type (e.g., narrow red that may use a red nitride or red sulfide or similar red phosphor), where the portion of the blue light generated by the blue LED that is not absorbed by the phosphor materials, combined with the light emitted by the phosphor materials provides light which appears to the human eye as being nearly white in color. The mixed-light spectrum is composed of a blue LED peak emission in the range of about 400 nm to about 460 nm, a BSG peak emission in the range of about 500 nm to about 560 nm created by the excitation of a green phosphor by the blue emission from the LED, and a NR peak emission in the range of about 610 nm to about 680 nm, with a FWHM less than 60 nm, created by the excitation of a red phosphor by the blue emission from the LED. The spectrum is also similar to that of a blackbody spectrum, but may include a depression in the wavelength range between the blue LED emission and the green phosphor emission, and may include a second depression in the yellow wavelength range between the green phosphor emission and the red phosphor emission. The light source may also have a CCT between about 2700 K and about 6000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green phosphor and the red phosphor that results from the combination of the relatively narrow width, and relatively short peak wavelength, of the BSG phosphor compared with a typical yellow-green YAG phosphor, and the relatively narrow width, and deeper peak wavelength, of the NR phosphor compared with a typical red phosphor. The depression of the spectrum in the yellow, if sufficiently deep, may provide a light source having an enhanced color preference, or color saturation or color contrast capability that is typically preferred by a human observer relative to light emitted from the same light source employing typical yellow-green and red phosphor combinations that do not produce a depression in the yellow.

Figure 33:
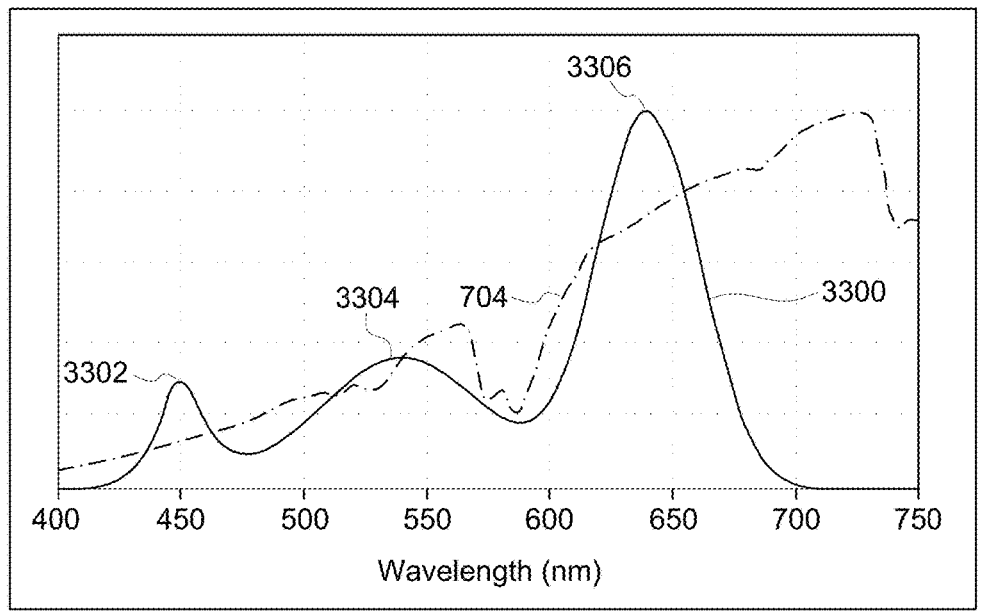
FIG. 33 includes a graph of the SPD of a BSG+NR type of LED light source, having a CCT=2700 K, and a graph of the SPD of a Reveal® type incandescent light source having a CCT=2755 K.

FIG. 33 includes a graph 3300 of the SPD of a BSG+NR type of LED light source discussed immediately above, and a graph 704 of the SPD of a Reveal® type incandescent light source having a CCT=2755 K. The curve 3300 shows that the peak wavelength 3302 of the blue LEDs occurs at approximately 450 nm, the peak wavelength 3304 of the green phosphor occurs at about 540 nm, and the peak wavelength 3306 of the red phosphor occurs at about 640 nm, with a FWHM of about 50 nm. This spectrum produces a light having CCT=2700 K, CRI=63, and LPI=143. The LPI score of 143 is high, meaning that a human observer will perceive more saturated colors and a more preferred appearance when utilizing the BSG+NR spectrum 3300 than possible by using some prior art light engines.

Figure 34:
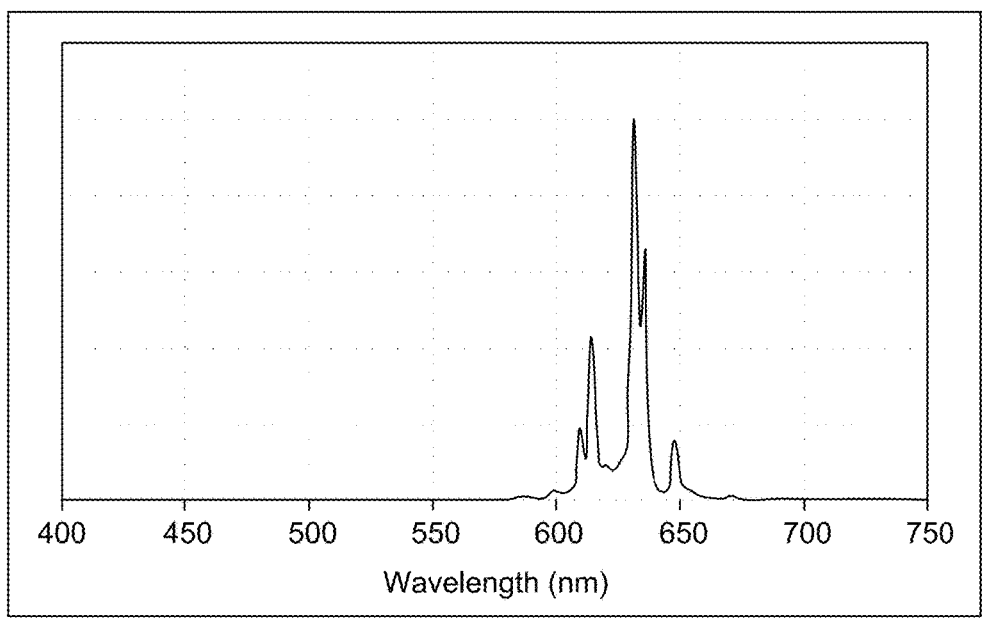
FIG. 34 illustrates the emission of PFS phosphor as a function of wavelength.

One notable example of a narrow red phosphor is that of potassium fluorosilicate doped with manganese (PFS). PFS behaves as a narrow, red line-emitting phosphor, with a peak wavelength of about 631 nm, and very narrow emission lines. FIG. 34 illustrates the PFS emission as a function of wavelength. With an emission spectrum much narrower than typical red phosphors, PFS behaves more like a narrow red LED in terms of color characteristics and spectral efficacy. This allows enhanced levels of color preference to be attained, while using combinations of PFS with a wider range of green and/or yellow-green phosphors, such as blue-shifted yellow (BSY) phosphors.

To illustrate the impact of spectral component selection on the LPI metric as it applies to a PFS system, a similar design of experiments (DOE) as described previously was performed with the red emission component fixed as that of PFS phosphor in FIG. 34. This allows for identification of optimal spectral features in order to maximize LPI and color preference response of a typical observer, and guide the design of future lighting products utilizing the PFS phosphor. The blue emission component, as before, is that of a blue LED, peaked at 450 nm. This wavelength was chosen to be representative of the blue LED population; however, it should not be considered as a constraint of the system, as a similar study can be performed using different blue emission characteristics. FIG. 14 illustrates the blue emission as a function of wavelength. The green component, as before, is modeled using a Gaussian function as an approximation of, but not limited to, both LED and phosphor emissions. The peak wavelength of the green component is allowed to vary from 520 nm to 560 nm in 10 nm increments, while the FWHM is varied from 20 nm to 100 nm in 10 nm increments. FIG. 15 displays a selection of five possible green components, of varying FWHM, out of 45 (5 peaks×9 FWHMs) that were used. The red emission component, as stated above, is fixed as that of PFS phosphor. With the shape of each component fixed by the chosen parameters, the relative amplitudes of the blue, green, and red components were adjusted in order to result in a chosen color point. The DOE was performed for two color points, one at 2700 K on the blackbody (Duv=0.000) and one at 2700 K near the "White Line" (Duv=−0.010), resulting in a total of 90 spectra. LPI values were calculated for each spectrum and analyzed for trends and trade-offs.

Figure 35A:
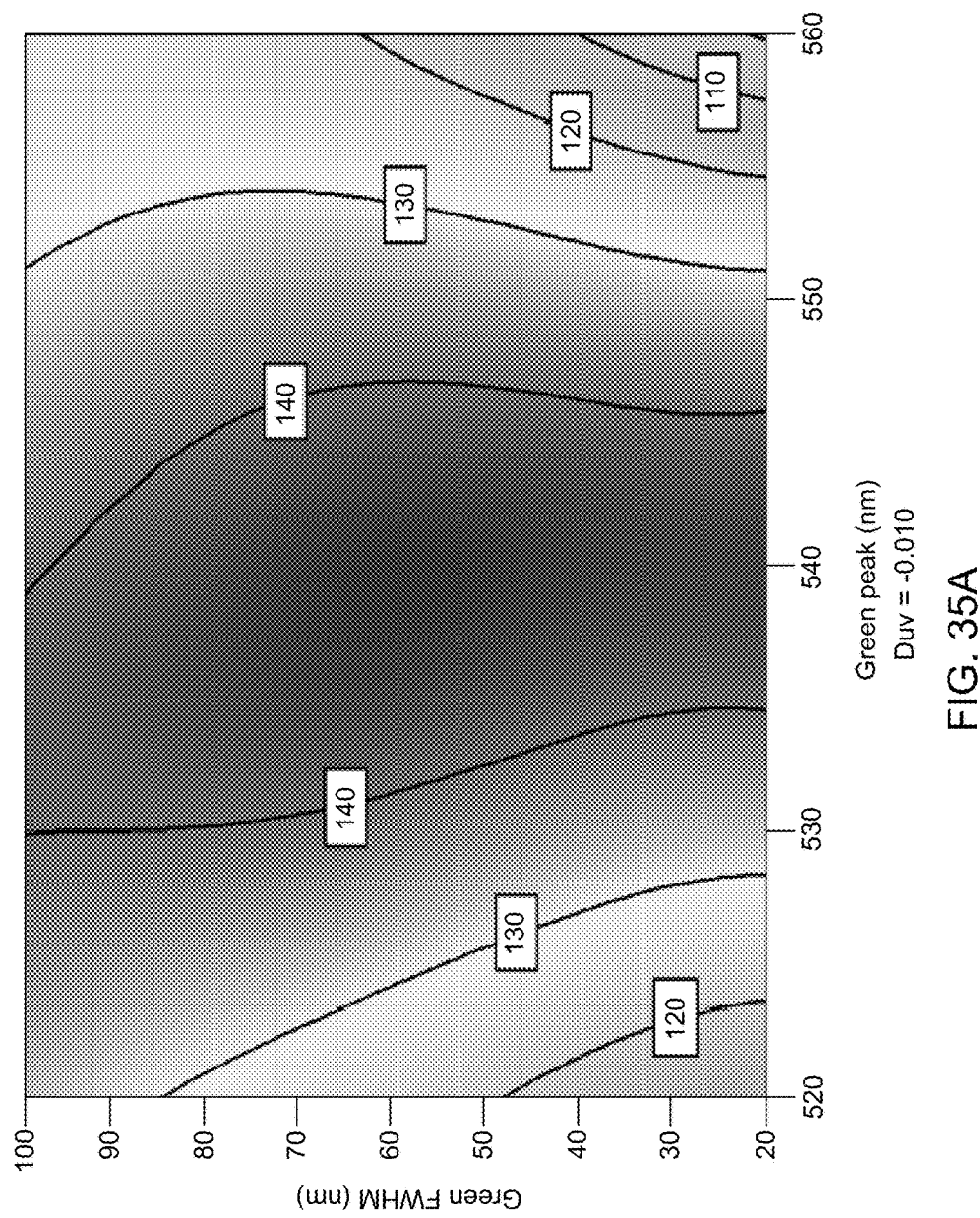
FIG. 35 displays the 3 contour plots of lighting preference index (LPI) versus green widths and peak wavelengths, and Duv associated with a BSY+PFS system.
Figure 35C:
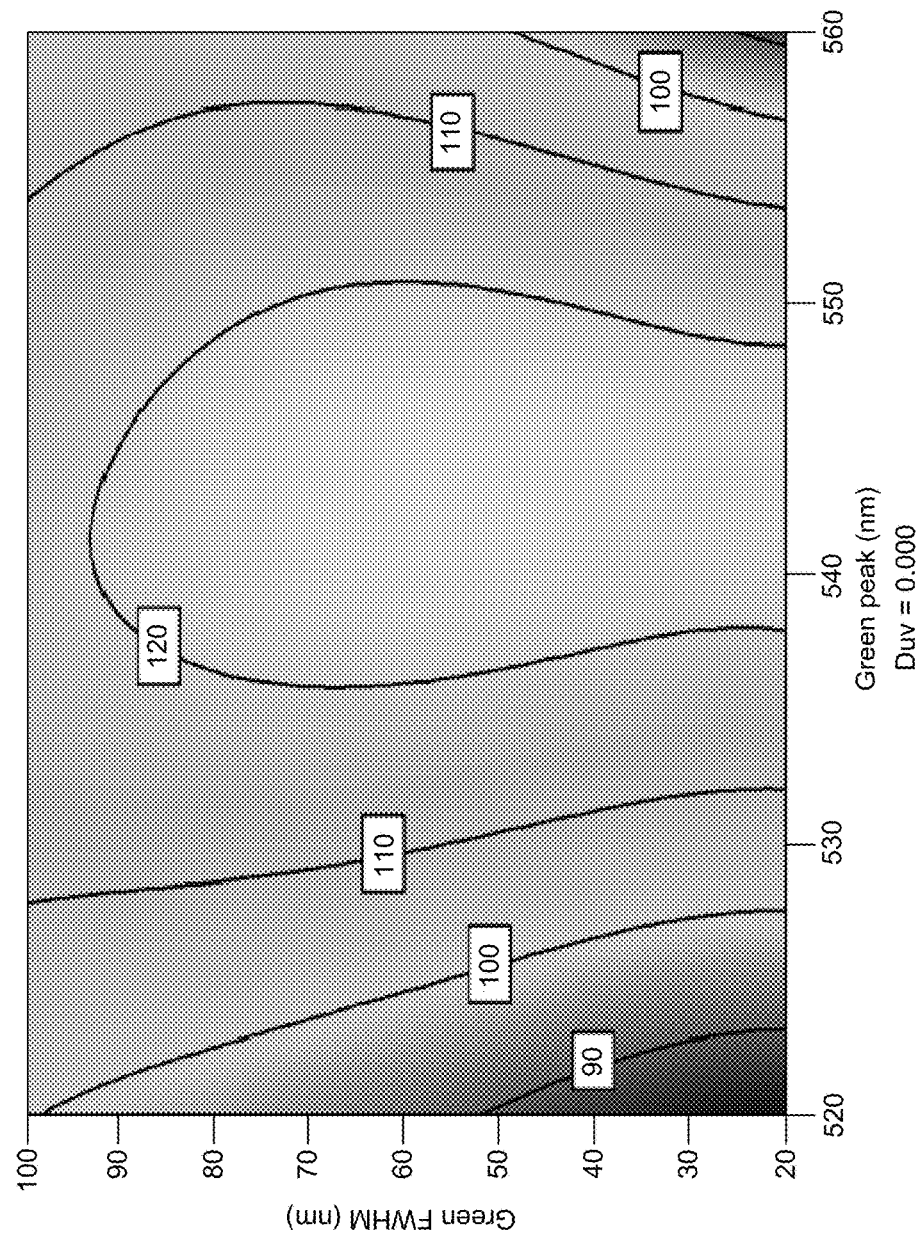

In order to illustrate the impact of green peak wavelength, green FWHM, and Duv level on LPI, a series of contour plots "a" to "c" are displayed in FIG. 35. Each individual contour plot shows LPI contours in increments of 10 for green FWHM versus green peak wavelength. Within the figure, Duv varies from −0.010 to −0.005 to 0.000 along the horizontal direction. As before, the three Duv levels were chosen to illustrate the effect of color point, or Duv, on LPI, and should not be taken as constraints of the application of LPI. Similar contour plots can be made for a continuum of Duv levels from the blackbody line to the "White Line", with similar trends being realized.

By comparing the three plots of FIG. 35, the effect of Duv can easily be seen. The general shapes of the contours remain the same, however the LPI contours increase in value from Duv=0.000 (plot "c") to Duv=−0.005 (plot "b") to Duv=−0.010 (plot "a"). By going from Duv=0.000 to Duv=−0.010, the Whiteness component of the LPI equation increases from 0 to 1, resulting in a 19 point increase in LPI based on Equation (7). In general, the optimal value for maximizing LPI in each contour plot experiences a very slight reduction in green peak wavelength (by roughly 5 nm).

The effect of the BSY component in the BSY+PFS system can also be seen in FIG. 35. In general, the FWHM of the green component has little effect on the LPI values, as seen in the vertical nature of the LPI contours. For this system, the LPI values are not very sensitive to the FWHM of the green component, leading to greater design stability.

In order to achieve high LPI values, the BSY characteristics should be chosen carefully. For LPI values greater than 120 and color points near the blackbody, or close to Duv=0.000, the BSY component should have a FWHM in the range of about 20 nm to about 100 nm and a peak wavelength in the range of about 535 nm and about 550 nm.

Figure 36:
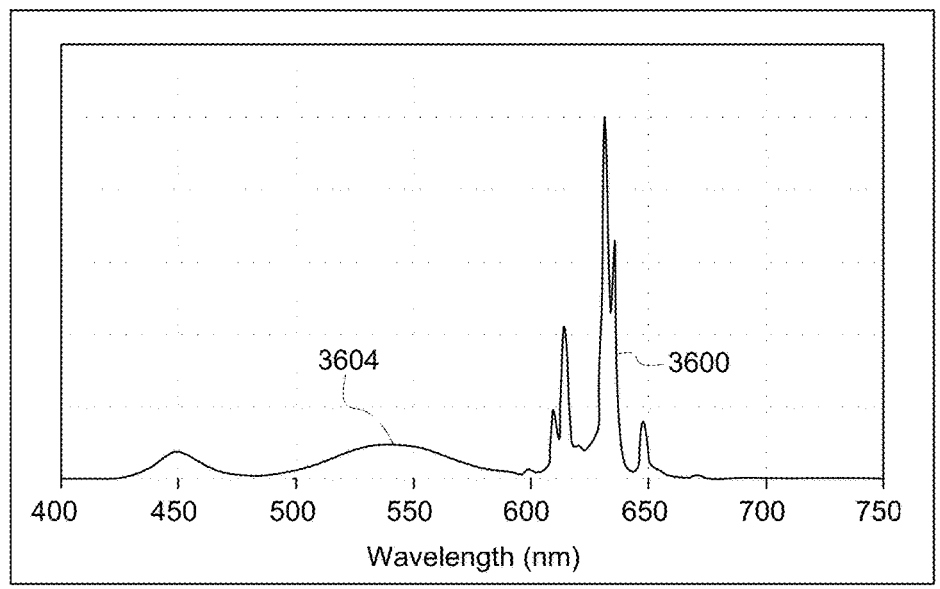
FIG. 36 includes a graph of the SPD of the optimal three-component spectrum, while utilizing PFS phosphor, achieving the highest LPI value.

For LPI values greater than 120 and color points near the midpoint between the blackbody and "White Line", or close to Duv=−0.005, the BSY component should have a FWHM in the range of about 20 nm to about 100 nm and a peak wavelength in the range of about 525 nm and about 555 nm. For LPI values greater than 120 and color points near the "White Line", or close to Duv=−0.010, the BSY component should have a FWHM in the range of about 20 nm to about 100 nm and a peak wavelength in the range of about 520 nm and about 570 nm. For LPI values greater than 130 and color points near the midpoint between the blackbody and "White Line", or close to Duv=−0.005, the BSY component should have a FWHM in the range of about 20 nm to about 100 nm and a peak wavelength in the range of about 535 nm and about 550 nm. For LPI values greater than 130 and color points near the "White Line", or close to Duv=−0.010, the BSY component should have a FWHM in the range of about 20 nm to about 100 nm and a peak wavelength in the range of about 525 nm and about 555 nm. For LPI values greater than 140 and color points near the "White Line", or close to Duv=−0.010, the BSY component should have a FWHM in the range of about 20 nm to about 100 nm and a peak wavelength in the range of about 530 nm and about 545 nm. The maximum LPI values attainable for the BSY+PFS system fall around 145. This is most easily achieved with Duv=−0.010 and a green component 3604 that peaks around 540 nm with a FWHM around 60 nm. The spectrum 3600 that would result from these selections is shown in FIG. 36.

In another embodiment of a phosphor-based LED system, the LED light source 850 shown in FIG. 8b may include one or more groups of LEDs 806 and 808 that may each consist of a mixture of blue LEDs coated with a green or yellow-green phosphor of the BSG or BSY type (e.g., blue-shifted green or blue-shifted yellow that may use a YAG or green aluminate or similar green or yellow-green phosphor) and/or red phosphor of the NR type (e.g., narrow red that may use PFS or similar red phosphor), where the portion of the blue light generated by the blue LED that is not absorbed by the phosphor materials, combined with the light emitted by the phosphor materials provides light which appears to the human eye as being nearly white in color. The mixed-light spectrum is composed of a blue LED peak emission in the range of about 400 nm to about 460 nm, a BSG or BSY peak emission in the range of about 500 nm to about 580 nm created by the excitation of a green or yellow-green phosphor by the blue emission from the LED, and a NR peak emission in the range of about 600 nm to about 640 nm, with a FWHM less than 30 nm, created by the excitation of a red phosphor by the blue emission from the LED. The spectrum is also similar to that of a blackbody spectrum, but may include a depression in the wavelength range between the blue LED emission and the green or yellow-green phosphor emission, and may include a second depression in the yellow wavelength range between the green or yellow-green phosphor emission and the red phosphor emission. The light source may also have a CCT between about 2700 K and about 6000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green or yellow-green phosphor and the red phosphor that results from the combination of the relatively narrow width, and relatively short peak wavelength, of the BSG or BSY phosphor, and the relatively narrow width of the NR phosphor. The depression of the spectrum in the yellow, if sufficiently deep, may provide a light source having an enhanced color preference, or color saturation or color contrast capability that is typically preferred by a human observer relative to light emitted from the same light source employing typical yellow-green and red phosphor combinations that do not produce a depression in the yellow.

Figure 37:
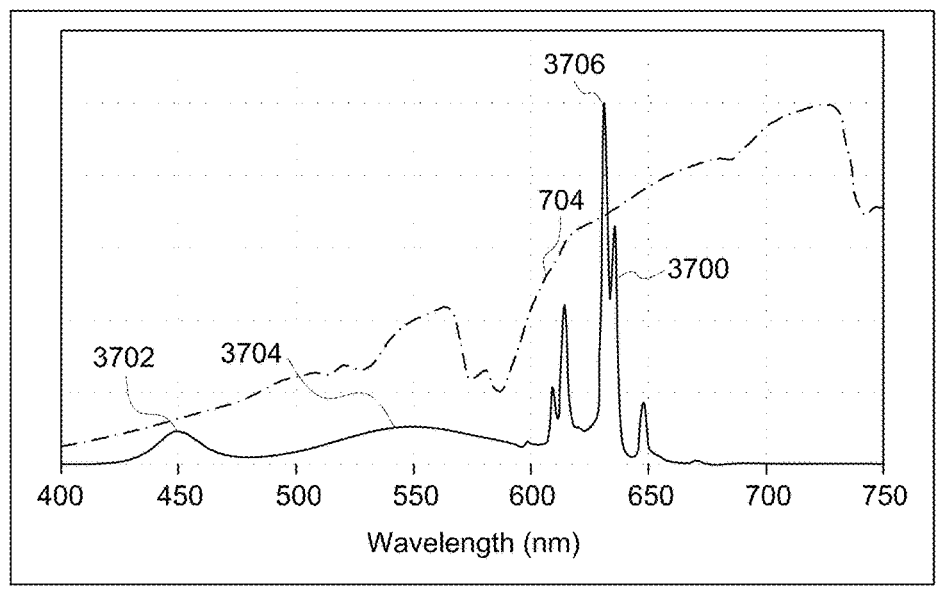
FIG. 37 includes a graph of the SPD of a BSY+PFS type of LED light source, having a CCT=2700 K, and a graph of the SPD of a Reveal® type incandescent light source having a CCT=2755 K.

FIG. 37 includes a graph 3700 of the SPD of a BSY+PFS type of LED light source in accordance with FIG. 8b discussed immediately above, and a graph 704 of the SPD of a Reveal® type incandescent light source having a CCT=2755 K. The curve 3700 shows that the peak wavelength 3702 of the blue LEDs occurs at approximately 450 nm, the peak wavelength 3704 of the yellow-green phosphor occurs at about 550 nm, and the peak wavelength 3706 of the red phosphor occurs at about 631 nm. This spectrum produces a light having CCT=2700 K, CRI=79, and LPI=135. The LPI score of 135 is high, meaning that a human observer will perceive more saturated colors and a more preferred appearance when utilizing the BSY+PFS spectrum 3700 than possible by using some prior art light engines.

Further, in some embodiments a neodymium (Nd) glass dome is placed over the LED light engine, and the Nd glass dome functions to suppress yellow light to further enhance the perception of red and green vibrancy. While the above embodiments demonstrate the ability to achieve high LPI without the use of a Nd filter, the use of Nd may allow for selection of other available phosphor materials that may not achieve high values of LPI without the Nd absorption. This may allow, for example, the peak wavelength of the red phosphor to be moved to shorter wavelengths or the FWHM of the red phosphor to be increased.

In yet another embodiment of a phosphor-based LED system, the LED light source 850 shown in FIG. 8b may include one or more groups of LEDs 806 and 808 that may each consist of a mixture of blue LEDs coated with a green phosphor of the BSG type (e.g., blue-shifted green that may use a YAG or green aluminate or similar green phosphor) and/or red phosphor of the BR type (e.g., broad red that may use a red nitride or red sulfide or similar red phosphor), where the portion of the blue light generated by the blue LED that is not absorbed by the phosphor materials, combined with the light emitted by the phosphor materials provides light which appears to the human eye as being nearly white in color. In addition, with reference to FIG. 8b, this embodiment includes a glass dome 802 impregnated with neodymium oxide that encapsulates the BSG+BR light engine therein. The mixed-light spectrum is composed of a blue LED peak emission in the range of about 400 nm to about 460 nm, a BSG peak emission in the range of about 500 nm to about 560 nm created by the excitation of a green phosphor by the blue emission from the LED, and a BR peak emission in the range of about 610 nm to about 680 nm, with a FWHM greater than 60 nm, created by the excitation of a red phosphor by the blue emission from the LED. The spectrum is also similar to that of a blackbody spectrum, but may include a depression in the wavelength range between the blue LED emission and the green phosphor emission, and may include a second depression in the yellow wavelength range between the green phosphor emission and the red phosphor emission, enhanced by the addition of the Nd glass. The light source may also have a CCT between about 2700 K and about 6000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green phosphor and the red phosphor that results from the combination of the relatively narrow width, and relatively short peak wavelength, of the BSG phosphor compared with a typical yellow-green YAG phosphor, and the deeper peak wavelength of the BR phosphor compared with a typical red phosphor, and is further enhanced by the addition of the Nd glass. The depression of the spectrum in the yellow, if sufficiently deep, may provide a light source having an enhanced color preference, or color saturation or color contrast capability that is typically preferred by a human observer relative to light emitted from the same light source employing typical yellow-green and red phosphor combinations that do not produce a depression in the yellow.

Figure 38:
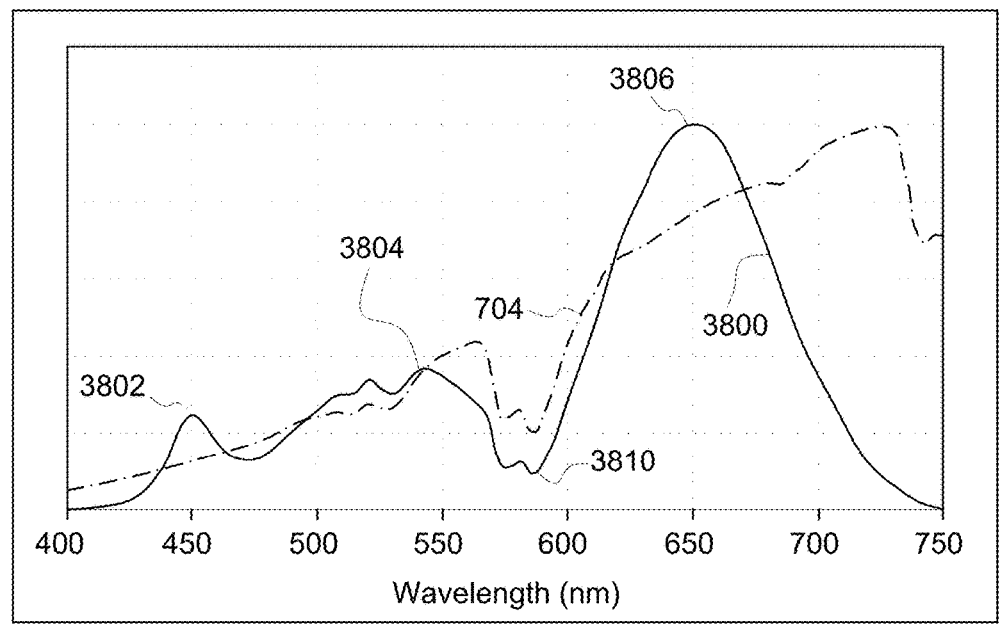
FIG. 38 includes a graph of the SPD of a BSG+BR+Nd type of LED light source, having a CCT=2700 K, and a graph of the SPD of a Reveal® type incandescent light source having a CCT=2755 K.

FIG. 38 includes a graph 3800 of the SPD of a BSG+BR type of LED light source discussed immediately above, which includes a Nd glass dome, and a graph 704 of the SPD of a Reveal® type incandescent light source having a CCT=2755 K. The curve 3800 shows that the peak wavelength 3802 of the blue LEDs occurs at approximately 450 nm, the peak wavelength 3804 of the green phosphor occurs at about 530 nm, and the peak wavelength 3806 of the red phosphor occurs at about 650 nm, with a FWHM of about 80 nm. The Nd glass functions to filter out light in the yellow portion 3810 of the color spectrum which may have been produced by the yellow-green phosphor and red LEDs, such that the light 3800 has further enhanced color preference. This spectrum produces a light having CCT=2700 K, CRI=51, and LPI=142. The LPI score of 142 is high, meaning that a human observer will perceive more saturated colors and a more preferred appearance when utilizing the BSG+BR spectrum 3800 than possible by using some prior art light engines.

In some embodiments of a phosphor-based LED system, the LED light source 850 shown in FIG. 8b may include one or more groups of LEDs 806 and 808 that may each consist of a mixture of blue LEDs coated with a green phosphor of the BSG type (e.g., blue-shifted green that may use a YAG or green aluminate or similar green phosphor) and/or red phosphor of the NR type (e.g., narrow red that may use a red nitride or red sulfide or similar red phosphor), where the portion of the blue light generated by the blue LED that is not absorbed by the phosphor materials, combined with the light emitted by the phosphor materials provides light which appears to the human eye as being nearly white in color. In addition, with reference to FIG. 8b, this embodiment includes a glass dome 802 impregnated with neodymium oxide that encapsulates the BSG+NR light engine therein. The mixed-light spectrum is composed of a blue LED peak emission in the range of about 400 nm to about 460 nm, a BSG peak emission in the range of about 500 nm to about 560 nm created by the excitation of a green phosphor by the blue emission from the LED, and a NR peak emission in the range of about 610 nm to about 680 nm, with a FWHM less than 60 nm, created by the excitation of a red phosphor by the blue emission from the LED. The spectrum is also similar to that of a blackbody spectrum, but may include a depression in the wavelength range between the blue LED emission and the green phosphor emission, and may include a second depression in the yellow wavelength range between the green phosphor emission and the red phosphor emission, enhanced by the addition of the Nd glass. The light source may also have a CCT between about 2700 K and about 6000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green phosphor and the red phosphor that results from the combination of the relatively narrow width, and relatively short peak wavelength, of the BSG phosphor compared with a typical yellow-green YAG phosphor, and the relatively narrow width, and deeper peak wavelength, of the NR phosphor compared with a typical red phosphor, and is further enhanced by the addition of the Nd glass. The depression of the spectrum in the yellow, if sufficiently deep, may provide a light source having an enhanced color preference, or color saturation or color contrast capability that is typically preferred by a human observer relative to light emitted from the same light source employing typical yellow-green and red phosphor combinations that do not produce a depression in the yellow.

Figure 39:
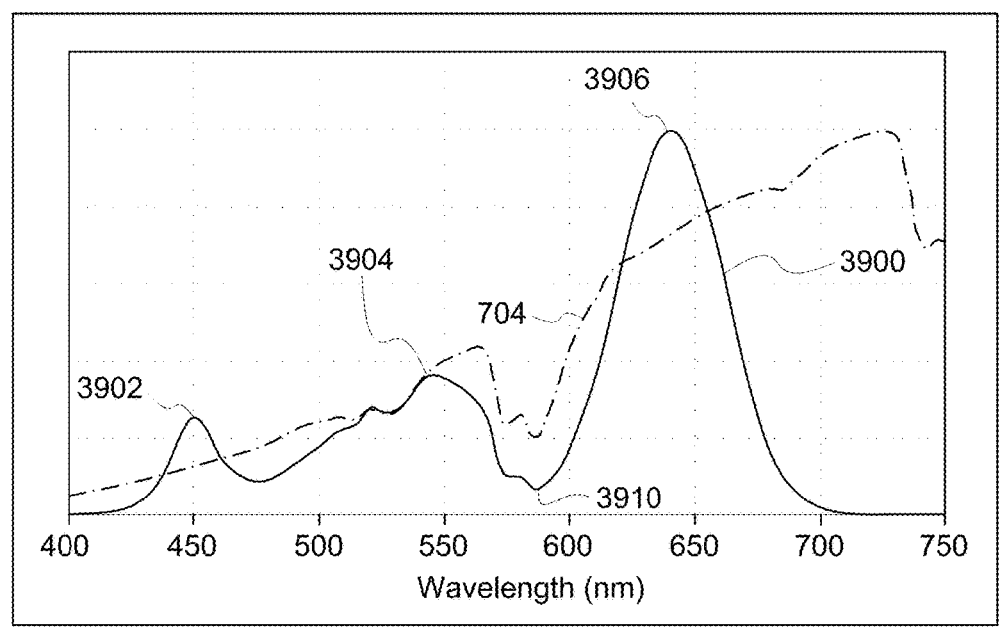
FIG. 39 includes a graph of the SPD of a BSG+NR+Nd type of LED light source, having a CCT=2700 K, and a graph of the SPD of a Reveal® type incandescent light source having a CCT=2755 K.

FIG. 39 includes a graph 3900 of the SPD of a BSG+NR type of LED light source in accordance with FIG. 8b discussed immediately above, which includes a Nd glass dome, and a graph 704 of the SPD of a Reveal® type incandescent light source having a CCT=2755 K. The curve 3900 shows that the peak wavelength 3902 of the blue LEDs occurs at approximately 450 nm, the peak wavelength 3904 of the green phosphor occurs at about 540 nm, and the peak wavelength 3906 of the red phosphor occurs at about 640 nm, with a FWHM of about 50 nm. The Nd glass functions to filter out light in the yellow portion 3910 of the color spectrum which may have been produced by the yellow-green phosphor and red LEDs, such that the light 3900 has further enhanced color preference. This spectrum produces a light having CCT=2700 K, CRI=52, and LPI=144. The LPI score of 144 is high, meaning that a human observer will perceive more saturated colors and a more preferred appearance when utilizing the BSG+NR spectrum 3900 than possible by using some prior art light engines.

In another embodiment of a phosphor-based LED system, the LED light source 850 shown in FIG. 8b may include one or more groups of LEDs 806 and 808 that may each consist of a mixture of blue LEDs coated with a green or yellow-green phosphor of the BSG or BSY type (e.g., blue-shifted green or blue-shifted yellow that may use a YAG or green aluminate or similar green or yellow-green phosphor) and/or red phosphor of the NR type (e.g., narrow red that may use PFS or similar red phosphor), where the portion of the blue light generated by the blue LED that is not absorbed by the phosphor materials, combined with the light emitted by the phosphor materials provides light which appears to the human eye as being nearly white in color. In addition, with reference to FIG. 8b, this embodiment includes a glass dome 802 impregnated with neodymium oxide that encapsulates the BSG+NR or BSY+NR light engine therein. The mixed-light spectrum is composed of a blue LED peak emission in the range of about 400 nm to about 460 nm, a BSG or BSY peak emission in the range of about 500 nm to about 580 nm created by the excitation of a green or yellow-green phosphor by the blue emission from the LED, and a NR peak emission in the range of about 600 nm to about 640 nm, with a FWHM less than 30 nm, created by the excitation of a red phosphor by the blue emission from the LED. The spectrum is also similar to that of a blackbody spectrum, but may include a depression in the wavelength range between the blue LED emission and the green or yellow-green phosphor emission, and may include a second depression in the yellow wavelength range between the green or yellow-green phosphor emission and the red phosphor emission, enhanced by the addition of the Nd glass. The light source may also have a CCT between about 2700 K and about 6000 K, or it may have a higher CCT, perhaps as high as about 10,000 K or higher, or a lower CCT, perhaps as low as about 1800 K or lower. The reduced emission in the yellow portion of the color spectrum results from the separation of the peaks of the green or yellow-green phosphor and the red phosphor that results from the combination of the relatively narrow width, and relatively short peak wavelength, of the BSG or BSY phosphor compared with a typical yellow-green YAG phosphor, and the relatively narrow width of the NR phosphor compared with a typical red phosphor, and is further enhanced by the addition of the Nd glass. The depression of the spectrum in the yellow, if sufficiently deep, may provide a light source having an enhanced color preference, or color saturation or color contrast capability that is typically preferred by a human observer relative to light emitted from the same light source employing typical yellow-green and red phosphor combinations that do not produce a depression in the yellow.

Figure 40:
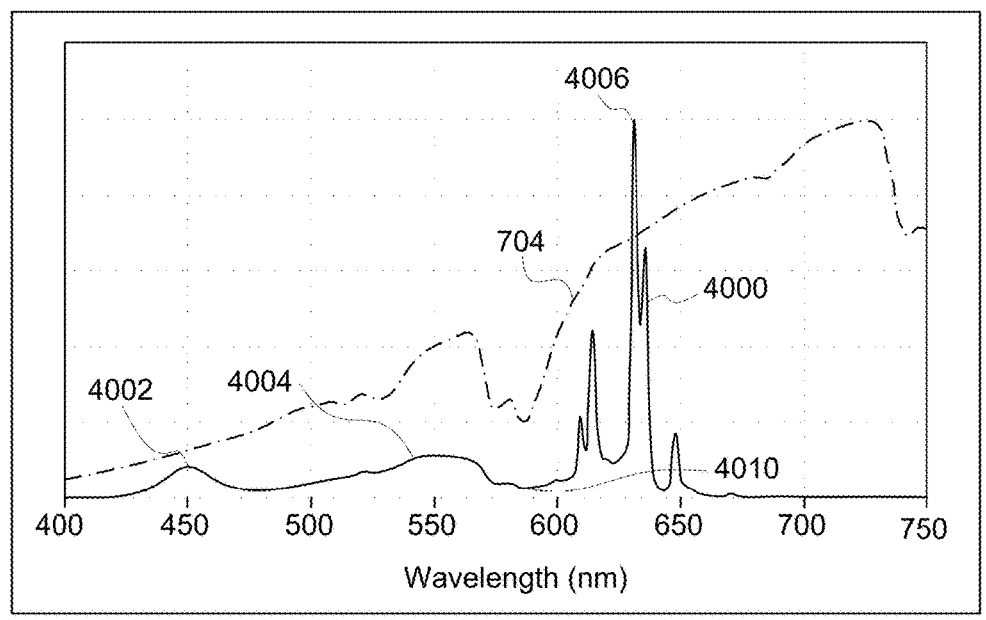
FIG. 40 includes a graph of the SPD of a BSY+PFS+Nd type of LED light source, having a CCT=2700 K, and a graph of the SPD of a Reveal® type incandescent light source having a CCT=2755 K.

FIG. 40 includes a graph 4000 of the SPD of a BSY+PFS type of LED light source discussed immediately above, which includes a Nd glass dome, and a graph 704 of the SPD of a Reveal® type incandescent light source having a CCT=2755 K. The curve 4000 shows that the peak wavelength 4002 of the blue LEDs occurs at approximately 450 nm, the peak wavelength 4004 of the yellow-green phosphor occurs at about 550 nm, and the peak wavelength 4006 of the red phosphor occurs at about 631 nm. The Nd glass functions to filter out light in the yellow portion 4010 of the color spectrum which may have been produced by the yellow-green phosphor and red LEDs, such that the light 4000 has further enhanced color preference. This spectrum produces a light having CCT=2700 K, CRI=68, and LPI=142. The LPI score of 142 is high, meaning that a human observer will perceive more saturated colors and a more preferred appearance when utilizing the BSY+PFS spectrum 4000 than possible by using some prior art light engines.

As used in the appended claims, a "composite light source" may be considered to be synonymous with "illumination apparatus". As used in the appended claims, a "light source" may typically refer to an individual color-emitting element, such as a red LED, or a phosphor which emits red light. As used in the appended claims, a "down converter" may refer to a phosphor and/or a quantum dot, or other similar luminescent material.

It should be understood that the above descriptions and/or the accompanying drawings are not meant to imply a fixed order or sequence of steps for any process referred to herein; rather any process may be performed in any order that is practicable, including but not limited to simultaneous performance of steps indicated as sequential.

Although the present invention has been described in connection with specific exemplary embodiments, it should be understood that various changes, substitutions, and alterations apparent to those skilled in the art can be made to the disclosed embodiments without departing from the spirit and scope of the invention as set forth in the appended claims.

What is claimed is:

1. A composite light source comprising:
    at least one blue light source having peak wavelength in the range of about 400 nanometer (nm) to about 460 nm;
    at least one green or yellow-green light source having peak wavelength in the range of about 500 nm to about 580 nm; and
    at least one red light source having peak wavelength in the range of about 600 nm to about 680 nm;
    wherein the composite light source has a Lighting Preference Index (LPI) of at least 120.

2. The composite light source of claim 1 comprising an LPI of at least 130, wherein the at least one green or yellow-green light source has a peak wavelength of about 510 nm to about 570 nm, and the at least one red light source has a peak wavelength of about 610 nm to about 680 nm.

3. The composite light source of claim 1 comprising an LPI of at least 140, wherein the at least one green or yellow-green light source has a peak wavelength of about 520 nm to about 560 nm, and the at least one red light source has a peak wavelength of about 620 nm to about 680 nm.

4. The composite light source of claim 3, wherein at least one of the at least one blue light source, the at least one green or yellow-green light source, and the at least one red light source comprises a solid state light source or a phosphor.

5. The composite light source of claim 4, wherein the solid state light source comprises at least one of a semiconductor light-emitting diode (LED) light source, an organic light-emitting diode (OLED) light source, and a polymer light-emitting diode light source.

6. The composite light source of claim 1 having a correlated color temperature (CCT) in the range of about 2500 Kelvin (K) to about 3200 K.

7. The composite light source of claim 1 further comprising a neodymium filter placed over the at least one blue light source, the at least one green or yellow-green light source, and the at least one red light source, such that most or all of the light emitted by the composite light source passes through the filter.

8. A composite light source comprising:
    at least one blue light source having peak wavelength in the range of about 400 nanometer (nm) to about 460 nm;
    at least one green or yellow-green solid state light source having peak wavelength in the range of about 500 nm to about 580 nm; and
    at least one red solid state light source having peak wavelength in the range of about 600 nm to about 680 nm;
    wherein the composite light source has a Lighting Preference Index (LPI) of at least 120.

9. The composite light source of claim 8 comprising an LPI of at least 130, wherein the at least one green or yellow-green solid state light source has a peak wavelength of about 510 nm to about 570 nm, and the at least one red light source has a peak wavelength of about 610 nm to about 680 nm.

10. The composite light source of claim 8 comprising an LPI of at least 140, wherein the at least one green or yellow-green solid state light source has a peak wavelength of about 520 nm to about 560 nm, and the at least one red solid state light source has a peak wavelength of about 620 nm to about 680 nm.

11. A composite light source comprising:
    at least one blue light source having peak wavelength in the range of about 400 nanometer (nm) to about 460 nm;
    at least one green or yellow-green solid state light source having peak wavelength in the range of about 500 nm to about 580 nm and having full-width-at-half-maximum (FWHM) less than 55 nm; and
    at least one red solid state light source having peak wavelength in the range of about 600 nm to about 680 nm and having FWHM less than 35 nm;
    wherein the composite light source has a Lighting Preference Index (LPI) of at least 120.

12. The composite light source of claim 11 comprising an LPI of at least 130, wherein the at least one green or yellow-green solid state light source has a peak wavelength of about 510 nm to about 570 nm, and the at least one red solid state light source has a peak wavelength of about 610 nm to about 680 nm.

13. A composite light source comprising:
    at least one blue light source having peak wavelength in the range of about 400 nanometer (nm) to about 460 nm;
    at least one green or yellow-green solid state light source having peak wavelength in the range of about 500 nm to about 580 nm; and
    at least one red down-converter having peak wavelength in the range of about 600 nm to about 680 nm;
    wherein the composite light source has a Lighting Preference Index (LPI) of at least 120.

14. The composite light source of claim 13 comprising an LPI of at least 130, wherein the at least one green or yellow-green solid state light source has a peak wavelength of about 510 nm to about 570 nm, and the at least one red down-converter has a peak wavelength of about 610 nm to about 680 nm.

15. A composite light source comprising:
    at least one blue light source having peak wavelength in the range of about 400 nanometer (nm) to about 460 nm;
    at least one green or yellow-green solid state light source having peak wavelength in the range of about 500 nm to about 580 nm; and
    at least one red down-converter having peak wavelength in the range of about 600 nm to about 680 nm and having full-width-at-half-maximum (FWHM) less than 35 nm;
    wherein the composite light source has a Lighting Preference Index (LPI) of at least 120.

16. The composite light source of claim 15 further comprising a neodymium filter placed over the at least one blue light source, the at least one green or yellow-green solid state light source, and the at least one red down-converter, such that most or all of the light emitted by the composite light source passes through the filter.

17. A composite light source comprising:
    at least one blue light source having peak wavelength in the range of about 400 nanometer (nm) to about 460 nm;
    at least one green or yellow-green down-converter having peak wavelength in the range of about 500 nm to about 580 nm; and
    at least one red solid state light source having peak wavelength in the range of about 600 nm to about 680 nm;
    wherein the composite light source has a Lighting Preference Index (LPI) of at least 120.

18. The composite light source of claim 17 having a correlated color temperature (CCT) in the range of about 2500 Kelvin (K) to about 3200 K.

19. A composite light source comprising:
    at least one blue light source having peak wavelength in the range of about 400 nanometer (nm) to about 460 nm;
    at least one green or yellow-green down-converter having peak wavelength in the range of about 500 nm to about 580 nm; and
    at least one red solid state light source having peak wavelength in the range of about 600 nm to about 680 nm and having full-width-at-half-maximum (FWHM) less than 35 nm;
    wherein the composite light source has a Lighting Preference Index (LPI) of at least 120.

20. The composite light source of claim 19 comprising an LPI of at least 130, wherein the at least one green or yellow-green down-converter has a peak wavelength of about 510 nm to about 570 nm, and the at least one red solid state light source has a peak wavelength of about 610 nm to about 680 nm.

21. A composite light source comprising:
    at least one blue light source having peak wavelength in the range of about 400 nanometer (nm) to about 460 nm;
    at least one green or yellow-green down-converter having peak wavelength in the range of about 500 nm to about 580 nm;
    at least one red solid state light source having peak wavelength in the range of about 600 nm to about 680 nm and having full-width-at-half-maximum (FWHM) less than 35 nm; and
    at least one deep red light source having peak wavelength in the range of about 630 nm to about 680 nm;
    wherein the composite light source has a Lighting Preference Index (LPI) of at least 120.

22. The composite light source of claim 21 comprising an LPI of at least 140, wherein the at least one green or yellow-green down-converter has a peak wavelength of about 520 nm to about 560 nm, and the at least one red solid state light source has a peak wavelength of about 620 nm to about 680 nm.

23. The composite light source of claim 21 having a correlated color temperature (CCT) in the range of about 2500 Kelvin (K) to about 3200 K.

24. The composite light source of claim 21 further comprising a neodymium filter placed over the at least one blue light source, the at least one green or yellow-green down-converter, the at least one red solid state light source, and the at least one deep red light source, such that most or all of the light emitted by the composite light source passes through the filter.

25. A composite light source comprising:
    at least one blue light source having peak wavelength in the range of about 400 nanometer (nm) to about 460 nm;
    at least one green or yellow-green down-converter having peak wavelength in the range of about 500 nm to about 580 nm; and
    at least one red down-converter having peak wavelength in the range of about 600 nm to about 680 nm;
    wherein the composite light source has a Lighting Preference Index (LPI) of at least 120.

26. The composite light source of claim 25 comprising an LPI of at least 130, wherein the at least one green or yellow-green down-converter has a peak wavelength of about 510 nm to about 570 nm, and the at least one red down-converter has a peak wavelength of about 610 nm to about 680 nm.

27. The composite light source of claim 25 having a correlated color temperature (CCT) in the range of about 2500 Kelvin (K) to about 3200 K.

28. The composite light source of claim 25 further comprising a neodymium filter placed over the at least one blue light source, the at least one green or yellow-green down-converter, and the at least one red down-converter, such that most or all of the light emitted by the composite light source passes through the filter.

29. A composite light source comprising:
    at least one blue light source having peak wavelength in the range of about 400 nanometer (nm) to about 460 nm;

at least one green or yellow-green down-converter having peak wavelength in the range of about 500 nm to about 580 nm; and at least one red down-converter having peak wavelength in the range of about 600 nm to about 680 nm and having full-width-at-half-maximum (FWHM) less than 35 nm;

wherein the composite light source has a Lighting Preference Index (LPI) of at least 120.

30. A composite light source comprising:

at least one blue light source having peak wavelength in the range of about 400 nanometer (nm) to about 460 nm;

at least one green or yellow-green down-converter having peak wavelength in the range of about 500 nm to about 580 nm;

at least one red down-converter having peak wavelength in the range of about 600 nm to about 680 nm and having full-width-at-half-maximum (FWHM) less than 35 nm; and at least one deep red light source having peak wavelength in the range of about 630 nm to about 680 nm;

wherein the composite light source has a Lighting Preference Index (LPI) of at least 120.

* * * * *